(12) United States Patent
Tsurumi et al.

(10) Patent No.: US 6,498,929 B1
(45) Date of Patent: Dec. 24, 2002

(54) RECEIVER HAVING DC OFFSET DECREASING FUNCTION AND COMMUNICATION SYSTEM USING THE SAME

(75) Inventors: Hiroshi Tsurumi, Kawasaki (JP); Hiroshi Yoshida, Yokohama (JP); Tetsuro Itakura, Tokyo-to (JP); Takafumi Yamaji, Yokohama (JP); Akira Yasuda, Kawasaki (JP); Takashi Ueno, Yokohama (JP); Hiroshi Tanimoto, Kawasaki (JP); Ryuichi Fujimoto, Tokyo-to (JP); Hiroshi Horiguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/880,679

(22) Filed: Jun. 23, 1997

(30) Foreign Application Priority Data

Jun. 21, 1996 (JP) .............................................. 8-160368
Jun. 24, 1996 (JP) .............................................. 8-162788

(51) Int. Cl.$^7$ ................................................ H04B 7/16
(52) U.S. Cl. ........................ 455/296; 375/345; 375/319; 327/307
(58) Field of Search .............................. 455/234.2, 296, 455/226.1, 239.1, 232.1, 234.1, 246.1, 247.1, 324, 317, 186, 67.4; 375/345, 319; 327/307, 309, 310, 311, 551

(56) References Cited

U.S. PATENT DOCUMENTS

| | | | | |
|---|---|---|---|---|
| 4,955,039 A | * | 9/1990 | Rother et al. ................... | 375/75 |
| 5,031,193 A | * | 7/1991 | Atkinson et al. ............ | 375/231 |
| 5,140,699 A | * | 8/1992 | Kozak ........................... | 455/84 |
| 5,212,826 A | * | 5/1993 | Rabe et al. .................. | 455/214 |
| 5,222,078 A | * | 6/1993 | Cason et al. ................. | 375/319 |
| 5,781,588 A | * | 7/1998 | Abe et al. .................... | 375/345 |
| 5,793,817 A | * | 8/1998 | Wilson ......................... | 375/297 |
| 5,838,735 A | * | 11/1998 | Khullar ....................... | 375/319 |
| 5,898,912 A | * | 4/1999 | Heck et al. ............... | 455/234.2 |
| 5,918,167 A | * | 6/1999 | Tiller et al. ................. | 455/310 |
| 5,987,075 A | * | 11/1999 | Abe et al. .................... | 375/345 |

* cited by examiner

Primary Examiner—William Trost
Assistant Examiner—Philip J. Sobutka
(74) Attorney, Agent, or Firm—Oblon, Spivak, McClelland, Maier & Neustadt, P.C.

(57) ABSTRACT

A receiver having a function of a direct current offset, and including a receiving section for receiving a radio frequency signal, an analog signal processing section for amplifying, band-converting and frequency-converting an analog signal inputted from the receiving section, and an AD converting section for converting an output of the analog signal processing section from an analog signal to a digital signal. Also included is a digital signal processing section for processing the digital signal converted by the DC converting section. The receiver further includes an offset detecting element, provided in the digital signal processing section, for detecting a direct current offset signal produced in the receiving section or a frequency converting section, an offset holding element, provided in the digital signal processing section, for holding the direct current offset signal detected by the offset detecting element, a DA converting section for converting the direct current offset signal detected by the digital signal processing section into an analog signal, and a first offset correcting element, provided in the analog signal processing section, for correcting the analog signal on the basis of the direct current offset signal converted by the DA converting section into the analog signal.

55 Claims, 54 Drawing Sheets

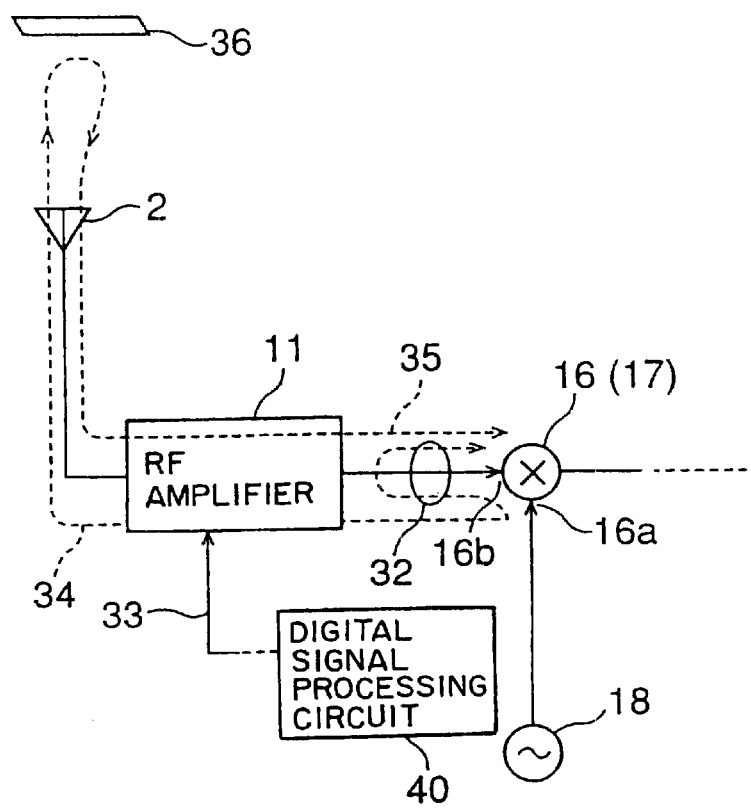
F I G. 2 (a)
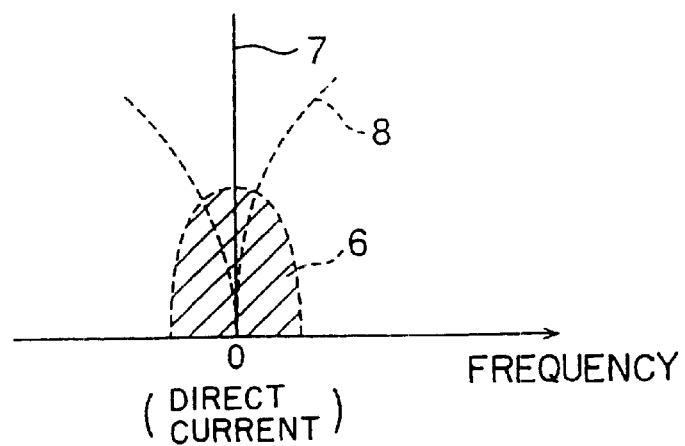
F I G. 2 (b)

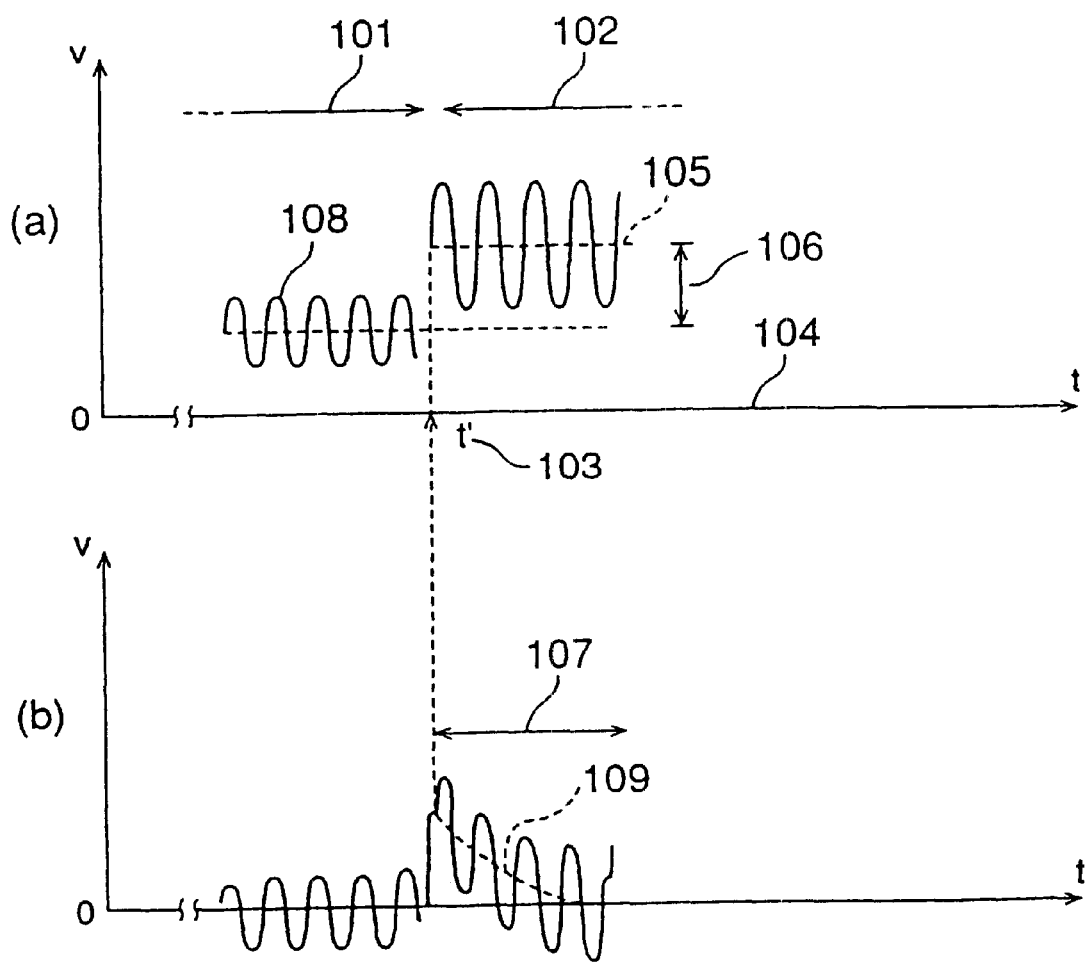
F I G. 3

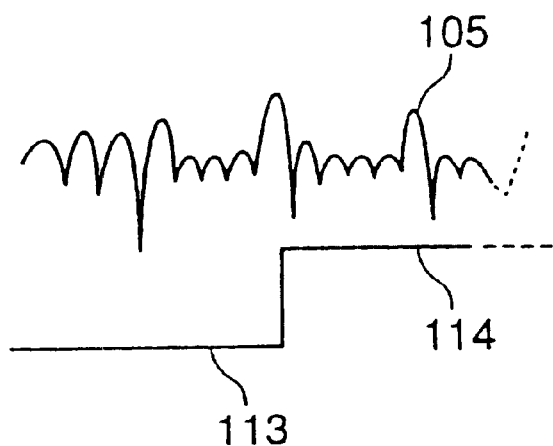
F I G. 4(a)
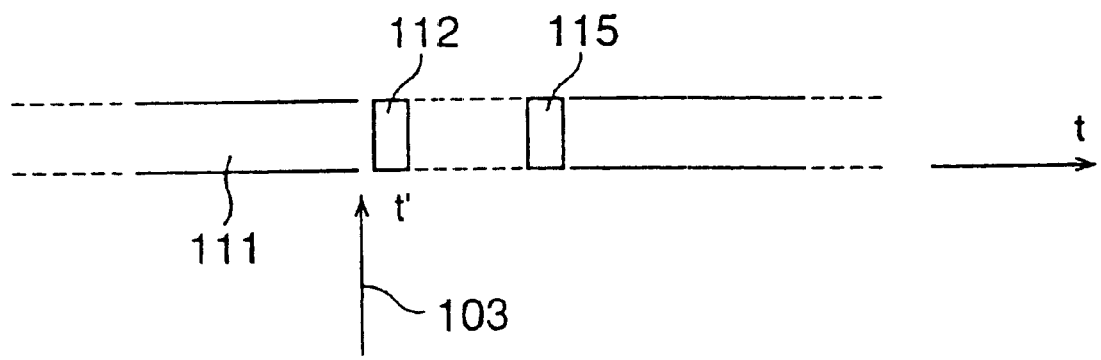
F I G. 4(b)

| RECEIVE MODE | RECEIVED FIELD INTENSITY (dBμ) | GAINS OF RESPECTIVE STAGES (dB) | | |
|---|---|---|---|---|
| | | RF AMPLIFIER | MIXER | AMPLIFIER |
| A | 0~20 | 20 | 20 | 60 |
| B | 20~40 | 20 | 20 | 40 |
| C | 40~60 | 20 | 0 | 40 |
| D | 60~80 | 20 | 0 | 20 |
| E | 80~100 | 0 | 0 | 20 |

FIG. 7

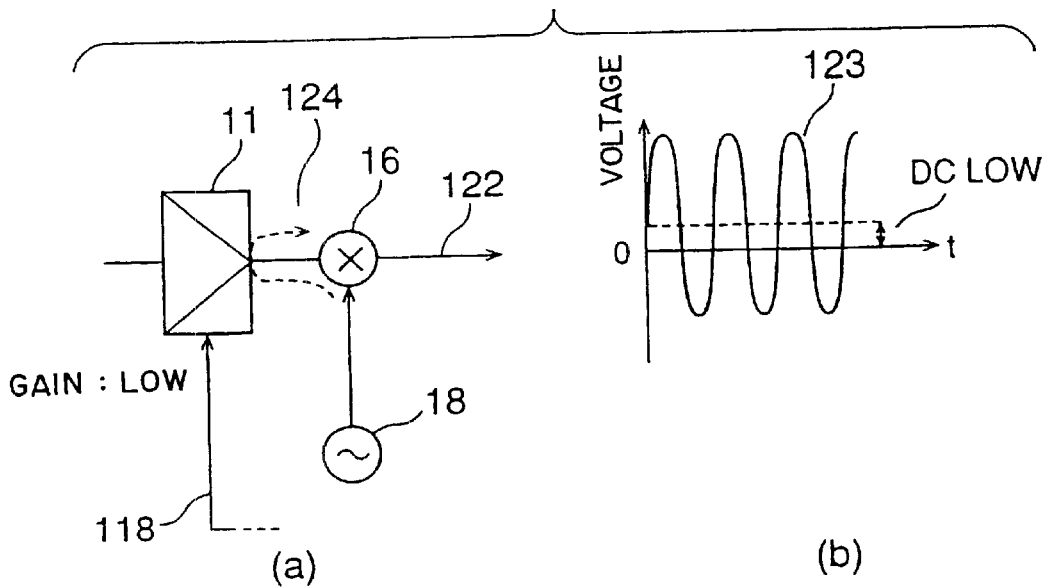
F I G. 8
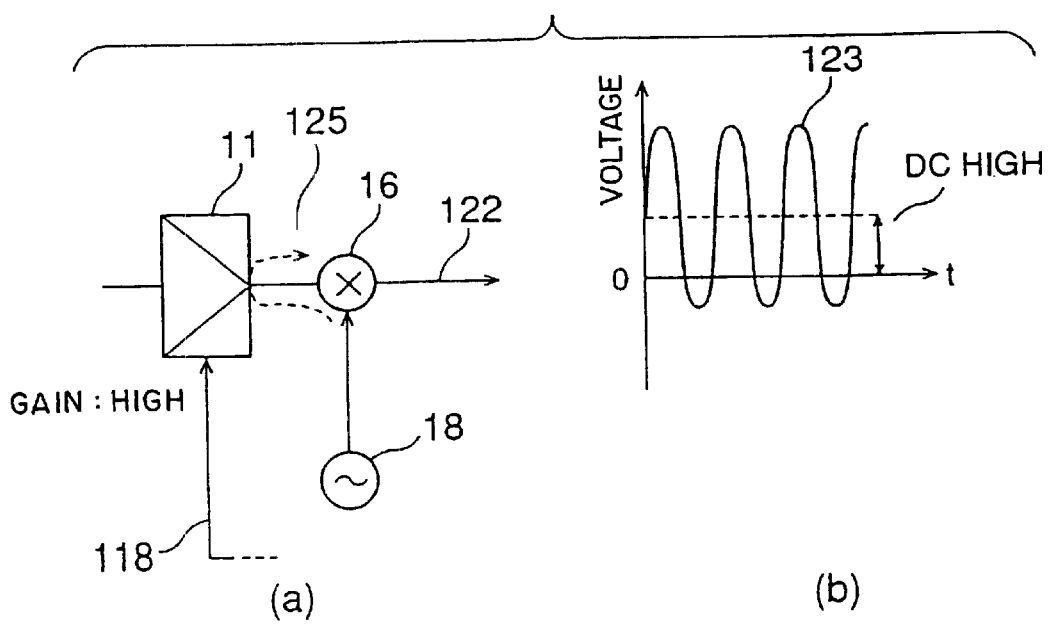
F I G. 9

| RECEIVE MODE | GAIN OF RESPECTIVE STAGES (dB) | | MEASURE VALUE OF DC OFFSET (CORRECTION VALUE OF DC OFFSET) |
|---|---|---|---|
| | RF AMPLIFIER | MIXER | |
| MODE A | 10 | 20 | A |
| MODE B | 10 | 0 | B |
| MODE C | -30 | 20 | C |
| MODE D | -30 | 0 | D |

FIG. 26

OUTPUT WAVEFORM OF LPF
( INFLUENCE OF TIME CONSTANT )

DURING RECEIVE

| SW1 | ON |
|---|---|
| SW2 | OFF |

DURING DC OFFSET DETECTION

| SW1 | OFF |
|---|---|
| SW2 | ON |

FIG. 45

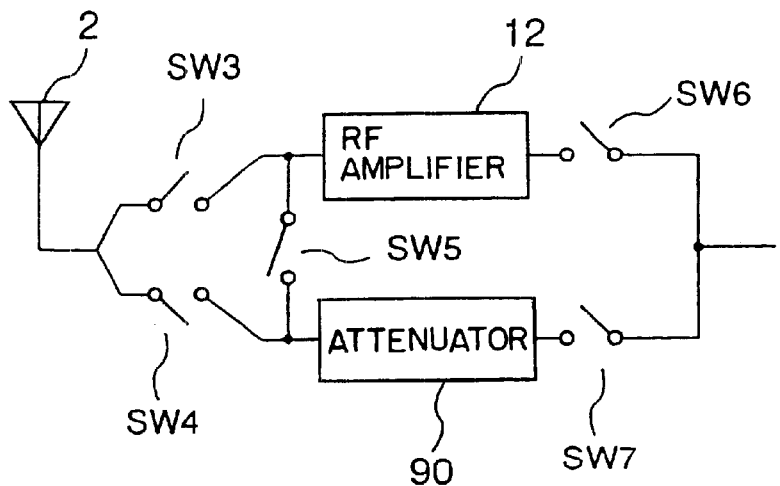
F I G. 46
| | DURING USUAL RECEIVE | DURING ATTENUATOR MODE | DURING DC OFFSET DETECTION |
|---|---|---|---|
| SW3 | ON | OFF | OFF |
| SW4 | OFF | ON | OFF |
| SW5 | OFF | OFF | ON |
| SW6 | ON | OFF | ON |
| SW7 | OFF | ON | OFF |
F I G. 47

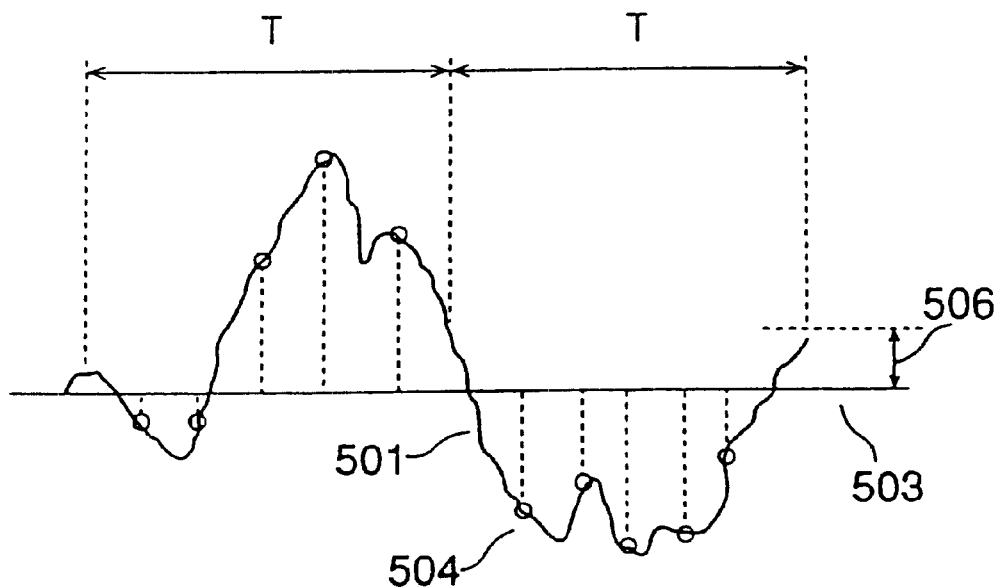
F I G. 51 (a)
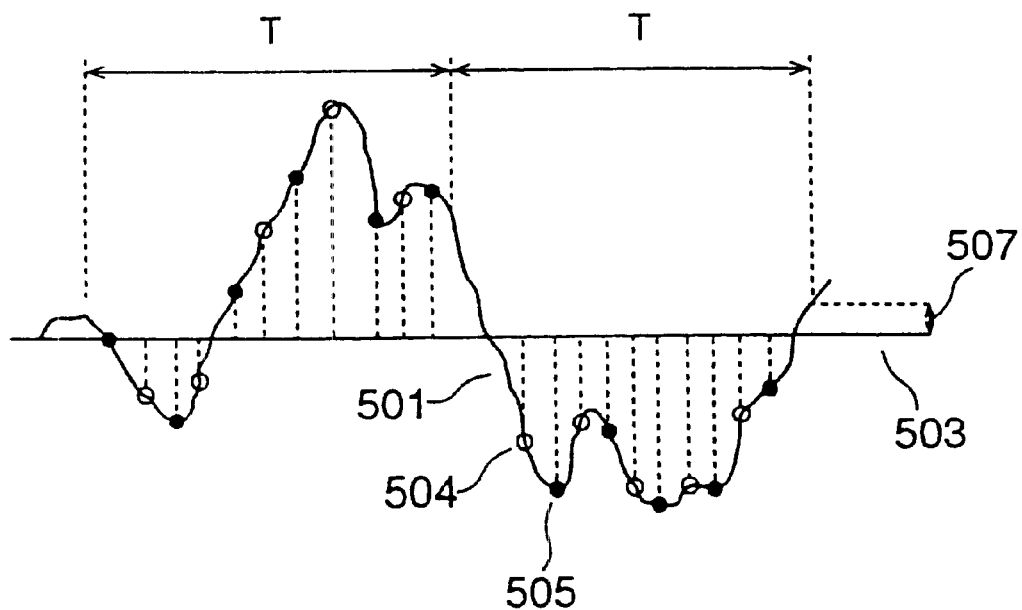
F I G. 51 (b)

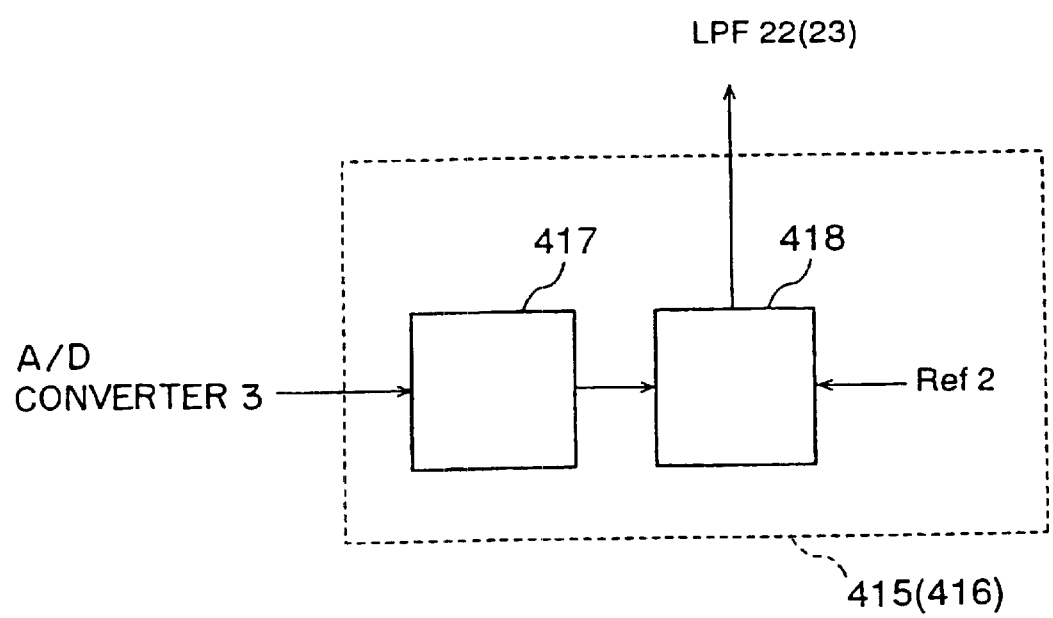
F I G. 62

RECEIVER HAVING DC OFFSET DECREASING FUNCTION AND COMMUNICATION SYSTEM USING THE SAME

BACKGROUND OF THE INVENTION

The present invention relates generally to a receiver built in a potable radio terminal for use in a radio communication system, and a radio communication system using the same. More specifically, the invention relates to a small receiver having a function of removing a direct current offset (which will be hereinafter referred to as a "DC offset" if necessary), which is an undesired DC component produced in a direct conversion receiving system or a superheterodyne receiving system, and a radio communication system using the same.

In recent years, with the rapid progress of radio communication systems, it has been greatly required to decrease the size and price of radio terminals. As a receiving system complying with such a request, the direct conversion receiving system has been attracted. Referring to the drawings, the construction and operation principle of a direct conversion receiver will be described below.

FIG. 1 shows a basic construction of a direct conversion receiver. A high frequency signal received by an antenna 2 of a receiving section 1 is amplified by a RF amplifier 11 in an analog signal processing circuit 10, and then, divided into signals of two lines. The signals of two lines are mixed with carrier waves, which are supplied from a local oscillator 18 and which have substantially the same frequency as that of the received signal, by means of mixers 16 and 17, respectively, and then, directly frequency-converted into base frequency bands (base bands). The local oscillator 18 is directly connected to the mixer 16, and connected to the mixer 17 via a π/2 phase-shifter 19. Therefore, the signals of two lines frequency-converted into the base bands have phases shifted by π/2 from each other. The base band signals of two lines pass through low-pass filters (each of which will be hereinafter simply referred to as a "LPF") 22 and 23 serving as channel selectors to remove undesired frequency components, respectively. Thereafter, the base band signals are amplified to desired signal levels by means of base band amplifiers 26 and 27, respectively. Then, the amplified base band signals are analog-to-digital converted by means of an analog/digital (which will be hereinafter simply referred to as an "A/D") converted 3, and then, demodulated to original data by means of a digital signal processing circuit 40 serving as detection/demodulation means.

In this direct conversion receiving system, since the received signals are directly frequency-converted into the base bands, there is no intermediate frequency, and there is no image response in theory. Therefore, there is an advantage in that it is not required to provide a very steep filter for removing image although such a filter is essential to the superheterodyne system. In addition, since the LPFs 22 and 23 for channel selection can be formed as large scale integrated circuits (LSIs), there is an advantage in that it is possible to decrease the size and price of receivers with the rapid progress of LSIs in recent years.

Although the direct conversion receiving system is suitable to decrease the size and price, there are the following problems. Referring to FIGS. 2A and 2B, such problems will be described below.

In FIG. 2A, a reference carrier wave necessary for the frequency conversion in the mixer 16 (or 17) is supplied from the local oscillator 18. Although it is desired that the isolation between the local port 16a and the RF port 16b of the mixer 16 is infinity, it is about 30 dB in fact. Therefore, the reference carrier wave inputted from the local port 16a is leaked toward the RF port 16b, and a part thereof is reflected on the output side of the RF amplifier 11 to be a reflected wave 32 to be inputted to the mixer 16 again. Alternatively, the part of the leaked reference carrier wave passes through the RF amplifier 11 to be leaked into the antenna 2 to be emitted from the antenna 2 to the outside as shown by reference number 34, and then, reflected on a reflector 36 to be inputted to the antenna 2 again to be a reflected wave 35 which is inputted to the mixer 16 again. In the mixer 16, these reflected waves 32 and 35 are mixed with the reference carrier waves outputted from the local oscillator 18 (self mixing). Since the reflected waves 32 and 35 have the same frequency as that of the reference carrier wave, the reflected waves appear as direct current output components (which will be hereinafter referred to as "DC offset") in the output of the mixer 16 by the self-mixing.

FIG. 2B shows such a DC offset on the axis of frequency. That is, in the direct conversion system, since a desired wave is frequency-converted into a base frequency band containing a DC component by nature, a DC offset component 7 produced by reflection is suppressed on a desired wave 6. It is known that the DC offset of this type causes the deterioration of receive error rate particularly in delay detection. As a ratio of D (=desired wave) to U (=DC offset component) (which will be hereinafter referred to as "D/U") in order to obtain a desired receiver error rate, it is required to attenuate the DC offset component, for example, until about 20 to 30 dB can be obtained. However, the reference carrier wave supplied from the local oscillator 18 usually has about 0 dBm, so that the produced reflected waves 32 and 35 usually have a higher level than a desired wave level to be received by nature. Therefore, it is required to provide means for removing only the DC offset component on the output side of the mixer 16 in order to obtain a desired D/U.

As an example of conventional methods for removing the DC offset, there is a method using AC coupling means (which will be hereinafter referred to as an "AC couple") 30 and 31 in the output of the mixers 16 and 17, as shown in FIG. 1. This method is effective when the DC offset is always constant. However, when the DC offset fluctuates with time, there is the following problem. FIG. 3(a) shows the output of the mixer 16 having no AC couple when a DC offset 104 is superposed on a desired wave 108. It is assumed that the DC offset 104 is changed to a DC offset 105 at time t' 103. This corresponds to the fact that the circuit operation conditions of the RF amplifier 11 in FIG. 2A is changed. For example, this corresponds to the fact that the output impedance of the RF amplifier 11 varies to allow the reflected mount 32 to fluctuate in a case where the gain of the RF amplifier 11 is switched at time t' 103 on the basis of a control signal 33 outputted from the digital signal processing circuit 4.

At the time, a difference 106 between the DC offset 104 before time t' 103 and the DC offset 105 after time t' 103 in FIG. 3(a) causes the fluctuation of DC offset. In such a case, the state that the AC couple 30 is applied to the output of the mixer 16 is shown in FIG. 3(b). That is, a transient response 109 corresponding to a time constant of a AC couple 30 occurs over a period of time 107 under the influence of the difference 106 of DC offsets. When a signal to be received incomes before the transient response 109 falls, the desired wave is under the influence of the DC offset, so that the deterioration of the receive characteristic occurs. That is, even if the AC couple 30 is used, the influence of DC offsets can not be removed. In addition, in a case where the AC couple 30 is used, a part of the desired wave is removed with respect to a desired signal containing a DC component as shown in FIG. 3(b) by the frequency characteristic 8 of the AC couple shown in FIG. 2B, so that there is a disadvantage in that the receive characteristic is deteriorated.

The aforementioned method for providing means for switching the gain of the RF amplifier 11 is often used in order to increase the receive dynamic range particularly n a direct conversion receiver. In addition, this method is usually used in order to prevent the useless consumption of a battery in a small receiver. Since such a battery saving control for a RF circuit also changes the operation condition of the circuit, the same fluctuation of DC offset occurs. Therefore, it is necessary for a small receiver, particularly for a direct conversion receiver, to prevent the influence of the aforementioned fluctuation of DC offset.

As can be seen from the above descriptions, the rate of fluctuation of a DC offset generally corresponds to the rate of fluctuation of a reflected wave inputted to the mixer 16 again. This was explained mainly with respect to the reflected wave 32 from the RF amplifier 11 in FIG. 1. On the other hand, in FIG. 2A, in a case where a wave radiated from the antenna 2 is reflected on the reflector 36 to be inputted to the mixer 16 again, the amount of DC offset in the output of the mixer 16 also fluctuates in accordance with the rate of the change of state of the outside reflector 36. For example, in a case where the outside reflector 36 is a moving vehicle, the amount of DC offset varies at the same rate as a fading pitch produced on the basis of the moving speed.

This situation is shown in FIGS. 4(a) and 4(b). In FIG. 4(b), reference number 111 denotes a TDMA frame, which periodically receives received slots 112 and 116 periodically assigned to their terminals. FIG. 4(a) shows DC offsets, and reference number 105 denotes a relatively high-speed fluctuation of DC offset produced in accordance with the fading pitch. On the other hand, reference numbers 113 and 114 also denotes DC offsets, which are relatively slow fluctuated components of DC offsets which are changed by carrying out the battery saving or the gain switching at time t' 103. Therefore, in the direct conversion receiver under an actual environment, the high-speed fluctuation of DC offset is mixed with the low-speed fluctuation of DC offset. For that reason, for practical use, it is desired to more flexibly remove the influence of the fluctuation of DC offset in accordance with the cause of DC offset and the temporal fluctuation of DC offset.

In addition, the same problems as the aforementioned problems with the respect to the fluctuation of DC offset occur, not only in the aforementioned zero IF receiver, also in so-called superheterodyne receiving system shown in FIG. 5, wherein a received frequency is frequency-converted into an intermediate frequency, and then, frequency-converted into a base band again. That is, FIG. 5 shows a basic construction of a receiver having an analog orthogonal demodulating section. In this receiver, a high-frequency signal received by a receiving section 1 containing antenna 2 is amplified by the RF amplifier 11. This signal is frequency-converted into an intermediate frequency by means of a frequency-converting section 12.

That is, the high-frequency signal is multiplied by a reference signal outputted from a local oscillator 13, by means of a mixer 14 of a frequency converting section 12, and the wide-area components produced by the multiplication is removed by a band-pass filter (BPF) 15. Thereafter, the received signal frequency-converted into an intermediate frequency by means of the frequency converting section 12 is divided into signals of two lines. Then, these signals are mixed with carrier waves, each of which has substantially the same frequency as that of an intermediate frequency signal supplied from the local oscillator 18, by means of the mixers 16 and 17 to be frequency-converted (orthogonal-demodulated) into a base frequency band. The local oscillator 18 is connected to the mixer 16 and also connected to the mixer 17 via the $\pi/2$ phase-shifter 19. Therefore, the signals of two lines frequency-converted into the base band have phases shifted by $\pi/2$ from each other. From these base band signals of two lines, undesired frequency components other than desired channels are removed by low-pass filters (LPFs) 22 and 23 serving as channel selectors. Thereafter, these signals are amplified to desired signal levels by base-band amplifiers 26 and 27, and then, A/D converted by the A/D converter 3 to be demodulated to original signals by a detector built in the digital signal processing circuit 4. Furthermore, although it is required to provide an image removing filter down-stream of the RF amplifier 11, the description of this filter will be omitted hereinafter.

The operation of the superheterodyne receiver having the construction shown in FIG. 5 is the same as that of the aforementioned zero IF receiver. Therefore, there are the same problems as those of the temporal fluctuation of DC offset, which have been described referring to FIGS. 2 through 4.

In addition, in the aforementioned receiver having the orthogonal demodulating section and the zero IF receiver, it is required to switch the gain of the radio section. Referring to FIGS. 6 through 10B, examples of conventional methods for switching the gain will be described. FIG. 6 shows an example of a conventional zero IF receiver, to which a method for switching the gain of a radio section is applied. In FIG. 6, an analog signal processing circuit 10A has the same construction as that of the analog signal processing circuit 10 of FIG. 1, except that the AC couples 30 and 31 are not provided. In FIG. 6, the radio section is, e.g., the analog signal processing circuit 10A including a RF amplifier 11, mixers 16 and 17 and amplifiers 26 and 27.

In FIG. 6, and IQ signal 117 upstream of a detector 36 is picked up to be inputted to an intensity detecting/comparing circuit 37 for detecting and comparing the received field intensity. The received field intensity is calculated by means of the intensity detecting/comparing circuit 37 to be compared with a reference voltage 38. Thus, optimum gains to be set in the RF amplifier 11, the mixers 16, 17 and the amplifiers 26, 27 are determined to output gain control signals 121. That is, gain control signals 118, 119 and 120 are supplied to the RF amplifier 11, the mixer 16, 17 and the amplifiers 26, 27. The gain switching control is carried out by setting the gains of the respective circuits in accordance with the received field intensity, e.g., as shown in the table of FIG. 7. In FIG. 7, five receive modes including modes A through E are provided by combining the gains of the radio section so that a receive dynamic range of 100 dB can be ensured.

However, in a case where the radio-section gain switching shown in FIG. 6 is carried out, there is the following problem particularly with respect to DC offsets. Referring to FIGS. 8A through 9B, this problem will be described. FIGS. 8A through 9B show only one channel of the IQ channels of the zero IF receiver of FIG. 6. It will be now described that the DC offset output of the mixer 16 fluctuates by switching the gain of the RF amplifier 11. FIG. 8A shows the state of mode E in FIG. 7, i.e., the state that the gain of the RF amplifier 11 is set to be 0 dB. On the other hand, FIG. 9A shows the state of mode D, i.e., the state that the gain of the RF amplifier 11 is set to be 20 dB. It is assumed that the gain of the RF amplifier 11 is switched from the state of FIG. 8A to 20 dB of FIG. 9A (from mode E to mode D in FIG. 7) by a RF-amplified gain switching control signal 118 outputted from a control section (not shown).

At this time, with respect to the amount of a wave reflected on the RF amplifier 11 after outgoing the local oscillator 18 to pass through the mixer 18, the amount of a reflected wave 124 of FIG. 7A is different from that of a reflected wave 125 of FIG. 9A. Because the output impedance of the RF amplifier 11 of FIG. 8A is different from that of FIG. 9A. In both cases of FIGS. 8A and 9A, a direct current (DC) component produced by the self-mixing is superposed on a desired signal component 123 to produce a mixer output 122. For the aforementioned reason, a mixer DC output DCLOW in FIG. 8 is different from a mixer DC output DCHIGH in FIG. 9A. Therefore, when the gain of the RF amplifier 11 is switched from 0 dB (the state shown in FIG. 8B) to 20 dB (the state shown in FIG. 9B) (from mode E to mode D in FIG. 7), a fluctuation of DC offset being a difference between DCLOW and DCHIGH occurs at the output of the mixer 16.

As mentioned above, even if the gain of the mixer 16 is constant (the changed component of the gain of the mixer when the mode is switched from mode E to mode D=0 dB), the fluctuation of DC offset occurs at the output of the mixer 16 in accordance with the switching of the gain of the RF amplifier 11.

The aforementioned phenomenon that the DC offset output fluctuates does not always occur only when the gain of the RF amplifier 11 is changed. Similar to the gain change of the RF amplifier 11, the fluctuation of DC offset occurs by the change of the gains of the mixer 16 and the amplifier 26. Moreover, in circuits having different gains, the output DC components of the respective circuits are different from each other, so that the fluctuation of DC offset occurs when the gain of the circuit is switched.

If such a fluctuation of DC offset occurs during a call, it is required to very quickly correct the fluctuation of DC offset. Referring to FIGS. 10A and 10B, this aspect will be described. FIG. 10A shows a received time slot of TDMA, and FIG. 10B is an enlarged view of the received time slot. In FIG. 10A, T denotes a TDMA frame length. After a received time slot 126 assigned to its terminal is received in mode E of FIG. 7, the mode is changed to mode D at a gain switching timing 129, and it is considered to receive the next slot 127. The DC offset is changed from D to E at the gain switching timing 129. In a case where the DC offset is corrected, it is required to correct the DC offset before the starting time 180 of the received time slot. However, in a system having a very short frame length T, a desired operation time may be unavailable. Moreover, as shown in FIG. 10B, in a case where it is required to carry out the gain switching of modes A, B, C, D and E of the received time slot 127 assigned to its terminal, it is required to instantaneously correct the DC offset. In a case where the DC offset can not be instantaneously corrected, the DC offsets A, B, C, D and E in the respective receive modes are different from each other as shown in FIG. 10B. Therefore, the fluctuated component of DC offset is superposed on a desired signal, so that the receive characteristic is greatly deteriorated.

In addition, in conventional direct conversion receivers, the LPFs 18 and 19 can be formed as LSIs. However, due to the dispersion of cut off frequencies based on the dispersion of elements formed as LSIs, the channel selection can not be sufficiently carried out, and desired signals may be removed, so that the receive characteristic may be deteriorated.

As mentioned above, in conventional direct conversion receivers, there is a problem in that the receive error rate is deteriorated by the DC offset produced when the received signal is processed by the analog signal processing circuit. In addition, in superheterodyne receivers, there is also a problem in that the receive error rate is lowered by the temporal fluctuation of the DC offset.

In addition, there is a disadvantage in that, even if it is tried to remove the DC offset by only the AC couple, it is not possible to completely remove the influence of the DC offset due to the transient response in the AC couple when the temporal fluctuation of DC offset occurs. Moreover, since the AC couple removes a part of signal components with respect to received signals having DC signal components, the receive characteristic may be deteriorated by removing the part of the signal components, so that there is a disadvantage in that the offset removing function can not be sufficiently provided by only providing the AC couple in the analog signal processing section.

In addition, there is a disadvantage in that a good call can not be accomplished by a system using such a receiver, since the receive error rate is deteriorated due to the DC offset produced when the signal thus received is processed by the analog signal processing circuit.

In addition, in a conventional receiver having an orthogonal demodulating section, there is a problem in that the receive characteristic is deteriorated by the DC offset produced in the analog signal processing section. In addition, although the DC offset may be detected to be corrected, there is a problem in that the detection and correction of the DC offset take a lot of time. Therefore, in a case where the amplitude of the receive level is rapidly changed or in a case where the receive level is indefinite, there is a problem in that it is not possible to respond to the fluctuation of the DC offset produced when the gain of the required radio section is quickly switched.

In addition, there is a problem in that the receive characteristic is deteriorated by the dispersion in cut off frequency of the filter formed as a LSI. Due to the DC offset produced when the signal thus received is processed by the analog signal processing circuit and due to the deterioration of the receive error rate caused by the dispersion in cut-off frequency of the filter, there is a problem in that a good call can not be accomplished by a system using such a receiver.

Moreover, in a case where the DC offset is detected, if a signal wave having a DC component other than the DC offset to be detected is received, the DC offset can not be accurately detected. Therefore, if a radio wave used for another radio communication system is received by an antenna, there is a possibility in that the DC offset can not be accurately detected due to the incoming wave.

SUMMARY OF THE INVENTION

It is therefore an object of the present invention to eliminate the aforementioned problems and to provide a receiver, which can accurately remove the DC offset in accordance with the temporal fluctuation of DC offset produced in an analog processing section, and a communication system using the receiver.

In order to accomplish the aforementioned and other objects, according to a first aspect of the present invention, a receiver comprises: a receiving section for receiving a radio frequency signal; an analog signal processing section for amplifying, band-converting and frequency-converting an analog signal inputted from the receiving section; an AD converting section for converting an output of the analog signal processing section from an analog signal to a digital signal; a digital signal processing section for processing the digital signal converted by the DC converting section; offset detecting means, provided in the digital signal processing section, for detecting a direct current offset signal produced in the receiving section or a frequency converting section; offset holding means, provided in the digital signal processing section, for holding the direct current offset signal detected by the offset detecting means; a DA converting section for converting the direct current offset signal detected by the digital signal processing section into an analog signal; and first offset correcting means, provided in the analog signal processing section, for correcting the analog signal on the basis of the direct current offset signal converted by the DA converting section into the analog signal.

According to a second aspect of the present invention, a receiver further comprises second offset correcting means for digitally decreasing a part of the direct current offset signal held by the offset holding means to decrease the direct current offset.

According to a third aspect of the present invention, there is provided a receiver wherein the direct current offset held by the offset holding means is updated every time the offset detecting means detects an offset.

According to a fourth aspect of the present invention, a receiver further comprises offset distributing means for correcting at least an offset part exceeding a predetermined threshold by the first offset correcting means when an absolute value of an offset detected by the offset detecting means exceeds the predetermined threshold.

According to a fifth aspect of the present invention, there is provided a receiver wherein the predetermined threshold is a power of 2.

According to a sixth aspect of the present invention, there is provided a receiver wherein more significant bite of the offset held by the offset holding means are converted into analog values by means of the DA converting section to correct the offset by the first offset correcting means, and less significant bits of the offset held by the offset holding means are used to correct the offset by the second offset correcting means.

According to a seventh aspect of the present invention, there is provided a receiver wherein the offset holding means comprises first storing means for holding at least an initial value of the offset detected by the offset detecting means, and second storing means for holding a fluctuated part of an offset varying with time, the fluctuated part being detected by the offset detecting means after the offset is corrected on the basis of the initial value of the offset by the first and second offset correcting means.

According to a eight aspect of the present invention, there is provided a receiver wherein the initial value of the offset stored in the first storing means is detected by the offset detecting means only once, and thereafter, the detected initial value is unchanged.

According to a ninth aspect of the present invention, there is provided a receiver wherein the initial value of the offset stored in the first storing means is detected to be set when a power supply is turned on.

According to a tenth aspect of the present invention, there is provided a receiver wherein the initial value of the offset stored in the first storing means is detected every time a predetermined period of time elapses.

According to an eleventh aspect of the present invention, there is provided a receiver wherein the initial value of the offset stored in the first storing means is updated when the fluctuated part of the offset varying with time exceeds a predetermined value.

According to a twelfth aspect of the present invention, there is provided a receiver wherein the fluctuated part of the offset stored in the second storing means is corrected by the second offset correcting means provided in the digital signal processing section.

According to a thirteenth aspect of the present invention, there is provided a receiver wherein the initial value of the offset stored in the first storing means is corrected by the first offset correcting means provided in the analog processing section, and the fluctuated part of the offset stored in the second storing means is corrected by the second offset correcting means provided in the digital signal processing section.

According to a fourteenth aspect of the present invention, a receiver further comprises: means for measuring a received field intensity inputted via the signal input section; means for setting a plurality of gains in the analog signal processing section on the basis of the received field intensity; the offset detecting means detecting a plurality of direct current offset values produced in accordance with the plurality of gains set in the analog signal processing section; the offset holding means holding the plurality of direct current offset values; and the first offset correcting means reading a direct current offset value, which corresponds to a gain set in the analog signal processing section, out of the offset holding means to correct the direct current offset.

According to a fifteenth aspect of the present invention, there is provided a receiver wherein the analog signal processing section comprises: a pair of mixers for frequency-converting signals perpendicular to each other containing at least an in-phase component and an orthogonal component of the radio frequency signal inputted to the signal input section; and base band filters provided in an in-phase component channel and an orthogonal component channel which are outputs of the pair of mixers, the first offset correcting means being provided at least upstream of the base band filters for correcting the direct current offset produced in the analog signal processing section.

According to a sixteenth aspect of the present invention, there is provided a receiver wherein the analog signal processing section is set to be a first gain value, and the AD converting section converts an output of the analog signal processing section into a digital value, the receiver further comprising: a overflow detecting circuit for detecting an overflow state of the AD converting section; and control means for controlling the gain of the analog signal processing section so that the gain is set to be a second gain value smaller than the first gain value when the overflow state is detected by the overflow detecting circuit.

According to a seventh aspect of the present invention, there is provided a receiver wherein the analog signal processing section includes storing means for detecting and storing a direct current offset produced by the inputted radio frequency signal, and the first offset correcting means corrects the direct current offset on the basis of the first gain value read out of the storing means even if only one receive is carried out.

According to an eighteenth aspect of the present invention, a receiver further comprises analog signal no-input means for no-inputting the analog signal inputted to the analog signal processing section, and wherein the offset detecting means detects the direct current offset when the analog signal is no-inputted, and the first offset correcting means corrects the direct current offset on the basis of the detected direct current offset value.

According to a nineteenth aspect of the present invention, there is provided a receiver wherein the analog signal no-input means comprises a switch provided between a radio frequency signal amplifier provided in the analog signal processing section and the signal input section.

According to a twentieth aspect of the present invention, there is provided a receiver wherein the analog signal no-input means comprises: attenuator connected in parallel to the radio frequency signal amplifier provided in the analog signal processing section; four switches provided upstream and downstream of each of the amplifier and the attenuator; and a fifth switch provided in a connecting line upstream of the amplifier and the attenuator, and wherein a signal supply path extending from the signal input section and the analog signal processing section is capable of causing the analog signal processing section to be in a no-input state even of the signal supply path is always connected.

According to a twenty-first aspect of the present invention, there is provided a receiver wherein the offset detecting means detects the direct current offset by a time mean of outputs of the AD converting section, and the first offset correcting means corrects the direct current offset by subtracting the direct current offset, which is converted into an analog signal by means of the DA converting section, from the analog signal processed by means of the analog signal processing section.

According to a twenty-second aspect of the present invention, there is provided a receiver wherein the offset detecting means detects the direct current offset on the basis of the received slot in a time division multiple connection system, and the first offset correcting means corrects the direct current offset on the basis of the detected value of the direct current offset detected by the received slot.

According to a twenty-third aspect of the present invention, there is provided a receiver wherein the offset detecting means detects a direct current offset of the current received slot using, as an initial value, a time mean value of direct current offsets detected by the past received slots, and the first offset correcting means corrects the detected direct current offset of the current received slot.

According to a twenty-fourth aspect of the present invention, there is provided a receiver wherein the offset detecting means comprises: a cumulating/adding circuit for cumulating/adding digital signals inputted from the AD converting section; and a divider circuit for dividing the cumulated/adding signals, and wherein the offset holding means comprises; a plurality of delay circuits for delaying outputs of the offset detecting means by a predetermined period of time; a plurality of weighting circuits for multiplying the values, which are delayed by means of the delay circuits, by weighting coefficients, which are preset so as to increase as approaching the direct current offset, to output the multiplied values; and an adder circuit for integrating outputs of the weighting circuit to output the integrated value as a direct current offset value.

According to a twenty-fifth aspect of the present invention, there is provided a receiver wherein each of the weighting coefficients of the plurality of weighting circuits is set so that the older weighting coefficient is light and the newer weighting coefficient is heavy.

According to a twenty-sixth aspect of the present invention, there is provided a receiver wherein each of the weighting coefficients set in the plurality of weighting circuits varies in accordance with the fluctuating amount of the direct current offset which is detected by the offset detecting means and which fluctuates with time.

According to a twenty-seventh aspect of the present invention, there is provided a receiver which has a test mode in which a band limitation characteristic of the analog signal processing section is tested, wherein the digital signal processing section comprises: a generator for generating a test signal for testing the band limitation characteristic of the analog signal processing section; and an adder for adding the test signal, which is outputted from the test signal generator in the test mode, to the direct current offset signal, and wherein the first correcting means supplies an output of the adder after being converted into an analog signal by means of the DA converting section, to an input of a band limitation circuit of the analog signal processing section.

According to a twenty-eighth aspect of the present invention, there is provided a receiver wherein the analog signal processing section tests the band limitation characteristic in the analog signal processing section after the direct current offset is detected by the offset detecting means and the direct current offset is held by the offset holding means.

According to a twenty-ninth aspect of the present invention, there is provided a receiver wherein the analog signal processing section has a band limitation circuit having a function of adjusting the band limitation characteristic of the analog signal, and the digital signal processing section has a frequency characteristic control means for producing the frequency characteristic control signal in accordance with a difference between a frequency characteristic detected by the test signal supplied to the band limitation circuit in the test mode end a desired frequency characteristic.

According to a thirtieth aspect of the present invention, a communication system comprises: a transmitter for transmitting a radio frequency signal of an information signal containing voice and image; a communication network for transmitting and receiving the radio frequency signal; and a receiver having a function of a direct current offset, the receiver comprising: a receiving section for receiving the radio frequency signal; an analog signal processing section for amplifying, band-converting and frequency-converting an analog signal inputted from the receiving section; an AD converting section for converting on output of the analog signal processing section from an analog signal to a digital signal; and a digital signal processing section for processing the digital signal converted by the DC converting section; offset detecting means, provided in the digital signal processing section, for detecting a direct current offset signal produced in the receiving section or a frequency converting section; offset holding means, provided in the digital signal processing section, for holding the direct current offset signal detected by the offset detecting means; a DA converting section for converting the direct current offset signal detected by the digital signal processing section into an analog signal; and first offset correcting means, provided in the analog signal processing section, for correcting the analog signal on the basis of the direct current offset signal converted by the DA converting section into the analog signal.

According to the aforementioned communication system, since it is possible to decrease a DC offset, which is produced in the analog signal processing circuit, at the input of the A/C converter of the receiver, it is possible to a signal from being distorted by the DC offset in excess of the input range of the A/D converter and to decrease the receiver error rate, so that it is possible to achieve a good communication. In addition, since no AC couple is used, there is no influence of the transient response of the temporal variation of the DC offset. Therefore, it is possible to decrease the deterioration of the receive error rate, so that it is possible to achieve a good communication. Moreover, since it is possible to remove only DC offset components serving as errors to a signal used for a modulation system containing low-frequency components containing DC, it is possible to decrease the deterioration of the error rate of the received signal, so that it is possible to achieve a good communication.

In addition, with the aforementioned construction, even immediately after a call is started, it is possible to roughly offsets by storing the offset value only once when the power supply is turned on, so that it is possible to decrease the deterioration of the receive error rate.

BRIEF DESCRIPTION OF THE DRAWINGS

In the drawings:

FIG. 2A is a block diagram of a principal part of a mixer for explaining that a DC offset occurs, and FIG. 2B is a graph showing the characteristic thereof;

FIGS. 3A and 3B are graphs explaining that a DC offset can not be sufficiently removed by an AC couple;

FIG. 4 is a view explaining that a DC offset has a fluctuated component and a fixed component;

FIG. 7 is a table showing a radio-gain switching mode;

FIG. 8A is a block diagram showing that a DC offset fluctuates by switching the gain of a radio section, and FIG. 8B is a graph showing the characteristic thereof;

FIG. 9A is a block diagram showing that a DC offset fluctuates by switching the gain of a radio section, and FIG. 9B is a graph showing the characteristic thereof;

FIG. 26 is a table showing an example of a gain switching mode of a receiver according to the present invention;

FIG. 45 is a table showing an operating mode of FIG. 44B;

FIG. 46 is a block diagram illustrating a principal part of the fifteenth preferred embodiment of a receiver according to the present invention;

FIG. 47 is a table showing an operating mode of a switch of FIG. 46;

FIGS. 51A and 51B are characteristic views for explaining that a DC offset detection accuracy is improved by changing the number of samples;

FIG. 62 is a block diagram illustrating a principal part of FIGS. 60 and 61.

DESCRIPTION OF THE PREFERRED EMBODIMENTS

Referring now to the accompanying drawings, the preferred embodiments of a receiver having a DC offset removing function, according to the present invention, will be described below.

Figure 11:
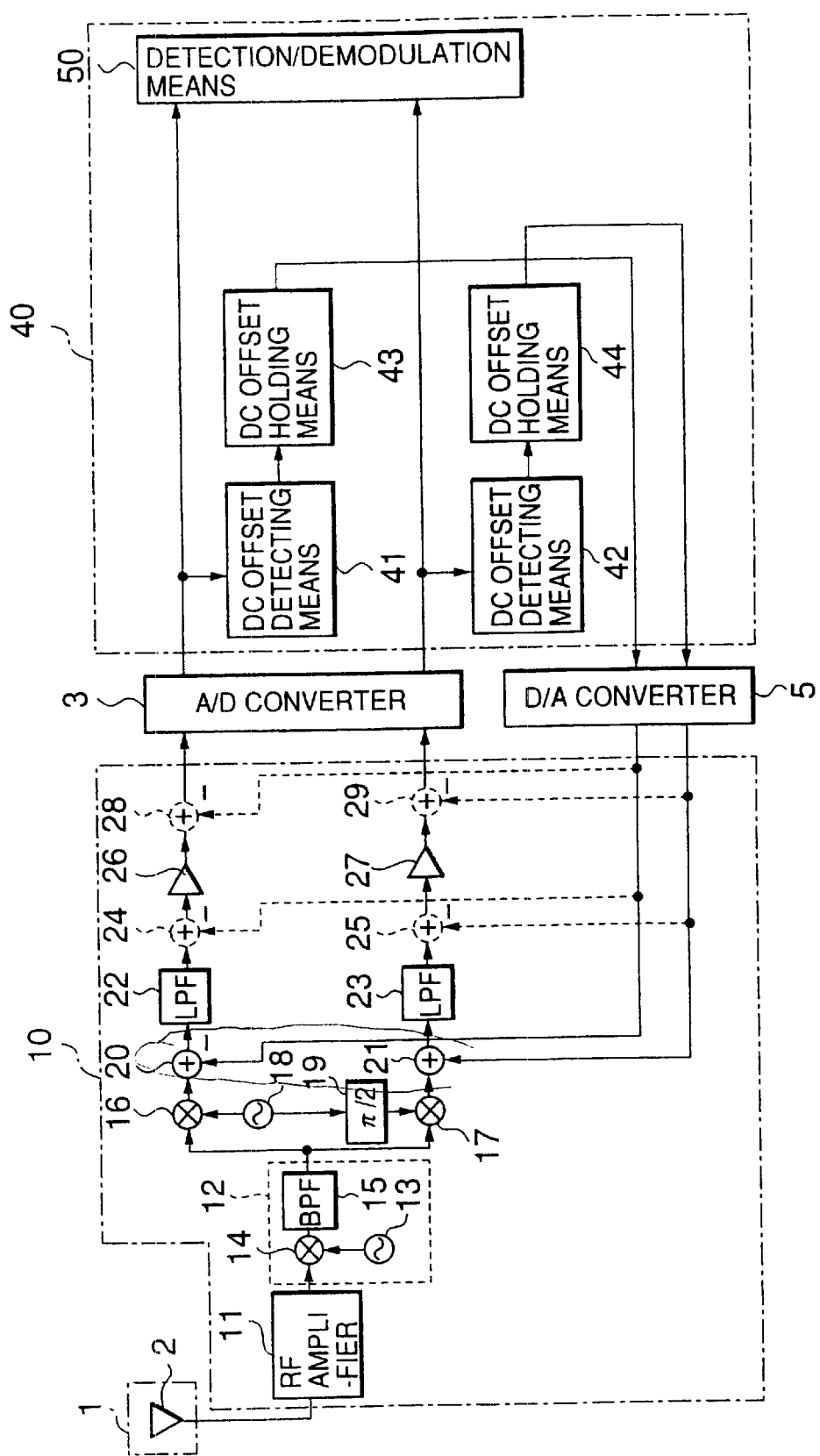
FIG. 11 is a block diagram illustrating a basic construction of the first preferred embodiment of a receiver according to the present invention.

FIG. 11 is a block diagram of the first preferred embodiment of a receiver having a DC offset removing function according to the present invention.

In FIG. 11, a high-frequency signal received by an antenna 2 serving as a signal input section 1 is amplified by means by a RF amplifier 11 in an analog signal processing circuit 10. The amplified signal is converted into an intermediate frequency by means of a frequency converter 202, which comprises a local oscillator 13, a mixer 14 and a band-pass filter (which will be hereinafter simply referred to a "BPF") 15, to be divided into two lines. The divided signals are mixed with carrier waves, which have substantially the same frequency as that of an intermediate frequency signal supplied from a local oscillator 18, by means of mixers 16 and 17, respectively. Each of the mixed signals is directly frequency-converted into a base frequency band. The local oscillator 18 is directly connected to the mixer 16, and connected to the mixer 17 via a $\pi/2$ phase-shifter 19. Therefore, there is a phase difference of $\pi/2$ between the signals of two lines frequency-converted into the base band. From these base band signals of two lines, undesired frequency components are removed by means of LPFs 22 and 23 serving as channel selectors, respectively. Thereafter, the base band signals are amplified to desired signal levels by means of base-band amplifiers 28 and 29, respectively. The amplified base band signals are A/D converted by means of an A/D converter 3, and then, demodulated to original data by detection/demodulation means 50 forming a digital signal processing circuit 40.

In the digital signal processing circuit 40, DC offsets superposed on the respective base band signals are detected by offset detecting means 41 and 42, and the respective DC offsets are held by offset holding means 43 and 44. The held DC offsets are converted from digital signals to analog signals by means of a D/A converter 5. The DC offsets converted into analog signals by the D/A converter 5 are subtracted from the base band signals by first offset correcting means 24 and 25 provided on the outputs of the LPFs 24 and 23 or by first offset means 28 and 29 provided on the outputs of the amplifiers 26 and 27.

Thus, the DC offsets produced in the analog signal processing circuit 10 can be decreased by the input of the A/D converter 3, so that the receiver error rate can be decreased. In addition, it is possible to prevent the DC offset from distorting the signal in excess of the input range of the A/D converter, and it is possible to prevent this distortion from causing receiver errors. Moreover, since no AC couple is used, there is not influence of the transient response of the temporal variation of the DC offset, so that the receive error rate is not deteriorated. In particular, since only the DC offset component serving as an error can be removed from a signal of a modulation system containing a great amount of a low-frequency component containing DC, it is possible to decrease the deterioration of the error rate of the received signal.

The DC offset converted into the analog signal by means of the D/A converter 5 may be subtracted from the base band signal frequency converted by the first offset correcting means 20 and 21 immediately downstream of the mixers 16 and 17. In the case, with respect to the variation of DC offset produced by the gain switching before the frequency conversion, the DC offset can be canceled at the output of the mixer (the input of the LPF) by previously detecting and holding the DC offset at a predetermined gain. Therefore, the transient response of the residual DC offset due to the time constant of the LPF can be decreased in comparison with a system wherein the DC offset is canceled downstream of the output of the LPF.

Figure 1:
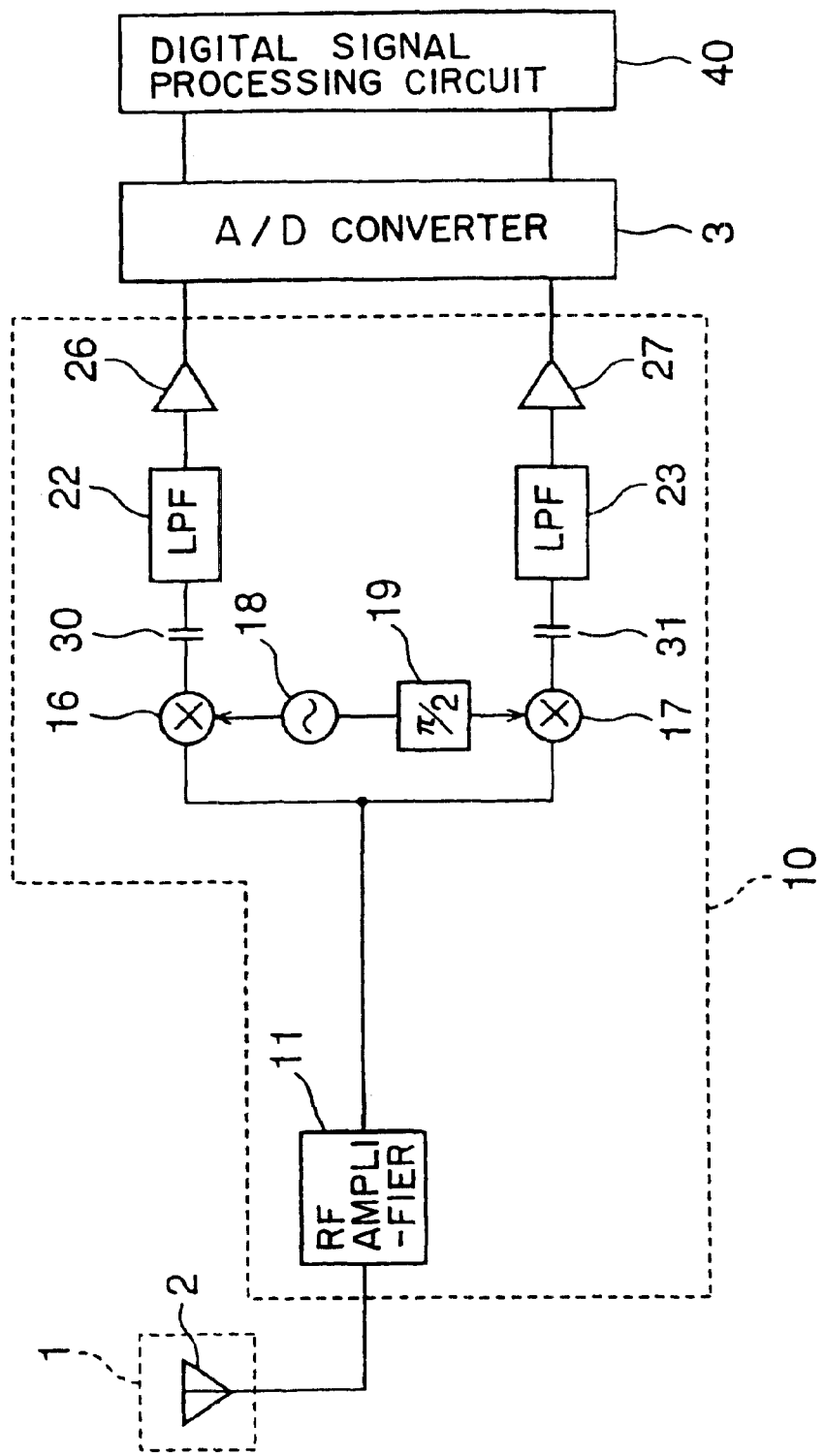
FIG. 1 is a block diagram of a conventional direct conversion receiver having an AC couple in a signal path in an analog signal registry circuit.
Figure 5:
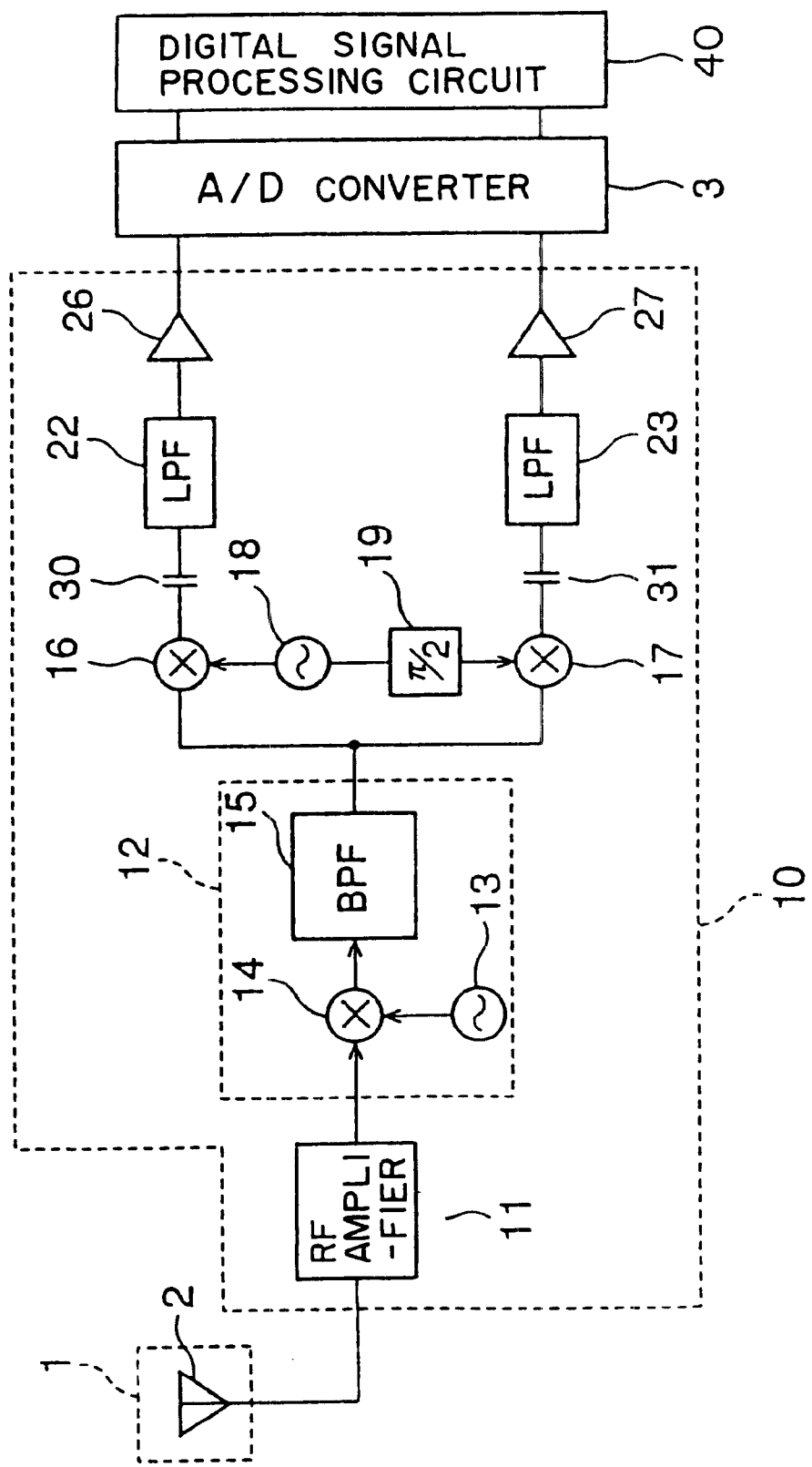
FIG. 5 is a block diagram of a conventional direct conversion receiver.
Figure 6:
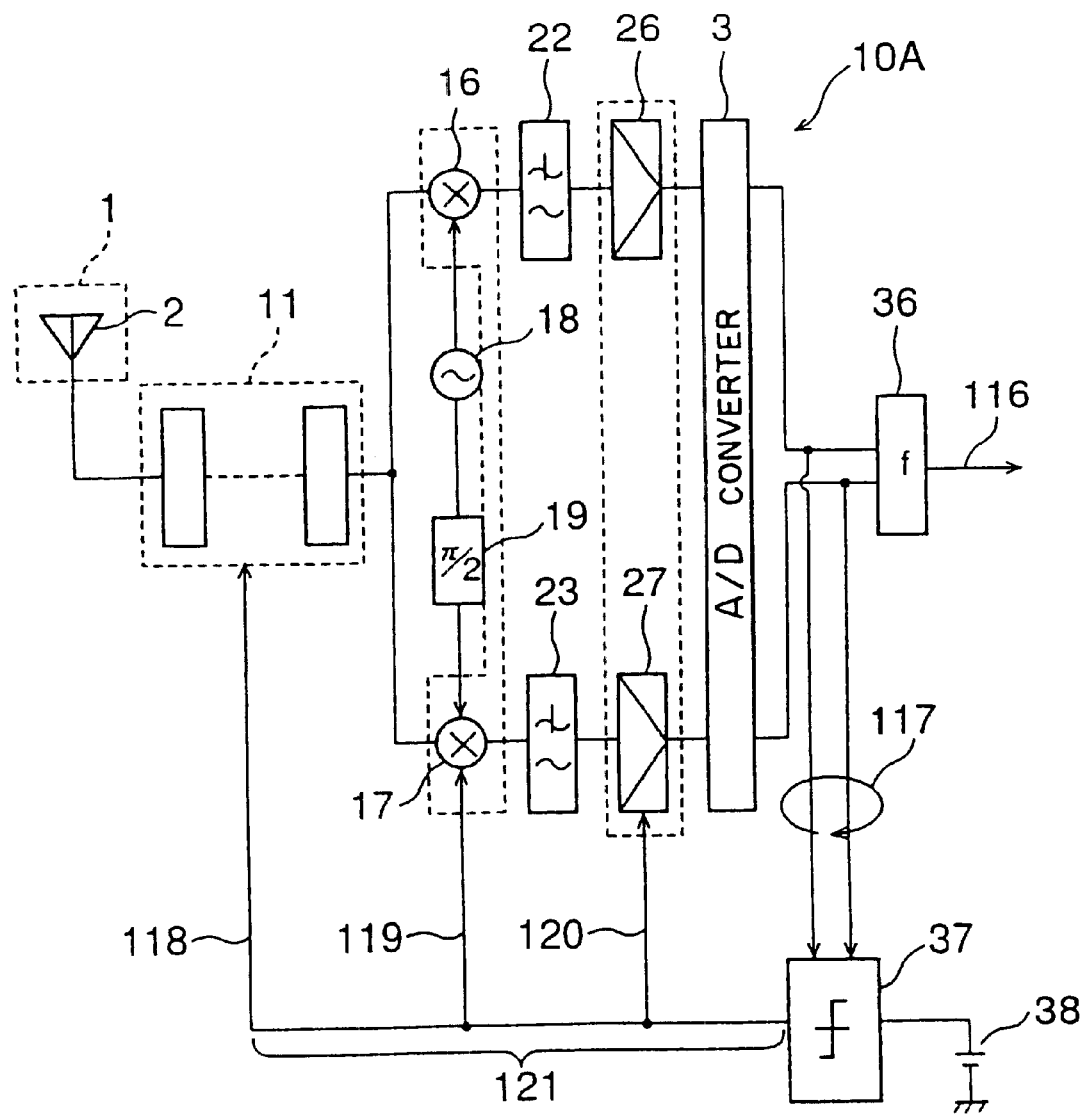
FIG. 6 is a block diagram of a conventional zero IF receiver having a function of switching the gain of a radio section.
Figure 10:
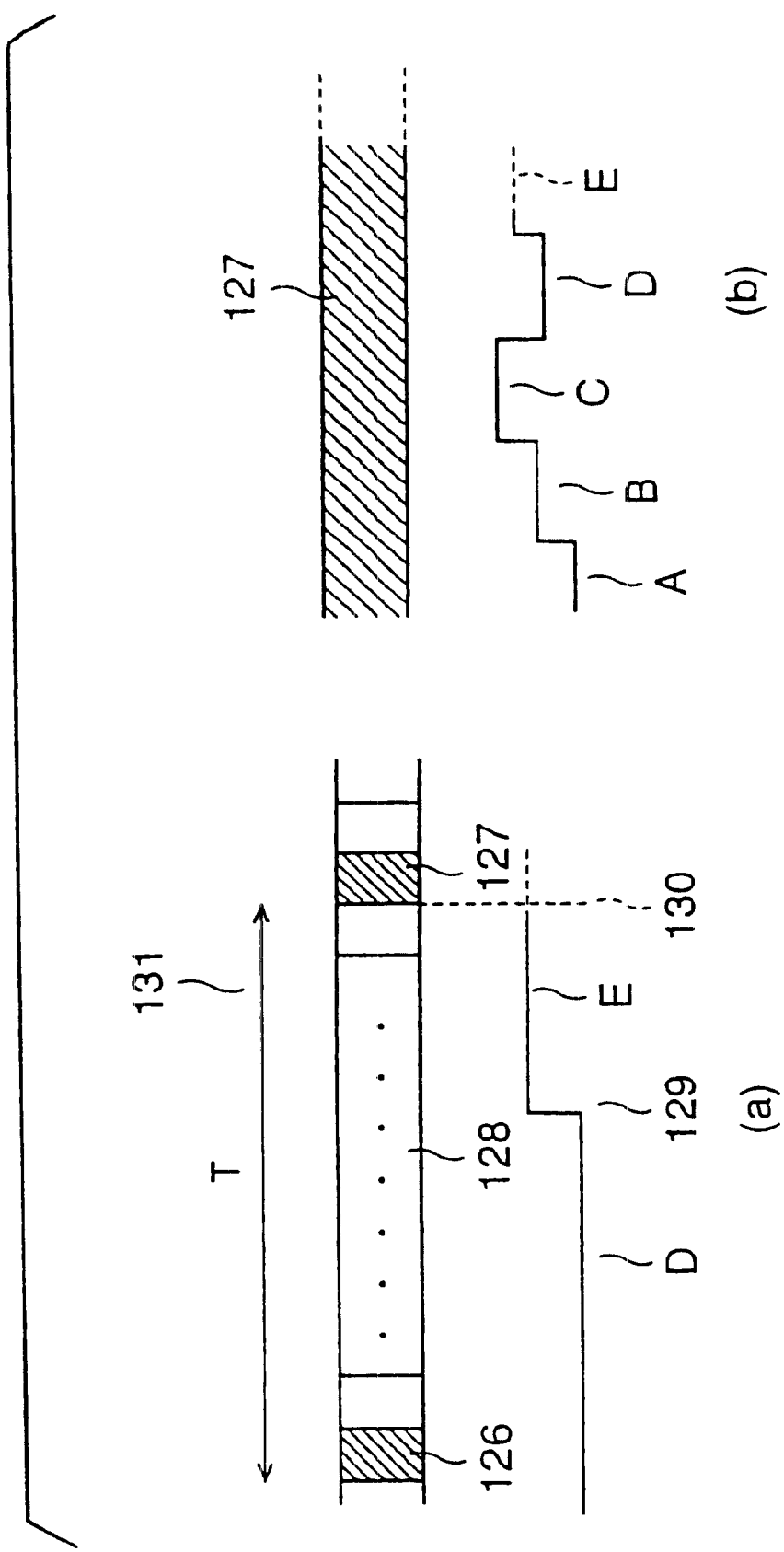
FIG. 10A is a view showing that the receive characteristic is deteriorated by the fluctuation of a DC offset when the correction thereof is insufficient.
FIG. 10B is a conceptual view showing that the deterioration of the receive characteristic due to the fluctuation of a DC offset occurs in a received slot.

Furthermore, also in the case of a direct conversion receiver which does not have the frequency converter 12 in FIG. 1, the DC offset can be removed and the error rate of the received signal can be decreased. If such a receiver is used for a radio communication system, the error rate of the received signal can be decreased, so that a good communication can be achieved.

Figure 12:
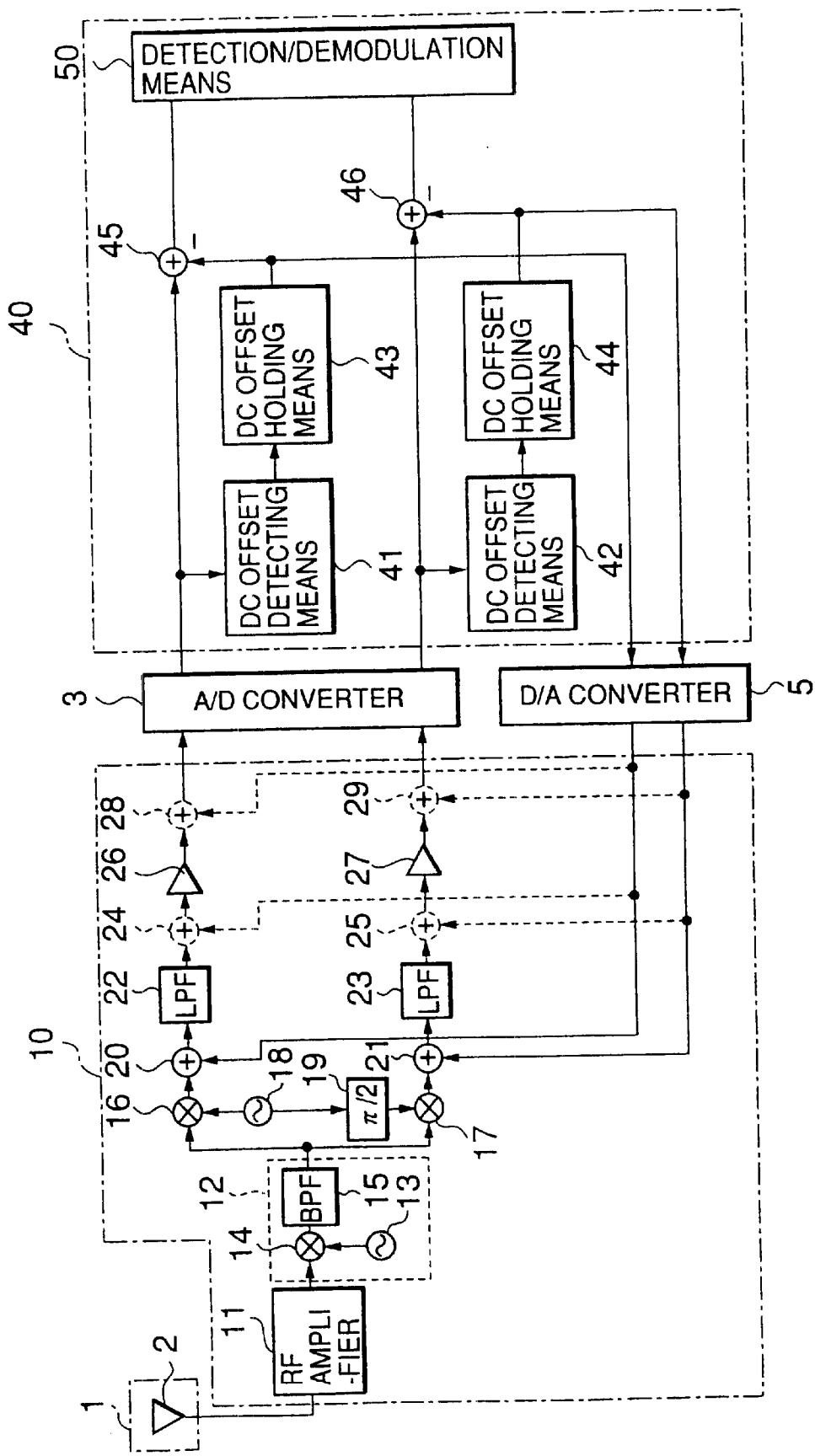
FIG. 12 is a block diagram illustrating a basic construction of the second preferred embodiment of a receiver according to the present invention.

FIG. 12 shows the second preferred embodiment of a receiver according to the present invention, wherein second offset correcting means 45 and 46 are provided in a digital signal processing circuit 40. In FIG. 12, parts of DC offsets held by DC offset holding means 43 and 44 are removed by second offset correcting means 45 and 46. Thus, the DC offsets can be roughly corrected by first offset correcting means 20 and 21 in an analog signal processing circuit so as to prevent signals from distorting in excess of the input range of an A/D converter due to the DC offsets, and the DC offsets can be finely corrected by second offset correcting means 46 and 47 in the digital signal processing circuit 40. Therefore, since the accuracy of a D/A converter 5 and the accuracy of correction by the first offset correcting means 20 and 21 can be relieved, it is not required to provide an expensive high-accuracy D/A converter 5 and high accuracy analog subtracters for the first offset correcting means 20 and 21, so that the costs can be decreased.

Furthermore, with respect to the temporal variation of the DC offset, the detection is frequently carried out by DC offset detecting means, and the value of the offset held by offset holding means every DC offset detection is updated, so that the DC offset can be accurately removed. For example, in a case where the received signal is a TDMA, the DC offset may be removed before a received slot periodically assigned to its terminal.

Figure 13:
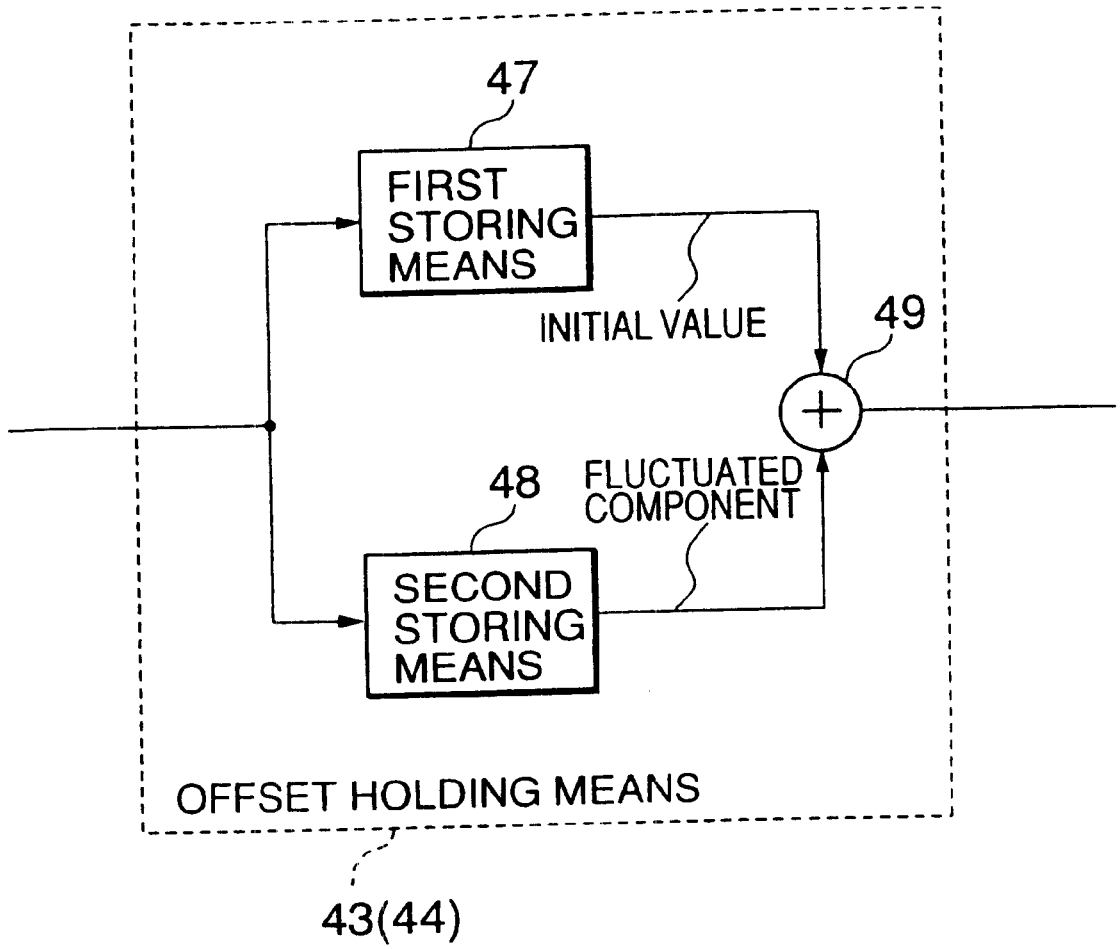
FIG. 13 is a block diagram illustrating offset holding means of the receiver of FIG. 12.

As shown in FIG. 13, the offset holding means 43 shown in FIG. 12 may comprise first storing means 47 for holding initial values of offsets, and second storing means 48 for holding offsets, which have been detected by the DC offset detecting means after being corrected on the basis of the initial values of the offsets and which vary with time, so as to response to the temporal variation of the DC offset. Furthermore, the offset holding means 44 has the same construction as that of the offset holding means 43 shown in FIG. 3.

For example, the DC offset detected by the DC offset detecting means may be set to be an initial value while an input is disconnected form an antenna when a receiver is shipped or when a power supply is turned on. In particular, when the temporal variation of DC offset is small with respect to the whole DC offset, such as a DC offset occurring in accordance with a fading pitch, the initial value may be set once. Thus, since the DC offset held in the first storing means is previously removed, the deterioration of the receive error rate can be decreased when receiving the received slot assigned to its terminal for the first time after the power supply is turned on.

Figure 14:
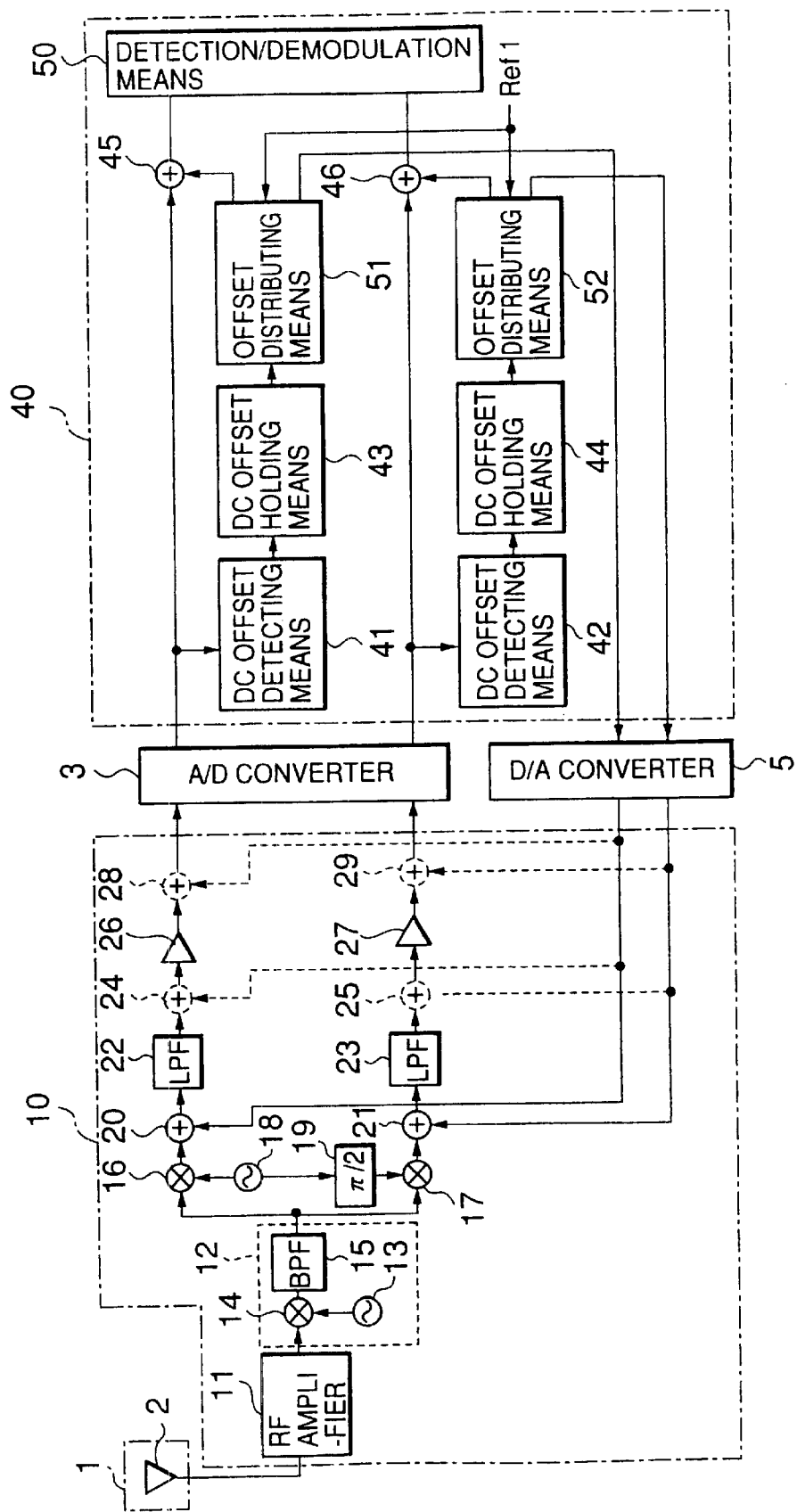
FIG. 14 is a block diagram illustrating a basic construction of the third preferred embodiment of a receiver according to the present invention.

In FIG. 12, the distribution of the corrected DC offset to the first and second offset correcting means is carried out by distributing means 51 and 52 for distributing the DC offset corrected by the first and second offset correcting means using a predetermined threshold Ref1, for example, as the third preferred embodiment shown in FIG. 14. The threshold Ref1 may be set so that a signal does not distort in excess of the input range of the A/D converter 3 even if there is a DC offset.

Figure 15:
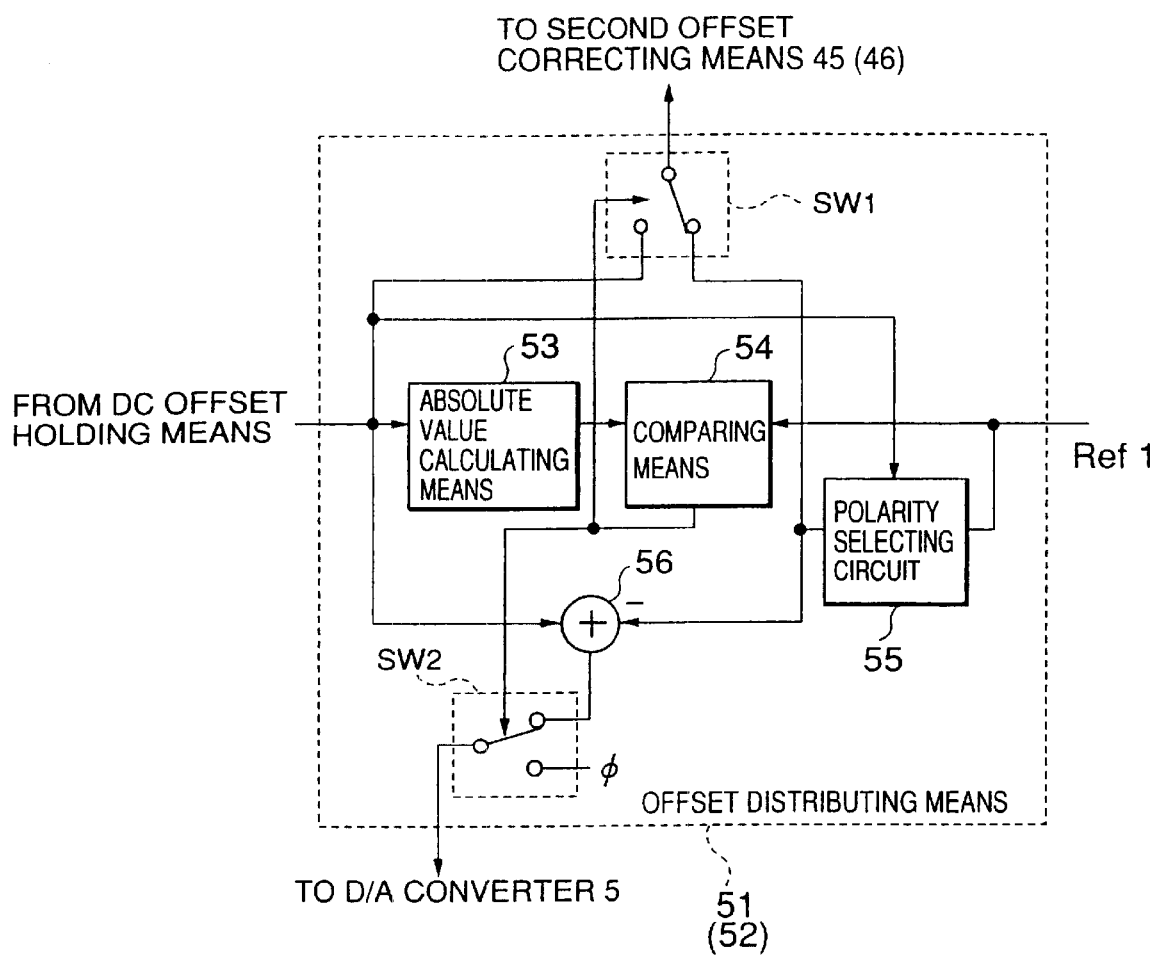
FIG. 15 is a block diagram illustrating offset distributing means of the receiver of FIG. 14.

FIG. 15 is a block diagram specifically illustrating offset distributing means 51 (or 52). By comparing means 54, the DC offset inputted from the offset holding means 43 (or 44) is compared with a predetermined threshold, which has been derived as an absolute valve of the DC offset by absolute value deriving means 53. In addition, the polarity of the threshold Ref1 is matched with the polarity of the inputted DC offset by means of a polarity selecting circuit 55, and it is subtracted from the inputted DC offset by means of a subtracting circuit 56. When the absolute value of the inputted DC offset is greater than the threshold Ref1, the output of the subtracting circuit 56 is selected by switch means SW2 on the basis of the output of the comparing means 54, and converted into an analog value by means of the D/A converter 5 to be outputted to the first offset correcting means 20 and 21. In addition, the output of the polarity selecting circuit 55 is selected by switching means SW1 to be outputted to the second offset correcting means. When the absolute value of the inputted DC offset is smaller than the threshold Ref1, the output of the D/A converter 5 is selected to be zero by the switching means SW2 on the basis of the output of the comparing means 54. In addition, the inputted DC offset is selected by the switching means SW1 to be outputted to the second offset correcting means 45 (or 46).

The offset distributing means 54 and 55 are formed at mentioned above. When the absolute value of the inputted DC offset exceeds the threshold Ref1, the excess part is outputted to the first offset correcting means 20 and 21 via the D/A converter 5, and the part corresponding to threshold Ref1 is outputted to the second offset correcting means 45 and 46. On the other hand, when the absolute value of the inputted DC offset does not exceed the threshold Ref1, all the DC offset is outputted to the second offset correcting means 45 and 46.

Figure 16:
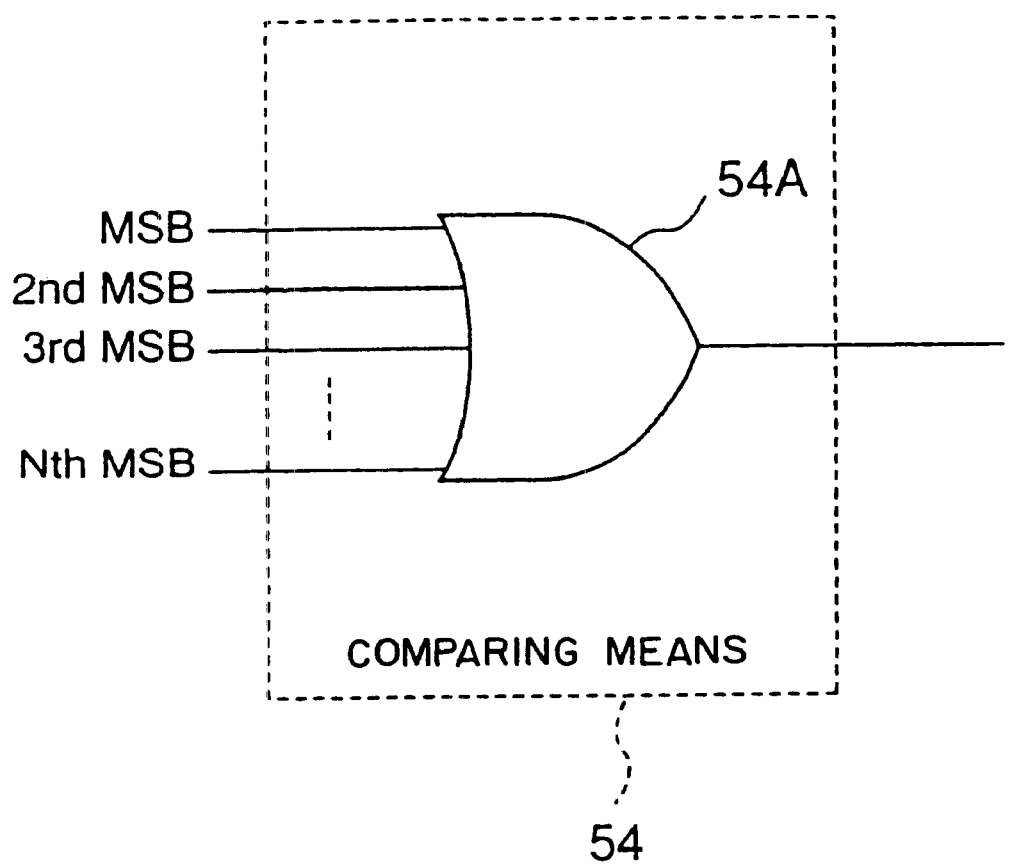
FIG. 16 is a block diagram illustrating comparing means of the receiver of FIG. 14.

FIG. 16 shows an embodiment of the comparing means 54 of FIG. 15 when a value defined by a power of 2 is selected as the threshold Ref1. FIG. 16 shows that bits from the most significant bit (MSB) to the Nth bit are selected as the threshold. If the OR operation of N signals from the MBB to the Nth bit of the inputted DC offset is performed by means of an OR circuit 54A forming the comparing means 54, it can be determined whether the DC offset is not less than the threshold, so that it is not required to provide any complicated comparator circuits. Thus, the offset distributing means 51 and 52 can be simplified by selecting a value expressed by a power of 2 as the threshold Ref1.

Figure 17:
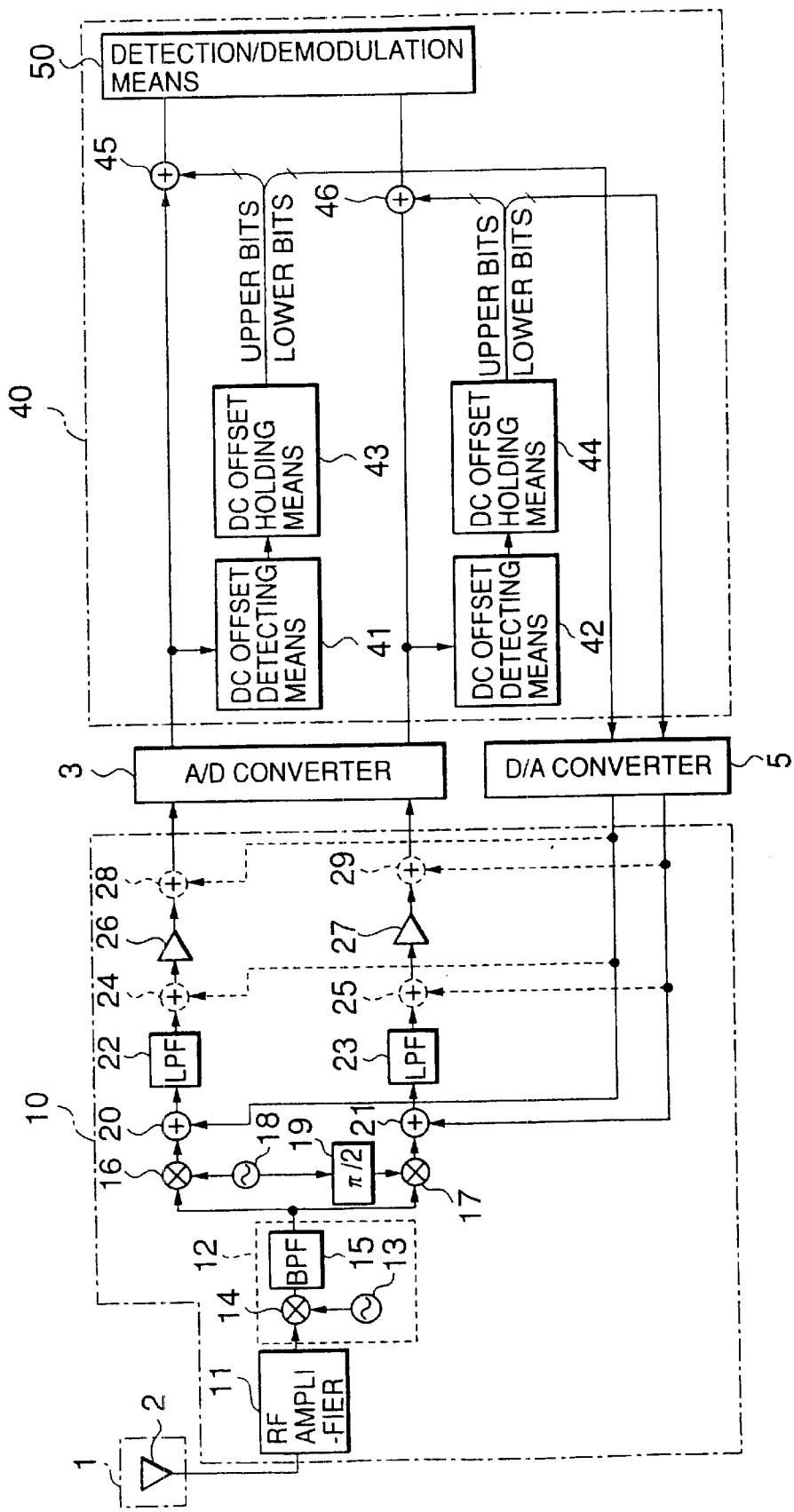
FIG. 17 is a block diagram illustrating a basic construction of the fourth preferred embodiment of a receiver according to the present invention.

FIG. 17 is a block diagram of the fourth preferred embodiment of a receiver according to the present invention. The more significant bits of the detected and held DC offset are removed by first offset correcting means, and the less significant bits of the detected and held DC offset are removed by second offset correcting means. Therefore, the more significant bits are roughly offset, corrected in an analog signal processing section 10, and the less significant bits are finely offset-corrected in a digital signal processing section 40. Thus, offset distributing means can be simplified.

Furthermore, in FIG. 13 showing the aforementioned offset holding means in the second preferred embodiment, the first storing means 47 may hold and output the initial values of offsets, and the second storing means 48 may hold and output the fluctuated parts of offsets with the elapsed time. Referring to FIGS. 18 through 22, four examples of methods for setting the initial value will be described as the fifth preferred embodiment.

Figure 18:
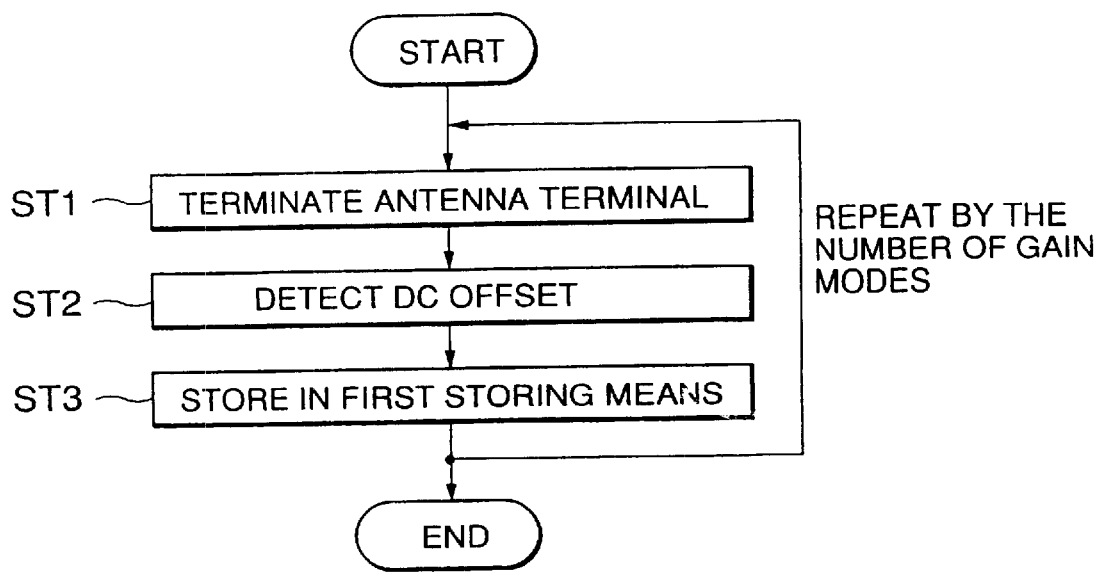
FIG. 18 is a flow chart showing a method for setting a first initial value in the fifth preferred embodiment of a receiver according to the present invention.

FIG. 18 is a flow chart showing a first initial-value setting method. The DC offsets, which have been detected by DC offset detecting means 41 and 42 in the state that the input is disengaged from the antenna when the receiver is shipped, are set as initial values. That is, in FIG. 18, an antenna terminal is terminated at step ST1, and a DC offset is detected at step ST2. Then, an initial value is stored in first storing means 47 at step ST3. When the variation of the DC offset due to secular change, temperature change and so forth is small in comparison with the whole DC offset, the initial value may be set once when the receiver is shipped. Thus, since the DC offset held in the first storing means is removed, it is possible to decrease the deterioration of the receive error rate when the initial received slot assigned to its terminal is received when a call is started. The steps shown in FIG. 18 may be carried out once when the receiver is shipped. In addition, in a case where the first initial-value setting method is used, a road only memory (ROM) may be suitably used as the first storing means 47.

In addition, in a case where a radio section has a plurality of gain modes similar to conventional receivers and different DC offsets are produced in the respective gain modes, the same operations as the aforementioned operation are repeated times corresponding to the number of the gain modes to allow the DC offsets in the respective gain modes to be stored in the first storing means 47, so that it is possible to effectively remove the offsets.

In the second initial-value setting method, the DC offsets, which have been detected by DC offset detecting means 41 and 42 in the state that the input is disengaged from the antenna when the power supply is turned on, are set as initial values. In particular, when the temporal variation of the DC offset is small with respect to the whole DC offset like a DC offset occurring in accordance with a fading pitch, the initial value may be set once. Thus, since the DC offset held in the first storing means 47 is previously removed, the deterioration of the receive error rate can be decreased when receiving the received slot assigned to its terminal for the first time after the power supply is turned on.

Figure 19:
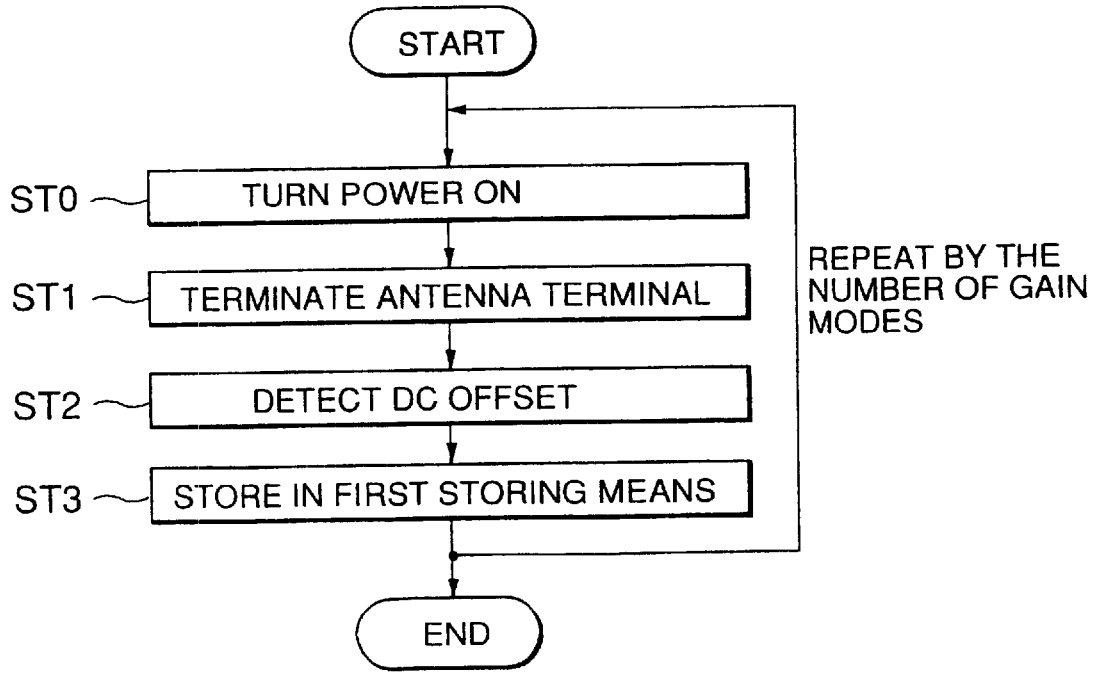
FIG. 19 is a flow chart showing a method for setting a second initial value in the fifth preferred embodiment of a receiver according to the present invention.

These processing steps are shown in FIG. 19. At step ST0, a power supply switch is turned on. Then, an antenna terminal is terminated at step ST1, and a DC offset is detected at step ST2. Thereafter, an initial value is stored in first storing means 47 at step ST3. These processing steps may be carried out when the power supply is turned on. In a case where this method is used, a random access memory (RAM) may be suitably used as the first storing means 47.

In addition, similar to the first initial-value setting method, in a case where a radio section has a plurality of gain modes like conventional receivers and different DC offsets are produced in the respective gain modes, the same operations as the aforementioned operation are repeated times corresponding to the number of the gain modes to allow the DC offsets in the respective gain modes to be stored in the first storing means 47, so that it is possible to effectively remove the offsets.

In the third initial-value setting method, after a predetermined period of time elapses, the contents stored in the first storing means 47 are updated at any time by DC offsets detected by offset detecting means 41 and 42. According to this third method, the initial value can effectively updated even if the DC offset varies with temperature and so forth, so that the deterioration of the receive error rate can be always decreased.

Figure 20:
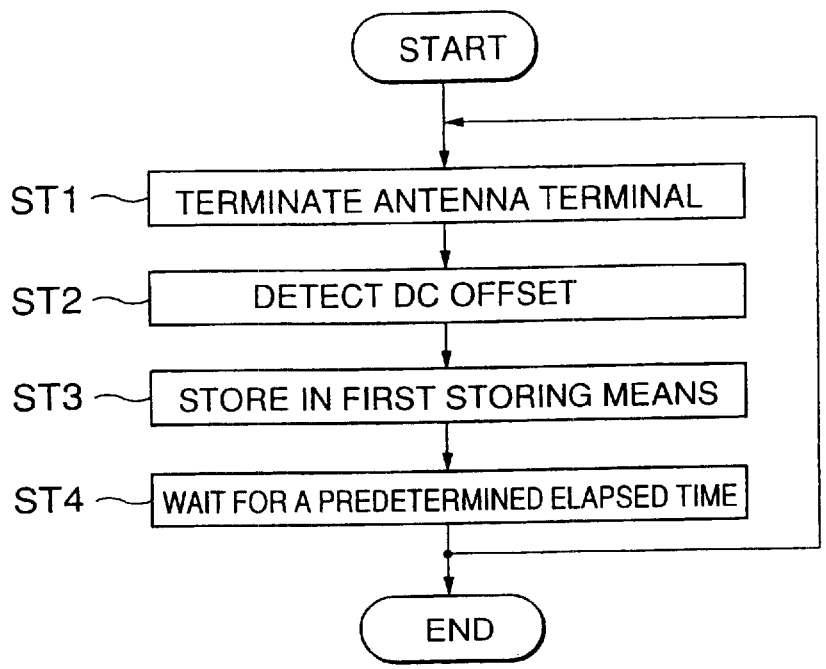
FIG. 20 is a flow chart showing a method for setting a third initial value in the fifth preferred embodiment of a receiver according to the present invention.

Specifically, as shown in FIG. 20, an antenna terminal is terminated at step ST1, and a DC offset is detected at step ST2. Thereafter, an initial value is stored in first storing means 47 at step ST3. Finally, it may be waited at step ST4 that a predetermined period of time elapses. Updated values of DC offsets are held in the first storing means 47 by repeating the aforementioned processing steps, so that it is possible to more accurately set the initial value.

In the forth initial-value setting method, in a case where the values of DC offsets detected by offset detecting means 41 and 42 exceed a predetermined threshold, the initial value stored in first storing means 47 is updated. The DC offset fluctuates with temperature change or secular change. If this fluctuation is within a predetermined range, the DC offset is corrected using the offset value stored in the second storing means 40, so that the deterioration of the receive error rate can be decreased. However, if the fluctuation of DC offset exceeds the predetermined range, the DC offset can not be sufficiently corrected using the second storing means, so that this must be prevented.

Figure 21:
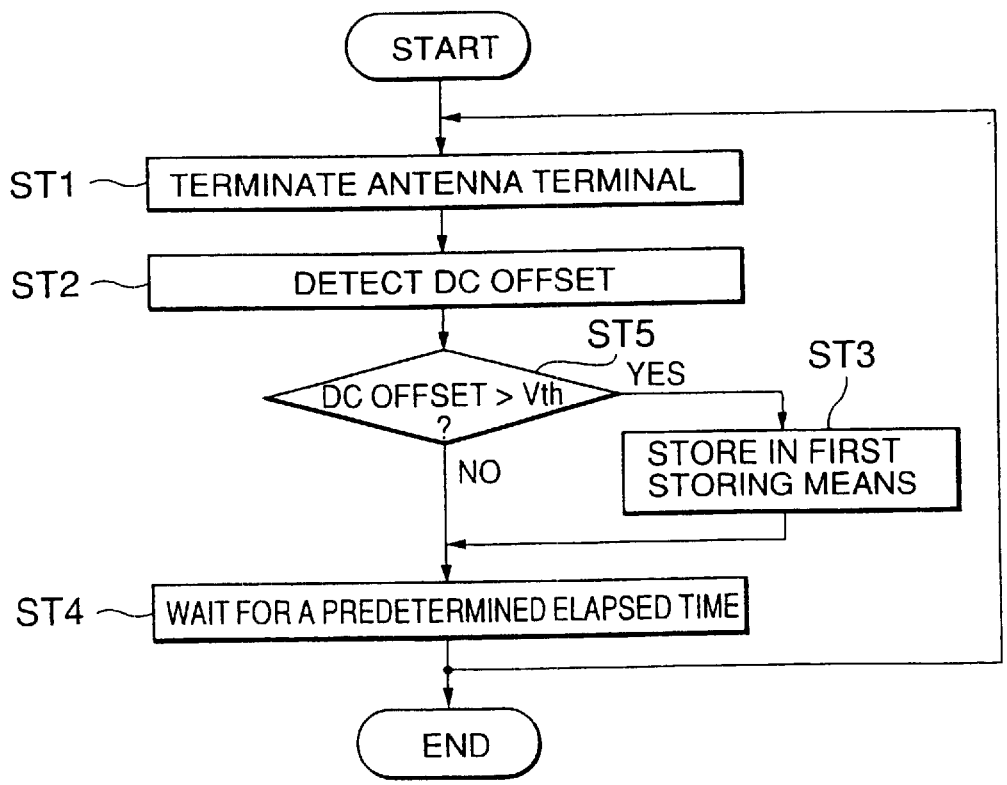
FIG. 21 is a flow chart showing a method for setting a fourth initial value in the fifth preferred embodiment of a receiver according to the present invention.

Referring to FIG. 21, the processing steps of the fourth initial-value setting method will be described. As shown in FIG. 21, an antenna terminal is terminated at step ST1, and a DC offset is detected at step ST2. These steps are the same as those of other initial-value setting methods. After step ST2, it is determined at step ST5 that the DC offset exceeds a predetermined threshold Vth. When it is determined that the DC offset exceeds the predetermined threshold Vth, the routine goes to step ST3 wherein this DC offset is stored as an initial value in first storing means 47. When it is determined that the DC offset does not exceed the predetermined threshold Vth, the routine goes to step ST4 wherein it is waited that a predetermined period of time elapses.

By repeating the aforementioned processing steps, the DC offset value stored in the first storing means 47 is updated if necessary, so that the initial value can be more accurately set.

Figure 22:
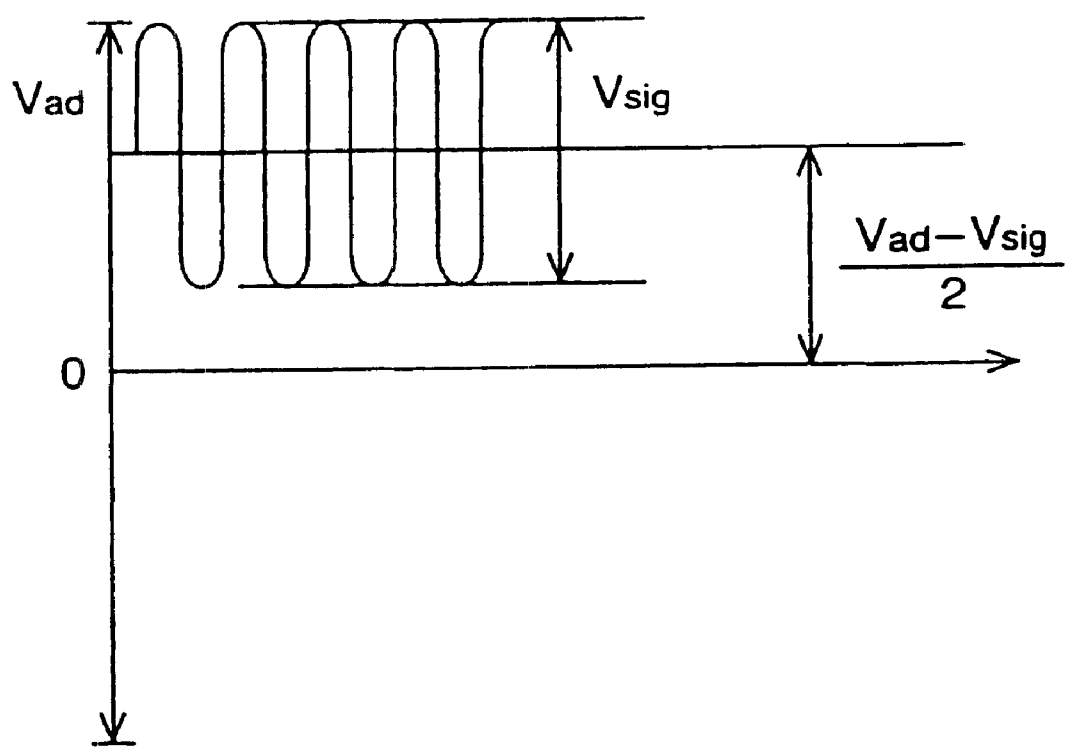
FIG. 22 is a graph explaining how to derive a threshold Vth used for the method for setting the fourth initial value shown in FIG. 21.

Referring to FIG. 22, a method for setting the aforementioned predetermined threshold Vth will be described. It is now assumed that a dynamic range of an A/D converter is Vad and the maximum level of a signal inputted to the A/D converter is Vsig(p-p). In this case, the maximum DC offset, which can be corrected by second offset correcting means, is $^+(Vad-Vsig)/2$. Therefore, if "Vth=(Vad-Vsig)/2-$\alpha$" in view of a predetermined margin $\alpha$.

Using the fifth preferred embodiment of a receiver using the first through fourth initial-value setting methods, the fluctuated part of the offset, which is held in the second storing means 48 and which fluctuates with time, is corrected by the second offset correcting means provided in the digital processing section 40. Because it is required to instantaneously remove the fluctuated part of the offset, which is held in the second storing means 48 and which varies with time, since the varying rate thereof is relatively high. Therefore, it is advantageous that this fluctuated part of the offset is digitally removed by the second offset correcting means since it is most fast. In the second offset correcting means for digitally correcting the offset, the correctable range is generally narrow, in comparison with the first offset correcting means for analogically correcting the offset. However, since the fluctuated part of the offset varying with time is far smaller than the fixedly produced offset, there is no greater problem.

In addition, it is effective that the initial values of the DC offsets with respect to the respective gain modes of the radio section stored in the first storing means 47 are offset-corrected by the first offset correcting means. Because it is effective that the fixed offset value stored in the first storing means is corrected by the first offset correcting means having a wide correctable range since it is far greater than the value of the fluctuated part of the offset stored in the second storing means. Moreover, because the correction of the fixed offset value stored in the first storing means is not changed after it has been set once or changed in a very long cycle even if it is changed, so that there is no problem such a time lag even if it is analogically corrected by the first offset correcting means.

The preferred embodiment of the correction of DC offsets and the gain switching control of the analog signal processing section will be described. In the undermentioned some preferred embodiments, a DC offset is detected with respect to each of a plurality of gains of a receiver, and the detected DC offset is stored in a memory, so that the DC offset is optimally corrected in each of the states.

Figure 23:
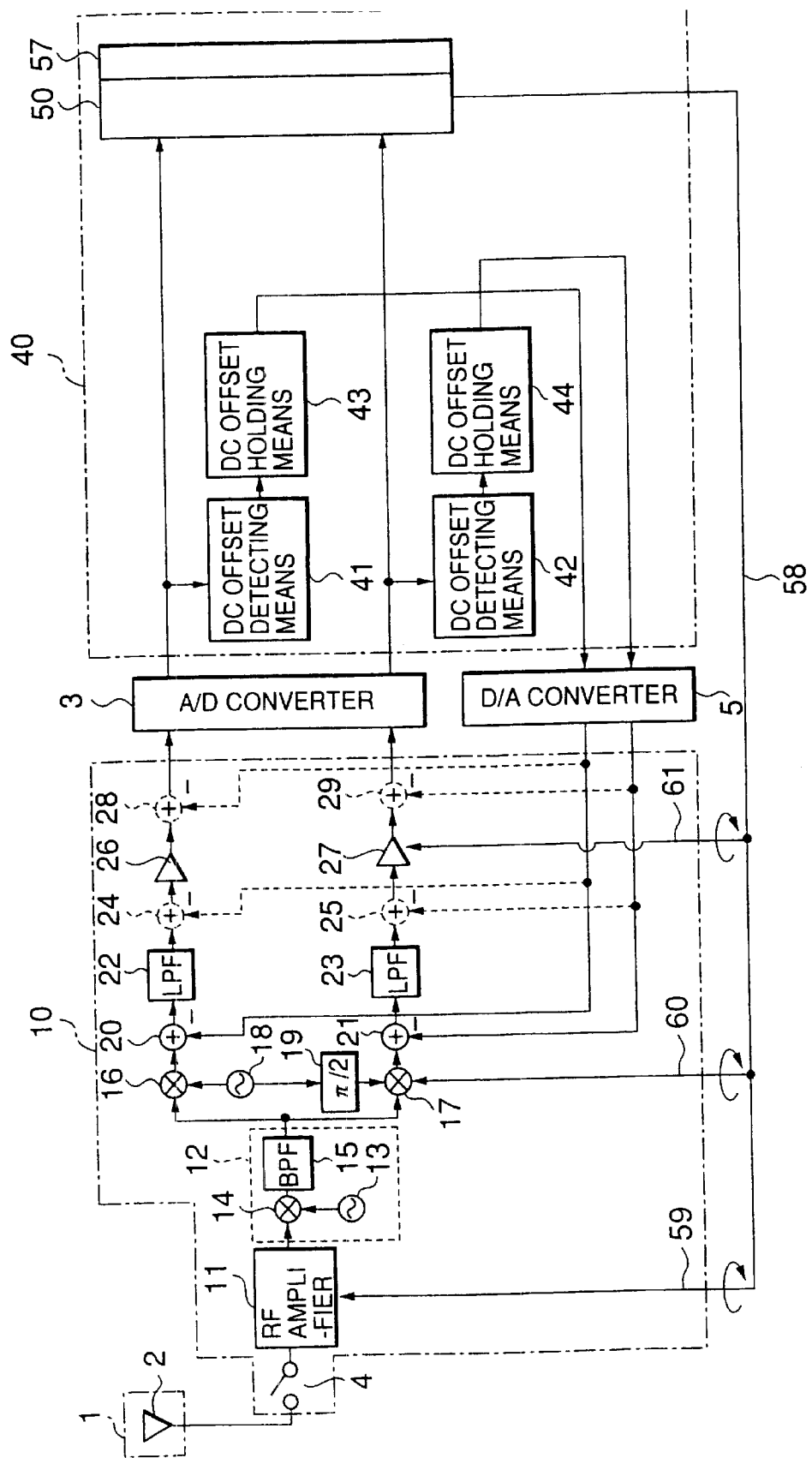
FIG. 23 is a block diagram of a basic construction of the sixth preferred embodiment of a receiver according to the present invention.

FIG. 23 is a block diagram of the sixth preferred embodiment of a receiver according to the present invention. The basis construction of the sixth preferred embodiment of the receiver is substantially the same as that of the first preferred embodiment shown in FIG. 11. Therefore, in FIG. 23, the same reference numbers are used for the same elements, and the descriptions therefor are omitted. The receiver in this preferred embodiment is different from that in the first preferred embodiment at the following points. That is, a switch 4 is provided at a location at which an analog signal processing section 10 receives a radio frequency signal from an antenna 2 of a receiving section 1, and received field intensity detecting means 57 is provided for detecting a received field intensity, so that a gain switching control signal 58 is outputted to the analog signal processing section on the basis of a field intensity detected by the field intensity detecting means 57. Specifically, a RF-amplifier gain switching control signal 59 is supplied to a RF amplifier 11, a mixer gain switching control signal 60 is supplied to the orthogonal demodulating sections of mixers 16 and 17, and the amplifier gain switching control signals 61 are supplied to base band amplifiers 26 and 27 for amplifying analog signals of a base frequency.

With this construction, the operation of the sixth preferred embodiment of a receiver according to the present invention will be described below.

A high-frequency signal transmitted from a radio base station is received by an antenna 2 to be low-noise amplified by means of the RF amplifier 11 via the switch 4. The gain of the RF amplifier 11 can be changed by the switching control signal 59 supplied from the digital signal processing section 40. The high-frequency signal amplified by the RF amplifier 11 is mixed, by means of a mixer 14, with a reference carrier signal supplied from a local oscillator 13 in a frequency converter 12. Thereafter, undesired components are removed from the mixed signal by means of a BPF 15, and the resulting signal is converted into an intermediate frequency signal. The output thereof is divided into two lines of an in-phase component and an orthogonal component. The in-phase component and the orthogonal component, which are divided into two lines, are frequency-converted into base frequencies by means of the mixers 16 and 17, respectively. Since the operation of the orthogonal demodulating section is the same as that of the receiver in the first preferred embodiment, the repeated descriptions are omitted. Furthermore, the mixer gain switching control signals 60 are supplied to the mixers 16 and 17 by means of the digital signal processing section 40. The DC offset components are removed by the first offset correcting means 20 and 21 downstream of the mixers 16 and 17, respectively. The constructions and operations thereof are the same as those of the receiver in the first preferred embodiment.

The desired signals frequency-converted into base bands by means of the mixers 16 and 17 are inputted to LPFs 22 and 23. The LPFs 22 and 23 are provided for fulfilling the channel selecting function of removing undesired waves other than desired waves and adjacent channel waves and for fulfilling the anti-area fading function upstream of the A/D converter 3. The amplifiers 26 and 27 provided downstream of the LPFs 22 and 23 are variable gain amplifiers for supplying desired waves to the downstream A/D converter 3 at a desired voltage level. Furthermore, the gains of the variable gain amplifiers 26 and 27 are variably controlled by the amplifier gain switching control signal 61 supplied from the digital signal processing section 40. Therefore, when the dynamic range of the A/D converter 3 is sufficiently wide, the amplifiers 26 and 27 can be omitted.

Furthermore, in FIG. 23, while the mixer 13 of the frequency converter 12 has been formed so as to have no gain variable function, the present invention should not be limited thereto, but the mixer 13 may be formed so as to have a gain variable function. In addition, in the sixth preferred embodiment of a receiver shown in FIG. 23, while the frequency converter 12 has been provided, it is sufficient, in theory, for the receiver of the present invention to have the orthogonal demodulating section (the mixers 22 and 23) having two channels for the in-phase component (I) and the orthogonal component (Q). The frequency converter 12 and the amplifiers 26 and 27 are provided for delivering output signals of the LPFs 22 and 23 having sufficient amplitudes to the A/D converter 3. Therefore, in a case where the A/D converter 3 is, e.g., a multi-bit converter, and the amplifiers 26 and 27 may be omitted according to the present invention.

Figure 24:
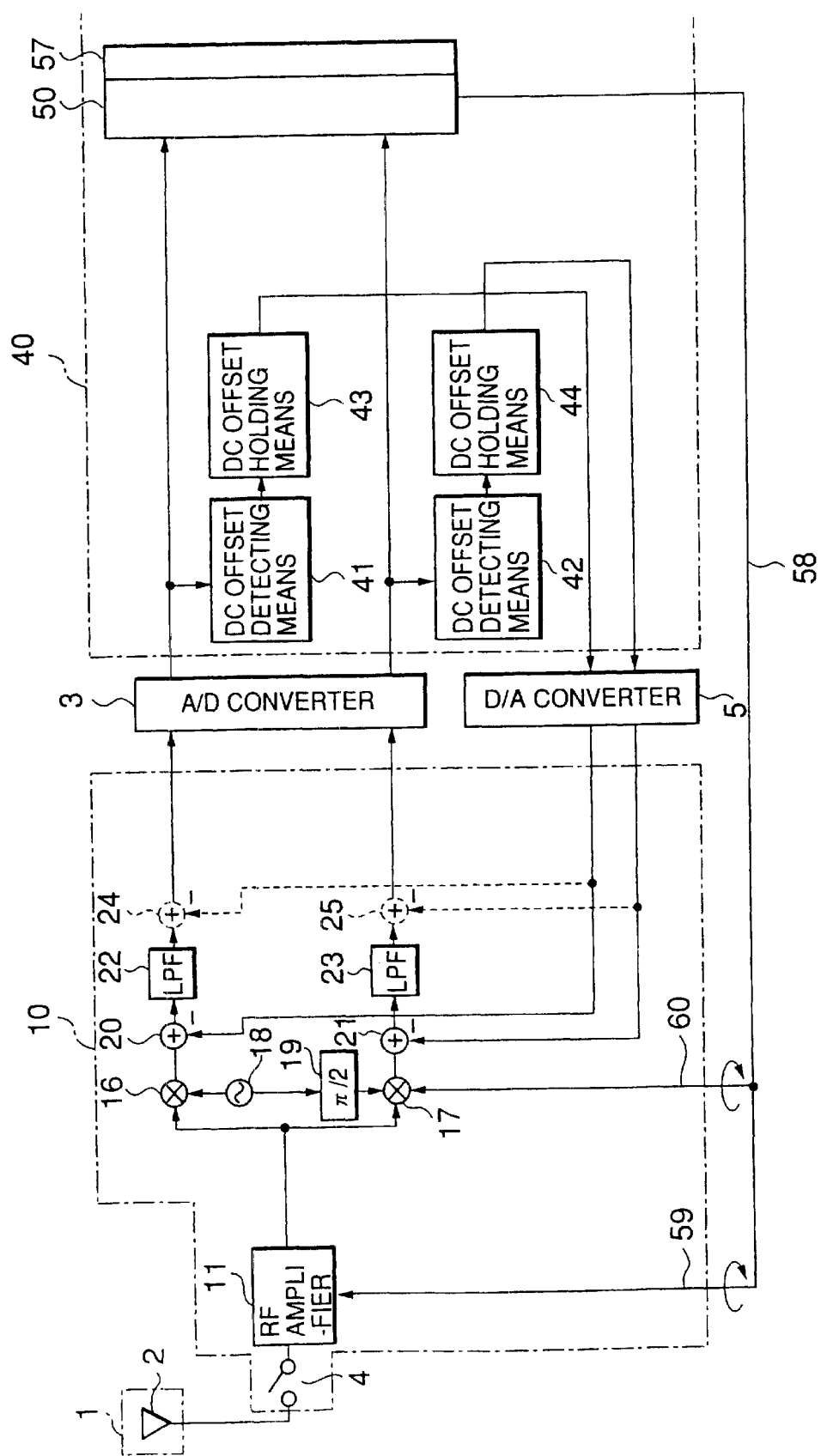
FIG. 24 is a block diagram of a basic construction of the seventh preferred embodiment of a receiver according to the present invention.
Figure 25A:
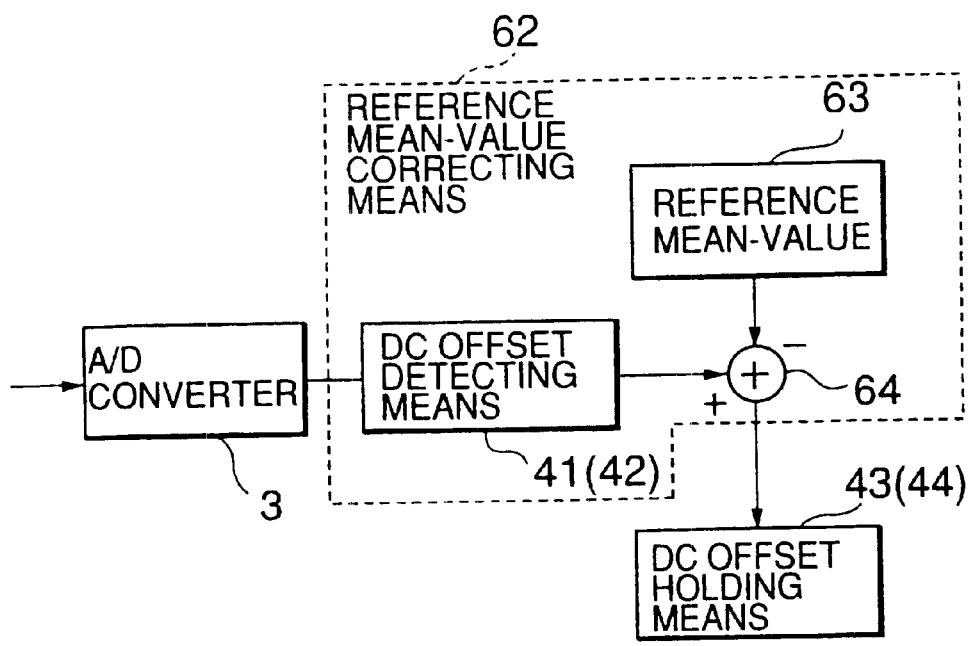
FIGS. 25A and 25B are block diagrams of two embodiments of a reference mean value correcting circuit in the seventh preferred embodiment.
Figure 25B:
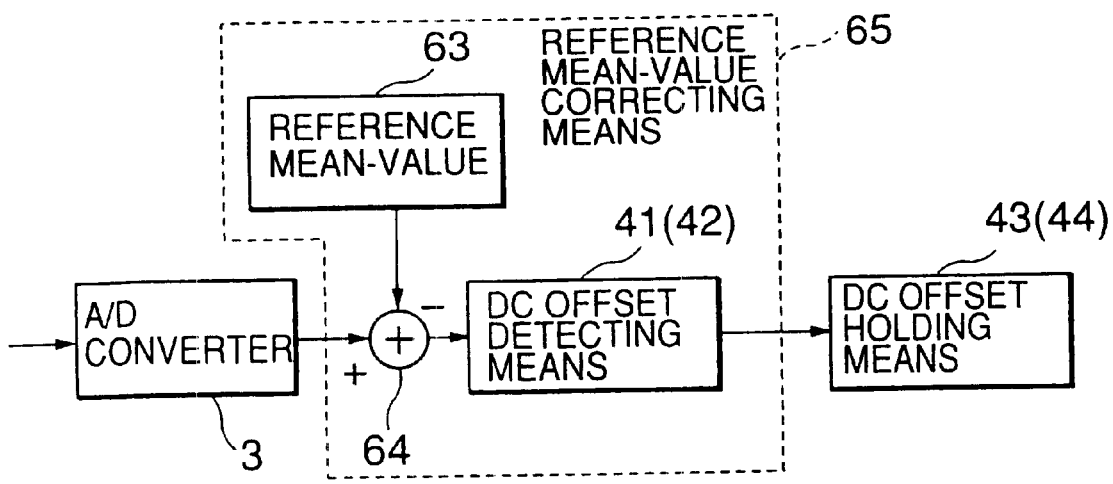

The foregoing can be accomplished by the seventh preferred embodiment of a receiver shown in FIG. 24, according to the present invention. In FIG. 24, the frequency converter 12 and the gain variable amplifiers 26 and 27 are omitted as mentioned above. In addition, the DC offset detecting means 41 and 42 and the DC offset holding means 43 and 44 provided in the digital signal processing section 40 are formed as shown in FIGS. 25A and 25B. That is, in FIG. 25A illustrating a first embodiment, a reference mean-value correcting circuit 62 is added. The reference mean-value correcting circuit 62 comprises a reference mean-value holding section 63 and an adder 64. The mean value held in the holding section 63 is a DC component which is essentially contained in a modulating signal. In this case, if DC offset is uniformly corrected, the essential DC component is also removed. Therefore, in a case where the DC component of the modulation system used for the system is known, the reference mean value of the DC component is prepared, and this reference means value is subtracted from the DC offset derived by the DC offset detecting means 41 (or 42) to derive an exact DC offset, which is held in the DC offset holding means 43 (or 44). Furthermore, as shown in FIG. 25B illustrating a second embodiment, a reference mean-value correcting circuit 65 may be provided for detecting a DC offset after subtracting a reference mean value from a base frequency signal inputted from the A/D converter 3.

Referring to a flow chart for a receiver of FIG. 24, the operation procedure of the seventh preferred embodiment of a receiver according to the present invention will be described in detail below.

Figure 27:
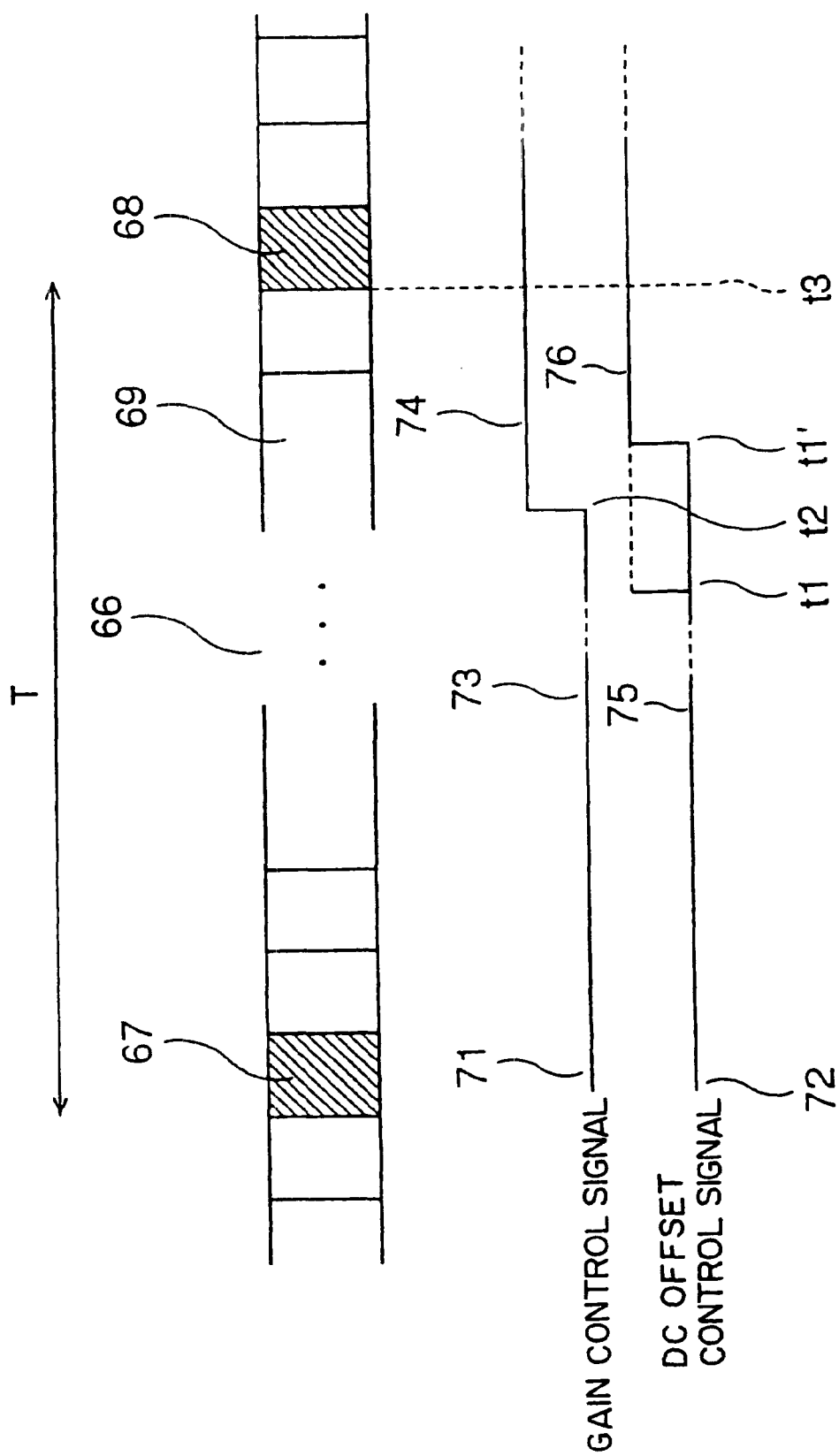
FIG. 27 is a conceptual view showing a TDMA slot applied to a communication system according to the present invention.

It is supposed that the gain switching modes of a receiving section are four receive modes shown in FIG. 26. In FIG. 26, it is supposed that the gains of the RF amplifier 11 are two modes of 10 dB and −30 dB and the gains of the mixers 16 and 17 are two modes of 20 dB and 0 dB so that the total numbers of modes is four. Furthermore, with respect to the receiver of FIG. 23, the basis operation procedure is the same as the operation procedure which will be described later, except that the gain switching control (control signal 61) for the amplifiers 26 and 27 is performed. The receiver of the present invention is preferably applied to a TDMA system as shown in FIG. 27. It is supposed hereinafter that the operations of receiving only received time slots 57 and 68 assigned to their terminals are repeated in a TDMA frame 66 in a period T shown in FIG. 27.

The receiver of the present invention is characterized in that a DC offset produced for the respective receive modes of the analog signal processing section 2 is previously supposed and held, and that the DC offset is read in the respective receive modes to be corrected.

Referring to a flow chart of FIG. 28, the operation procedure for detecting a DC offset to store a correction value of the DC offset in the DC offset holding means 43 and 44 of FIG. 24 will be described.

Figure 28:
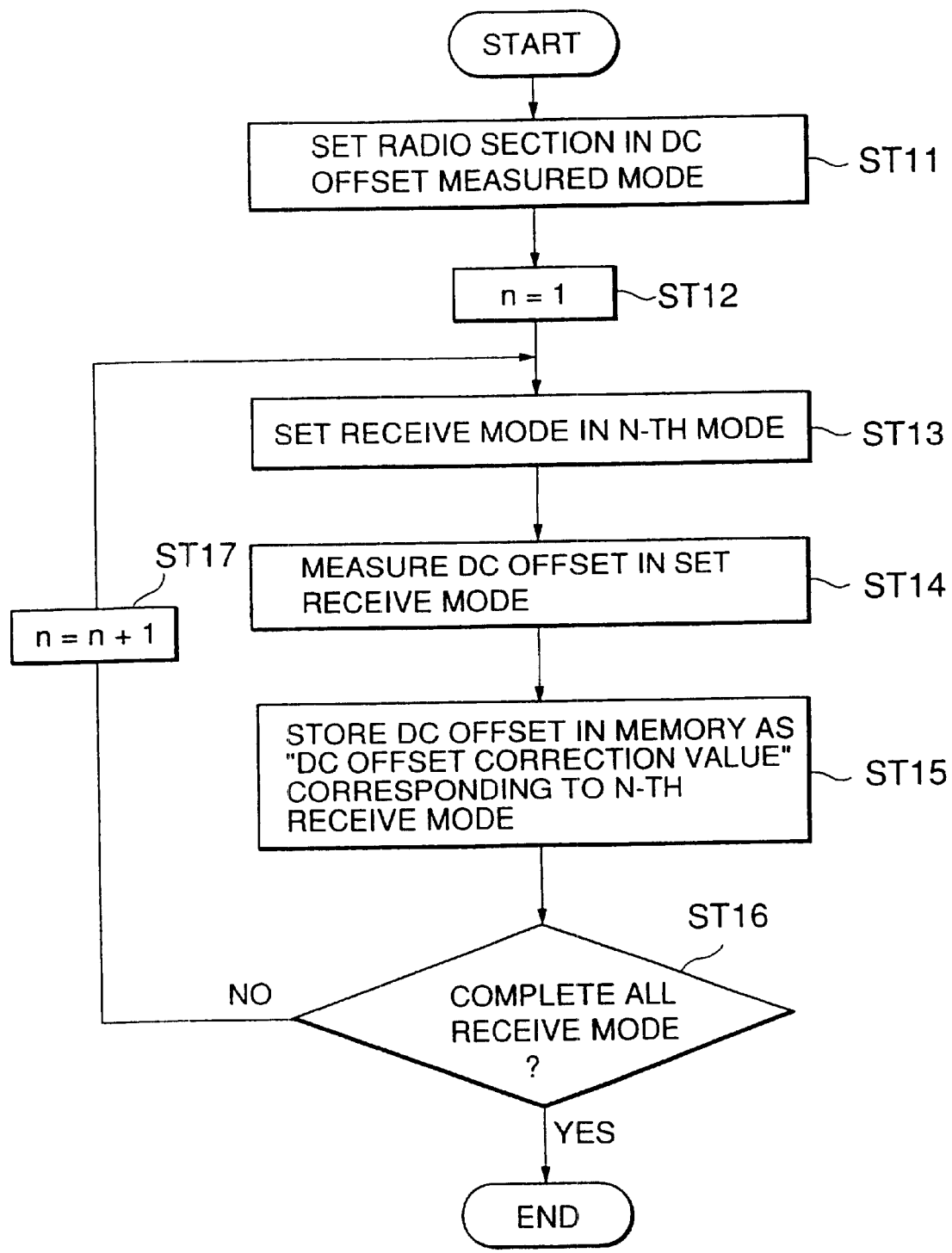
FIG. 28 is a flow chart showing an operation procedure for holding an offset correction value.

In the flow chart of FIG. 28, first, the analog signal processing section 10 is set so that a DC offset can be measured (ST11). In order to measure the DC offset produced in the analog signal processing section 10 of FIG. 24 by a unit, it is required to prevent external signals from being inputted from the signal input section 1. Therefore, for example, a high-frequency switch 4 for blocking the input of the signal input section 1 may be provided downstream of the antenna 2 so that the switch 4 is turned off when the DC offset is measured. The high-frequency switch 4 is also used as a send-receive switch in, e.g., a receiver for a TDMA/ TDD system. In addition, the analog signal processing section 10 is in a receive state in order to measure a DC offset produced in an actual operation state. That is, in a case where the respective circuits of the analog signal processing section 10 have a battery saving function (not shown), it is canceled, and the local oscillator 18 is also set to be in an operation state so that reference carrier signals are outputted to the mixers 16 and 17.

Then, n is used as a receive mode, and an initial value "1" is set (ST12). In a case where n=1~4 correspond to the receive modes A to D of FIG. 26, n=1 is mode A, so that the RF amplifier 12 is set to be 10 dB and the mixer 16 is set to be 20 dB (ST13). In this state wherein the analog signal processing section 10 is set to be mode A, the DC offset produced in the output of the analog signal processing section 2 is detected by the DC offset detecting means 41 (or 42) having the aforementioned construction shown in FIG. 25A (ST14). The detected DC offset value is stored in the DC offset holding means 43 and 44 as a "DC offset correction value" in a case where the analog signal processing section 10 is set to be mode A (ST15). Subsequently, the DC offset value produced in the analog signal processing section 10 in the case of n=2, i.e., in the case of the receive mode B (ST17), is measured to be stored in the DC offset holding means 43 and 44.

Finally, the DC offset value in the case of n=4 (receive mode D) is measured to be stored in the DC offset holding means 43 and 44, and the process is completed (ST16). Therefore, the DC offset values (=DC offset correction values) corresponding to the receive modes A to D can be derived. These DC offsets are shown as A to D in the rightmost column of FIG. 26. In the DC offset holding means 43 shown in FIGS. 23 and 24, the measured DC offset values are stored and held in the form of FIG. 26. Furthermore, the measuring order to the respective receive modes when measuring the DC offsets can be optionally set.

Figure 29:
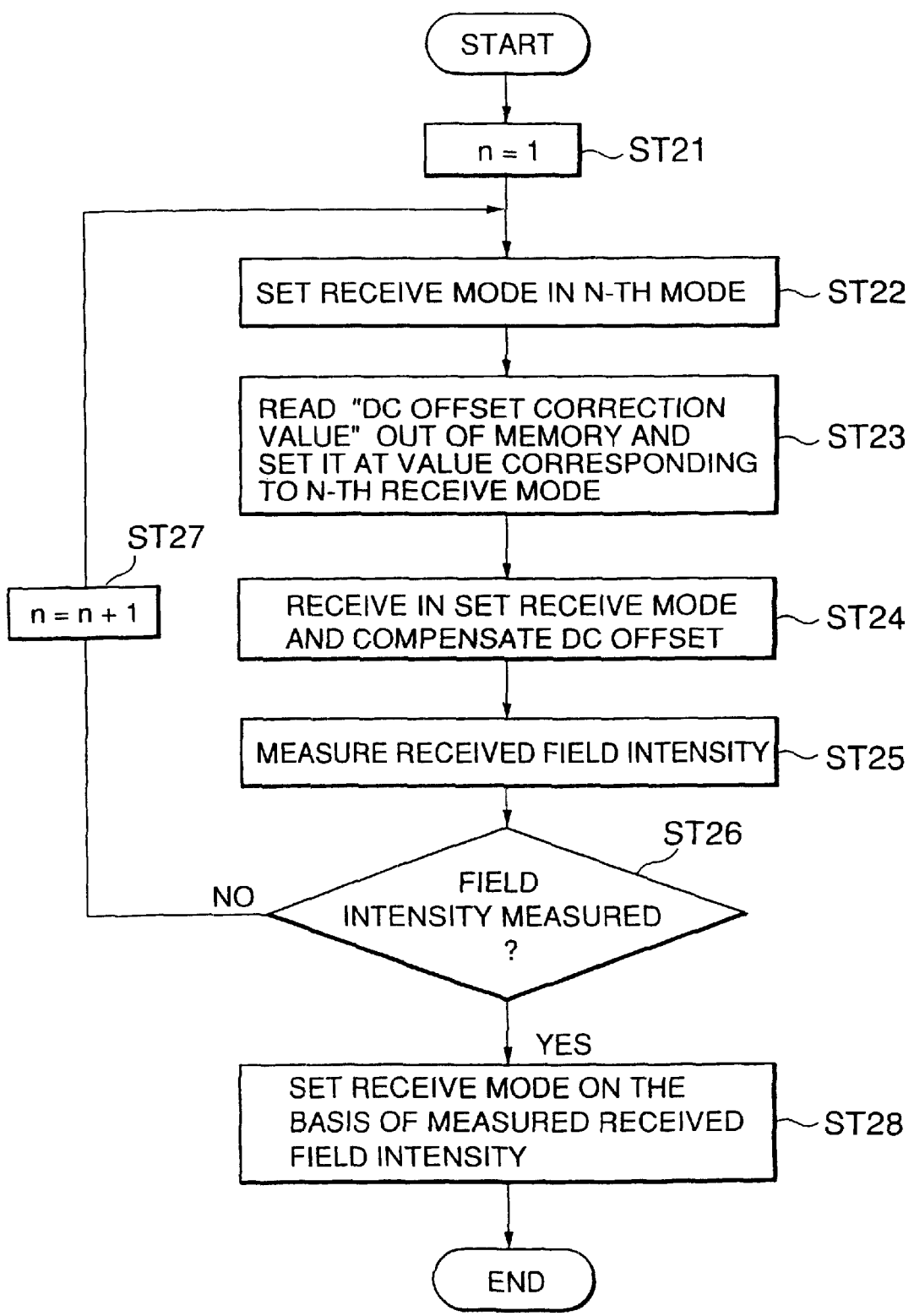
FIG. 29 is a flow chart showing an operation procedure for setting a receive mode of a receiver.

Referring to FIGS. 24 and 29, in the seventh preferred embodiment of a receiving using a DC offset correction according to the present invention, the procedures for selecting and setting receive modes will be described below. FIG. 29 is a flow chart showing the operation procedure for setting a gain, i.e., a receive mode, of the receiving section, which is optimum to the receiver. In a case where the gain of a receiver is initialized, there is no information about received signal levels. Therefore, when the signal level is extremely great or extremely small, there is a problem in that the received field intensity can not be measured so that the gain of the receiver can not be set.

In the operation procedure of FIG. 29, the receiver sets optimum gains for the respective circuits of the analog signal processing section 10 while measuring the received field intensity. In this operation, four receive modes comprising modes A to D shown in FIG. 26 are supposed, and the receive modes A to D corresponding to n−1~4 will be described. According to FIG. 29, first, the gains of the respective circuits of the analog signal processing section 10 are set to be the receive mode A at n=1 (ST21, ST22). Thereafter, as the DC offset correction values, the values corresponding to the receive mode A (A in FIG. 26) are read out of the DC offset holding means 43 and 44 to be outputted to the first offset correction means 24 and 25 to set the DC offset correction (ST23). In this state, an incoming signal is received (ST24), and the received field intensity is measured in the received field intensity detecting circuit 57 (ST25). The operation step ST25 will be described later.

Then, while the pure mode is sequentially set (ST12, ST12), when a ratio D/N (C: signal strength, N: receiver thermal noise) at which the received field intensity can be detected (ST16) is obtained, the optimum receive mode for receiving an input signal level is set (ST28). The receive mode may be sequentially set from a mode having a great gain to a mode having a small gain (from mode A to mode D) shown in FIG. 26, and it may be set in the opposite order. In addition, in a case where it is required to set the optimum receive mode at a high speed, it is not required to always set it one by one, but it may be set every two or some.

Figure 30:
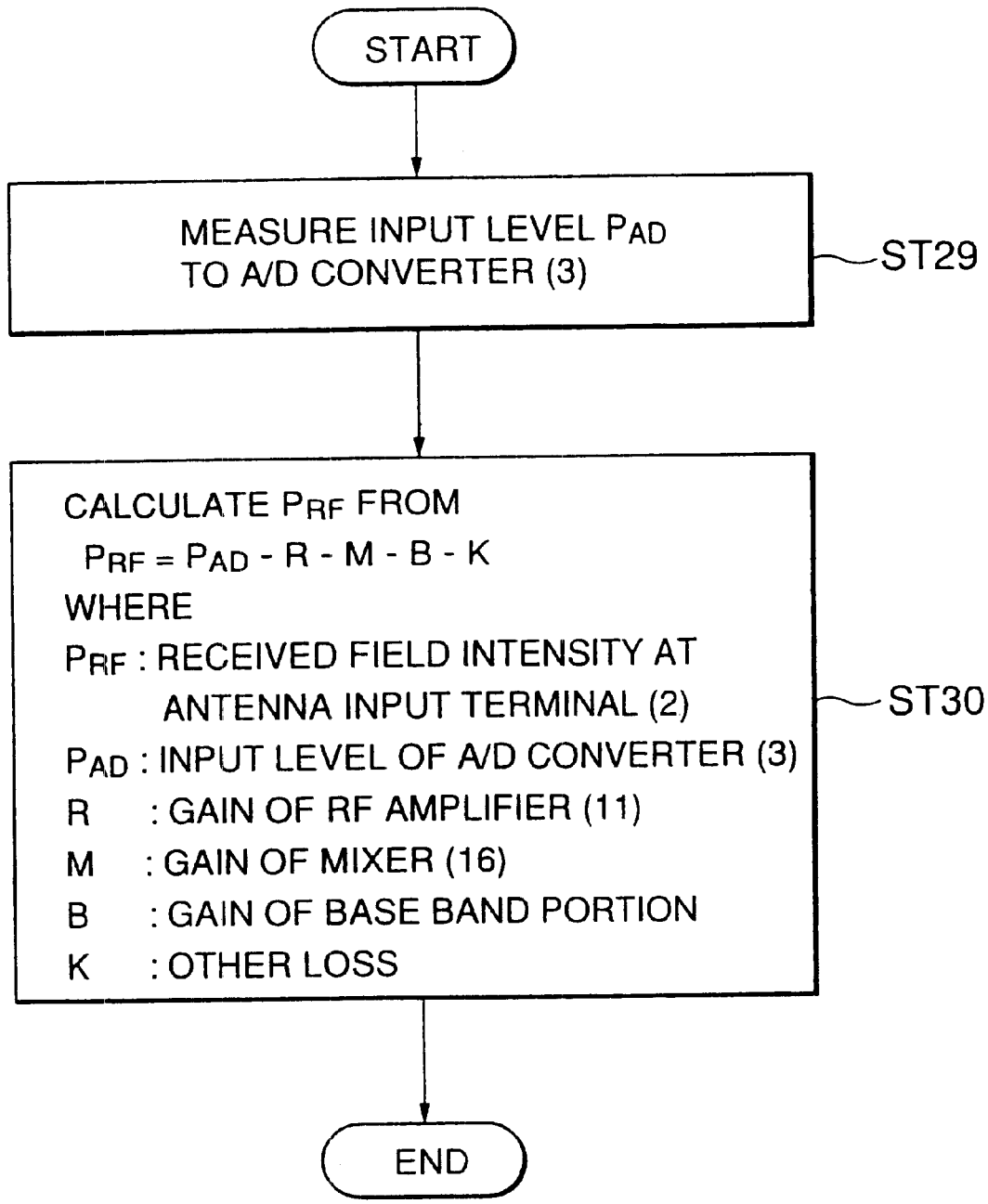
FIG. 30 is a flow chart showing an operation procedure for measuring a received field intensity.

Referring to FIG. 30, a method for detecting a received field intensity at step ST25 of FIG. 29 will be described. FIG. 30 shows the operation procedure for measuring a field intensity. In the receiver of the present invention, in order to set the gain of the analog signal processing section 2 at an optimum value, it is required to measure an absolute value of a received field intensity at the input terminal of the antenna 2, in the receiver having the orthogonal demodulating section shown in FIGS. 23 and 24, a signal voltage inputted to the A/D converter 3 can be calculated by a digital operation in the received field intensity detecting circuit 57. This operation can be easily achieved by, e.g., deriving a root of the sum of squares of the respective IQ channels.

Therefore, the received field intensity (PRF) at the input terminal of the antenna can be calculated by deriving a signal voltage level (PAD) in the received field intensity detecting circuit 57 (ST29 in FIG. 30) and by subtracting all the gains of the analog signal processing section 2 from the derived signal voltage level. That is, the gain (R) of the RF amplifier 11, the gain (M) of the mixer 16, and the gain (B) of the base band section such as the LPF 22 and the amplifier 26 may be subtracted from the PAD. Furthermore, although the gains of the respective circuits of the analog signal processing section 10 are sequentially updated for each of the received time slots 67 and 68 assigned to their terminals shown in FIG. 27, the values of the gains set to the respective circuits may be stored in a memory or the like every time.

Figure 31:
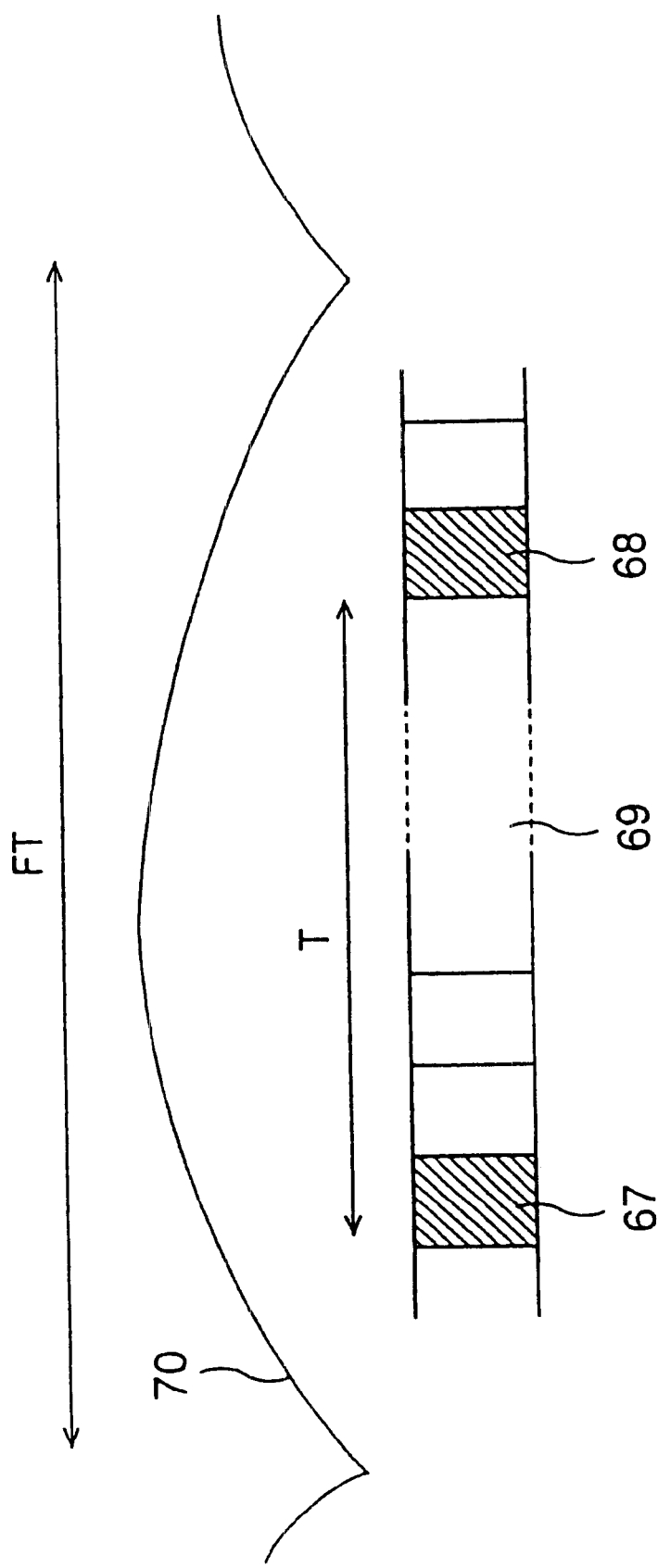
FIG. 31 is a conceptual view illustrating a frame construction in a TDMA or TDD system.

The receive operation procedure during a call by the receiver of the present invention, to which the aforementioned detection of DC offsets, selection of receive modes and measurement of received field intensity are applied, will be described below. This receive operation procedure is effective particularly when the receiver of the present invention is applied to a TDMA or TDD system. Therefore, first, the construction of a frame of a system using this receive operation procedure will be described. FIG. 31 shows the construction of a frame in a TDMA or TDD system. In FIG. 31, T denotes a frame length, and reference numbers 67 and 68 denote received time slots assigned to their terminals.

Now, in a case where the received time slot 68 is received, the receive mode is set on the basis of the received field intensity detected by the last frame 67 until the slot 68 is received. That is, the received field intensity of the next slot 68 is predicted on the basis of the received field intensity derived by the slot 67 to set the receive mode of the analog signal processing section 10. This is based on the fact that the received field intensity of the received slot 68 of the next frame can be predicted on the basis of the received field intensity of the received slot 67 of the last frame to some extend if the fading period FT determined by the fluctuation of the received field intensity 70 during the fading is far longer than one frame length T.

Figure 32:
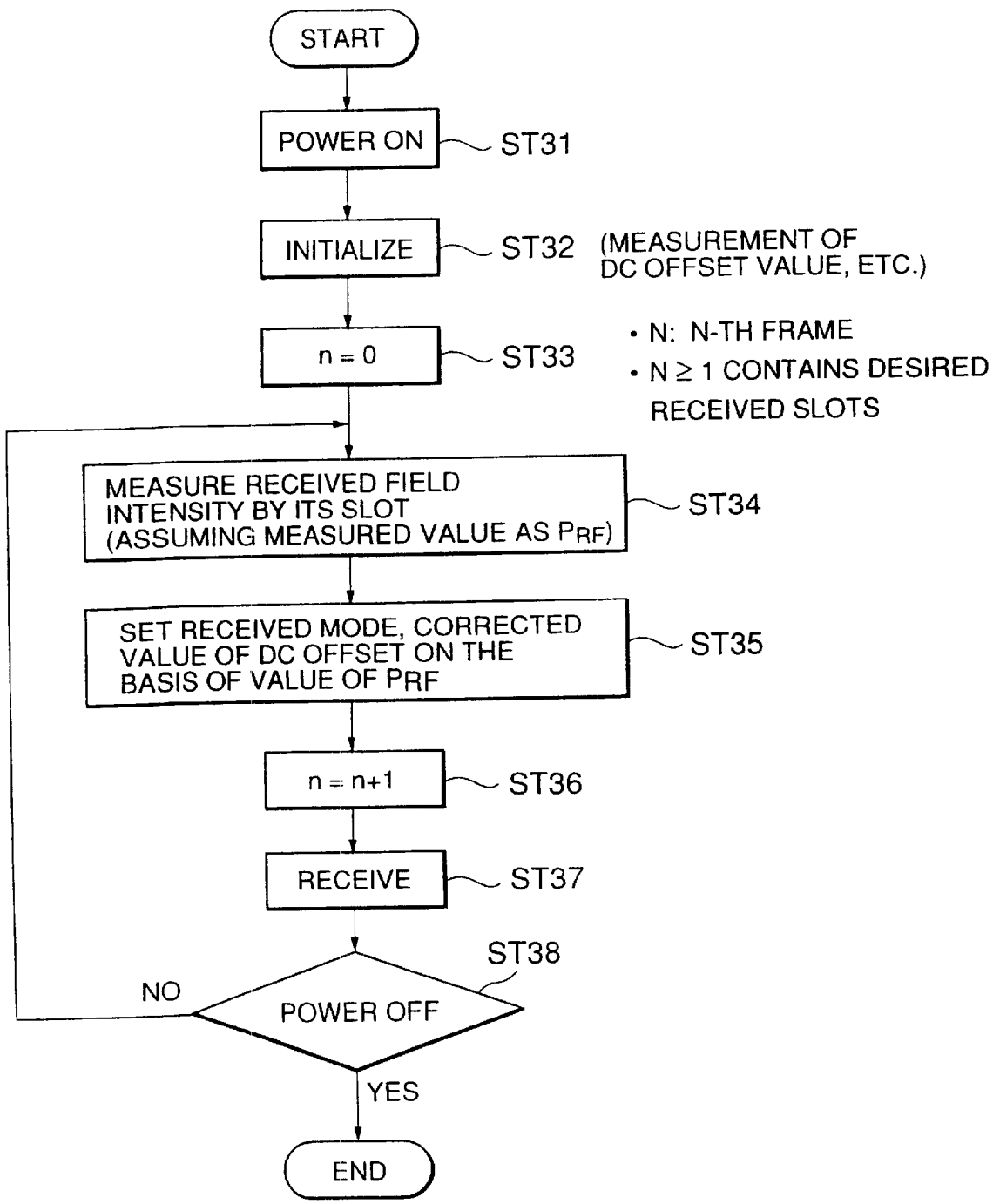
FIG. 32 is a flow chart showing basic receive operation steps when a call is performed by a receiver.

Referring to FIG. 32, the receive operation procedure will be described in detail below.

FIG. 32 is a flow chart showing basis receive operation procedure during a call by a receiver of the present invention. It is now assumed that the received slot of FIG. 31 is received. After the power supply is turned on (ST31), the receiver is initialized (ST32) to measure a DC offset (FIG. 28) and to set a gain of the analog signal processing section 10 (FIG. 29), so that the receiver is in a receivable state. Thereafter, the received field intensity PRF is measured in the receive slot 67 (ST33, ST34). A receive mode for receiving the next slot 68 is set on the basis of the received field intensity of the receive slot 67, and a DC offset correction value corresponding to the set receive mode is read out of the DC offset holding means 43 and 44 to be set. Then, a desired slot 68 of the last frame (ST36) is received (ST37). In the seventh preferred embodiment, it is assumed that the received field intensity is substantially constant in one slot 68 and that the set receive mode is fixed during receiving the slot 68.

Furthermore, the DC offsets produced in the respective circuits of the analog signal processing circuit 10 delicately fluctuate by elapsed time, the temperature characteristic of the circuit and so forth even if they have the same pure mode. In this case, it is required to detect the DC offsets in a time zone other than the initial set (ST32) immediately after the power supply is turned on (ST31) and to update the contents of the DC offset holding means 43. The time required to detect the DC offsets other than when the power supply is turned on must be a time zone other than a desired received slot. For example, for a period of time other than when a desired slot is received in the battery saving mode, the DC offset may be detected every a predetermined period of time or every frame.

Referring FIG. 27, the relationship between the gain control signal outputted from the digital signal processing circuit 40 to the analog signal processing section 10 and the timing of the DC offset control signal will be described below. In FIG. 27, reference number 71 denotes a gain control signal for setting a receive move of the analog signal processing section 10, and reference number 72 denotes a control signal for correcting a DC offset. The received slot 67 is received in a receive mode corresponding to a control signal value 73, and the DC offset control corresponding to this receive mode is carried out by a control signal 75. In addition, the received slot 68 is received in a receive mode corresponding to the control signal value 75, and the DC offset control corresponding to this receive mode is carried out by a control signal 76. In this receiver, the receive mode is determined on the basis of the received field intensity measured by the last receive mode. Therefore, the gain control signal 71 setting the receive move is switched from the control signal value 73 in the received slot 67 to the control signal value 74 at a timing t2 before the next received slot 68. In this case, t2 may be before a received slot starting time t3. On the other hand, the DC offset control signal 72 for correcting the DC offset in the analog signal processing section 10 is also switched from 75 to 76. This switching timing t1' may be basically before the starting time t3 of the next received slot 68. Therefore, if there is no malfunction of the circuit in the analog signal processing section 10 by switching the control signal 72 from 75 to 76, it may be switched at any one of t1 and t1' in spite of the gain switching timing t2 of the gain control signal 71.

Figure 33:
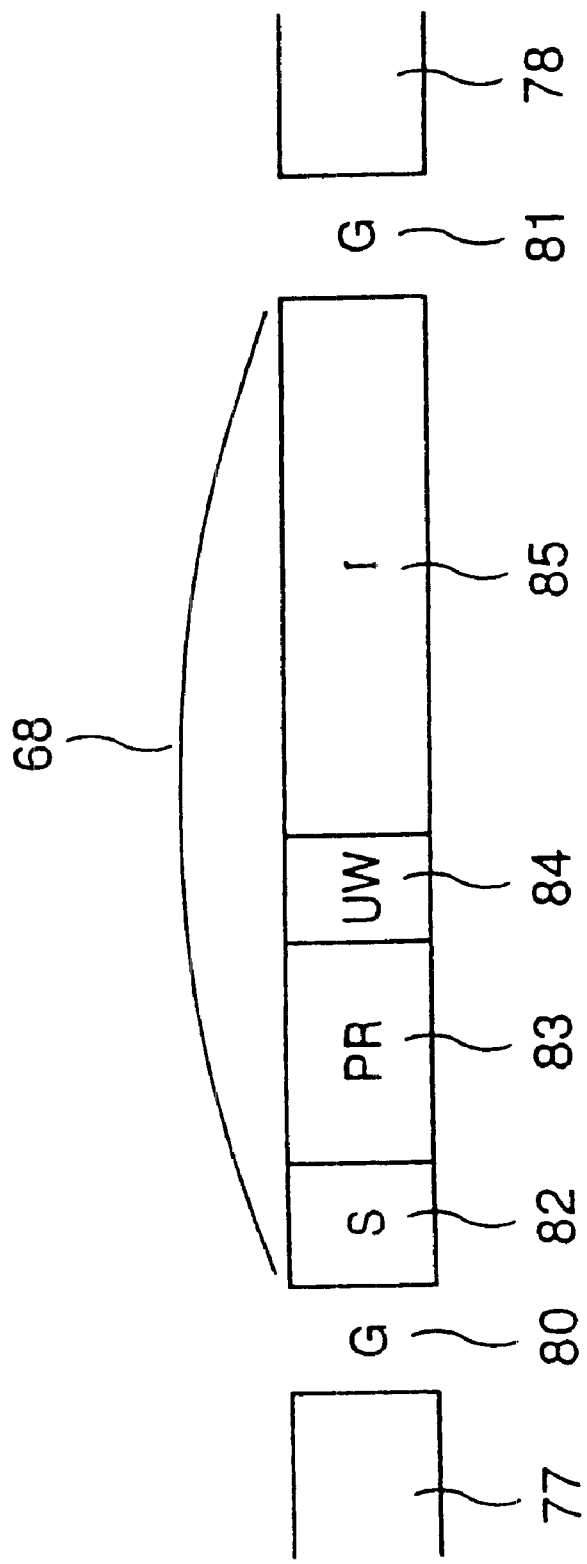
FIG. 33 is a conceptual view illustrating a general construction of a received slot.

The receive operation steps described using FIG. 32 are steps for setting a receive mode of the subsequent received slot on the basis of the received field intensity of the preceding received slot 67 of the received frame of FIG. 27. However, in practice, the receive mode when the slot 68 is received is preferably determined and set by the received field intensity when a desired receive slot 60 is received. This method will be described below. First, the general construction of the received slot 68 is shown in FIG. 33. In FIG. 33, the slot 68 is a desired received slot, reference numbers 77 and 78 denote adjacent slots, and reference numbers 80 and 81 denote guard times. The slot 76 comprises a start symbol 82, a preamble 83, a unique word 84 and an information portion 85. If the received field intensity can be measured in the zone of the preamble 83, a proper receive mode for receiving the information portion 85 in this slot can be set on the basis of the information about the measured received field intensity.

Figure 34:
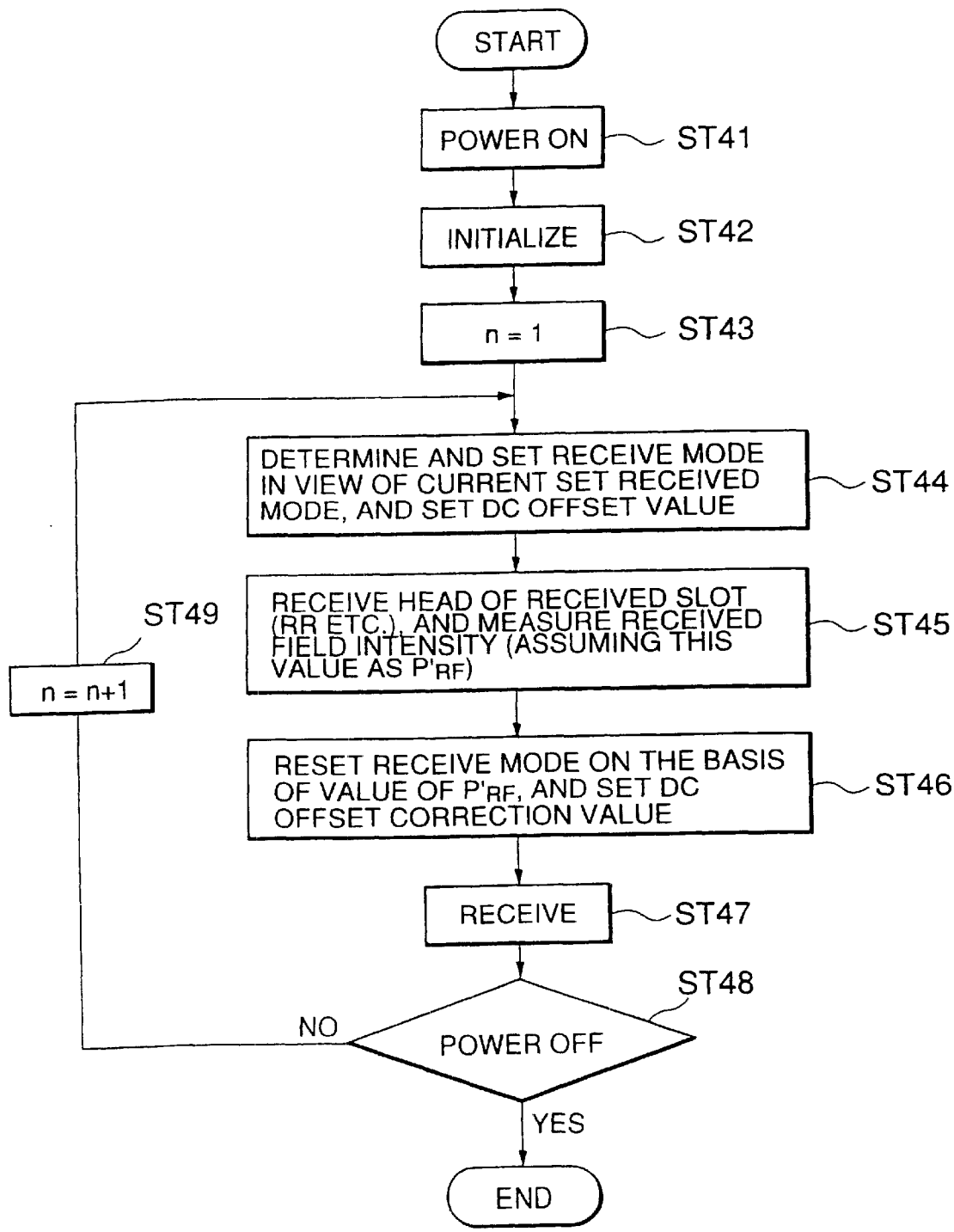
FIG. 34 is a flow chart showing a receive operation procedure for simultaneously carrying out the setting of a receive mode and the correction of an offset.

Referring to FIG. 34, an operation procedure for measuring the received field intensity in a desired received slot 68 and for carrying out the set of a receive mode and the correction of a DC offset to receive the information portion 85 will be described below.

In FIG. 34, the operations of the turning ON of the power supply (ST41) and the initialization (ST42) are the same as those in FIG. 32. Unlike FIG. 32, n−1 shows that the desired received slot 67 has been received at the present time. At this time, the receive mode of the analog signal processing section 10 is a receive mode set by the initialization (ST42), and the DC offset correction corresponding to this receive mode is carried out (ST44). Then, the received field intensity PRF' in the received slot received at the present time is measured (ST85) using the head portion of the received slot 67 (e.g., the preamble 83 in FIG. 33). On the basis of this PRF', the optimum receive mode is measured, and the DC offset correction value corresponding to this receive mode is read out of the DC offset holding means 43 and 44 to be set (ST46).

Thereafter, the received slots after the preamble 83 are received (ST57). After the subsequent frame (N≧2; ST49), it is effective that the initial value of the receive mode to be set by the received field intensity measurement (ST45) is set to be a receive mode used when the last frame (n=1) is received. For example, in a case where the receive mode B of FIG. 26 is received at n=1, the receive mode B may be used as an initial value of the received field intensity measurement at n=2 (ST45). Alternatively, in order to prevent the saturation of the A/D converter 3 when the received field intensity is measured at n=2 (ST45), a receive mode having a smaller gain than n=1 by one rank may be used as an initial value.

According to the aforementioned receive operation procedure, even if a DC offset is produced in the analog signal processing section 10, it is possible to achieve a good receive characteristic which is not under the influence of the DC offset.

Figure 35:
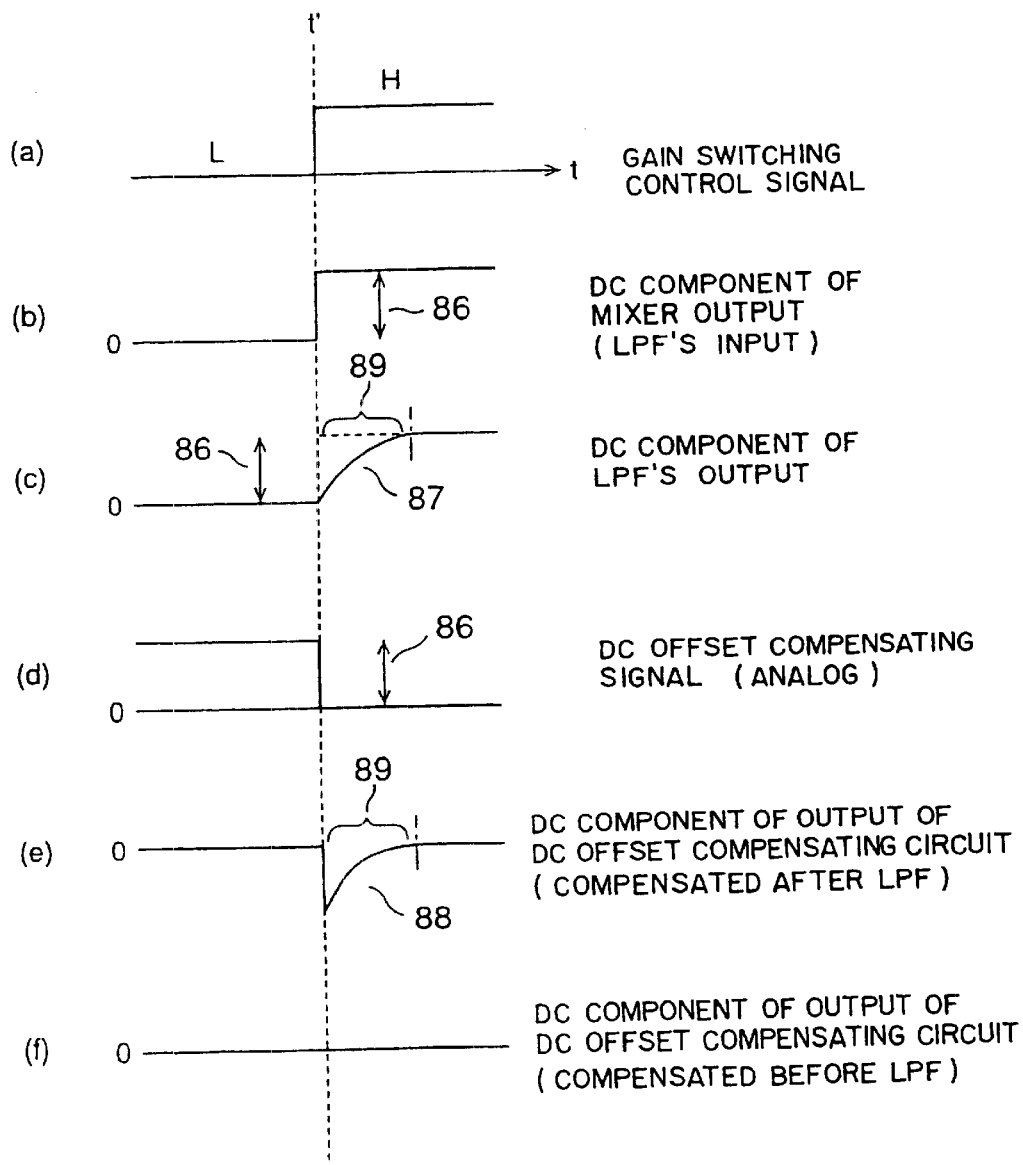
FIGS. 35A through 35F are characteristic views showing that a DC component is under the influence of a time constant of a LPF.

Referring to FIGS. 24 and 35, the construction and operation of the first offset correcting means of the analog signal processing section 10 shown in FIGS. 23 and 24 will be described. The receiver carrying out this operation is effective particularly when receiving while correcting a DC offset in a received slot. FIG. 35 shows that a DC component produced in the output of the mixer 16 is under the influence of time constants of the LPFs 22 and 23. FIG. 35(a) shows a timing of the gain switching control signal 58 of FIG. 24, wherein the gains of the respective circuits of the analog signal processing circuit 10 are switched at time t', FIG. 35(b) shows the variation of the DC component of the mixer's output (LPF's input), wherein the DC offset fluctuation 86 occurs in accordance with the variation of the gains of the analog signal processing section 10 at time t'.

The DC offset fluctuation 86 corresponds to, e.g., the DCHIGH of FIG. 9B and the DCLOW of FIG. 8B. Furthermore, the correction of the DC offset has not been carried out at that time. FIG. 35(c) shows the output of the LPF 22 when FIG. 35(b) is inputted. In FIG. 35(c), a response 87 occurs due to the time constant of the LPF, and a delay 89 occurs before the setting of the output. FIG. 35(d) shows the opposite characteristic of the DC offset component 86. FIG. 35(e) is obtained by multiplying the output of the LPF 22 shown in FIG. 35(c) by the signal of FIG. 35(d). That is, in the zone of the delayed component 89 due to the influence of the time constant of the LPF 22, the DC offset correction output is shown by line 88, so that accurate correction can not be accomplished.

In order to solve this problem, the DC offset correction may be carried out upstream of the LPF 22. According to this method, the output of the DC offset correction circuit is not under the influence of the delay 89 as shown in FIG. 35(f), so that complete DC offset correction can be accomplished. Thus, in this receiver, the first offset correction means are preferably set at lcost upstream of the LPFs 22 and 23 (at positions 20 and 21 in FIGS. 23 and 24) in order to prevent the influence of the time constants of the LPFs 22 and 23. Furthermore, this is the same when the DC offset correction is carried out in the aforementioned receive procedure of FIG. 22, i.e., in the zone other than a desired received slot. That is, the first offset correction means are preferably set at least upstream of the LPFs 22 and 23 in order to decrease the influence of the time constants of the LPFs 22 and 23.

Figure 36:
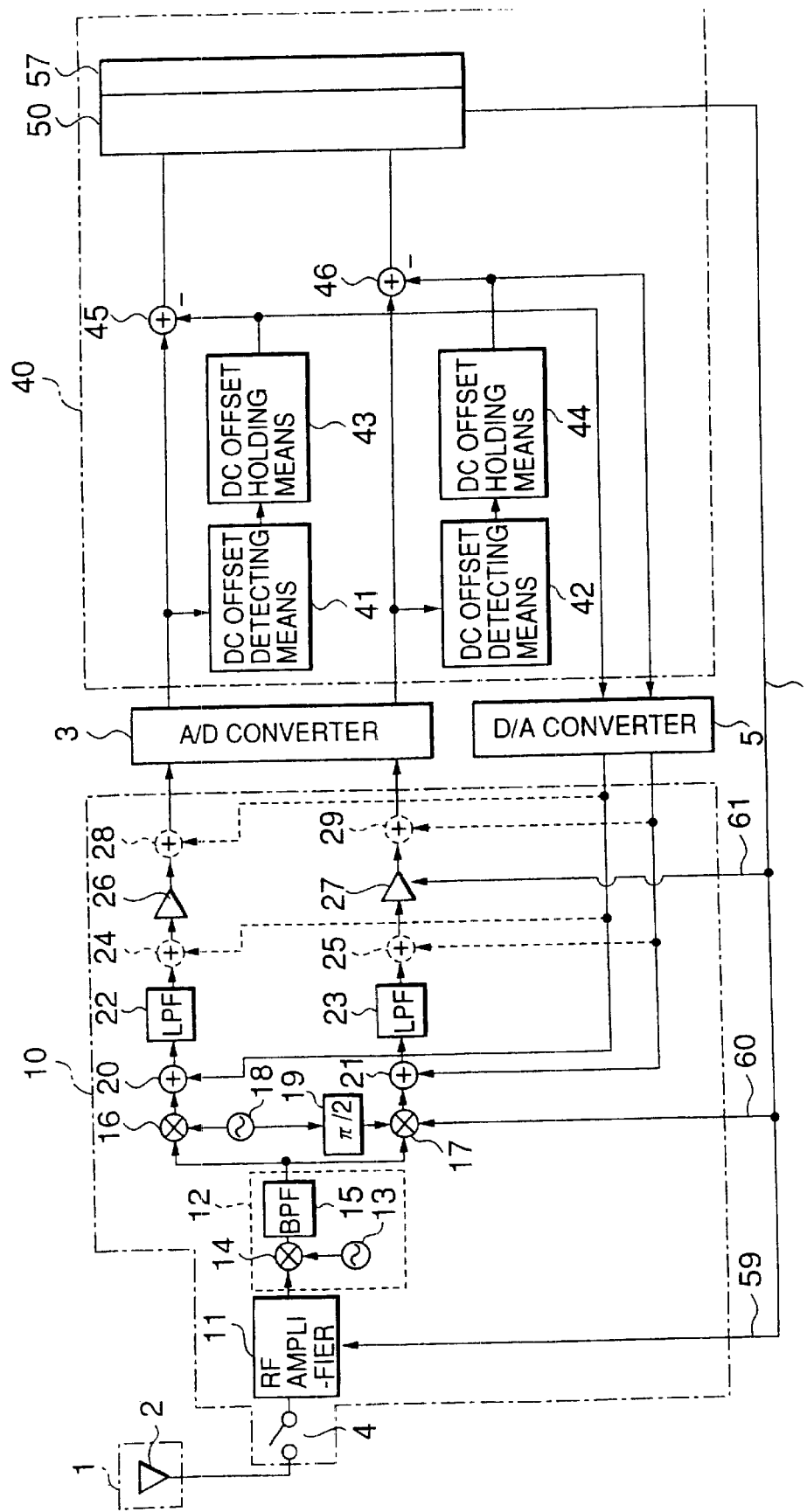
FIG. 36 is a block diagram illustrating a basic construction of the eighth preferred embodiment of a receiver according to the present invention.

In FIGS. 23 and 24, the DC offset is corrected by only the analog signal processing section 10. However, it can be clearly seen that the present invention may be effective for a receiver other than the seventh preferred embodiment, i.e., for a receiver wherein the DC offset is corrected in the digital signal processing circuit 40. That is, FIG. 36 shows the eighth preferred embodiment of a receiver according to the present invention, wherein second DC offset correcting means 45 and 46 are provided in the digital signal processing circuit 40 in FIG. 23. The operation of this portion is the same as that of the second preferred embodiment shown in FIG. 12.

Figure 37:
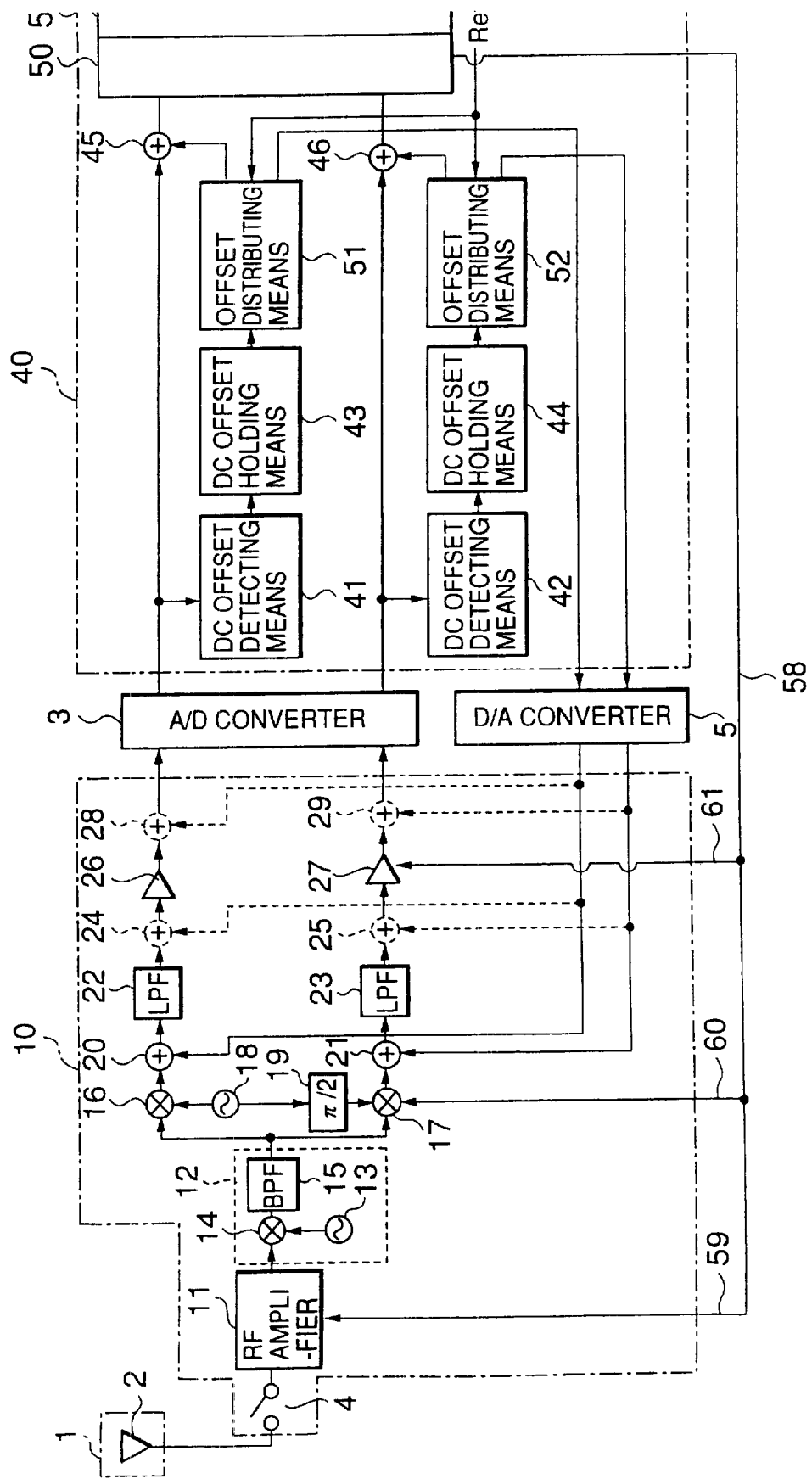
FIG. 37 is a block diagram illustrating a basic construction of the ninth preferred embodiment of a receiver according to the present invention.

Moreover, as the ninth preferred embodiment shown in FIG. 37, the amount of the DC offset to be corrected may be distributed into the analog signal processing section 10 and the digital signal processing circuit 40. That is, DC offset distributing means 51 and 52 my be added. This can be easily accomplished by using the same construction as that of the third preferred embodiment shown in FIG. 14. In addition, all the receive procedures containing the detection, setting and correction of the DC offset correction value may be carried out with respect to the digital value, not only with respect to the analog value.

Figure 38:
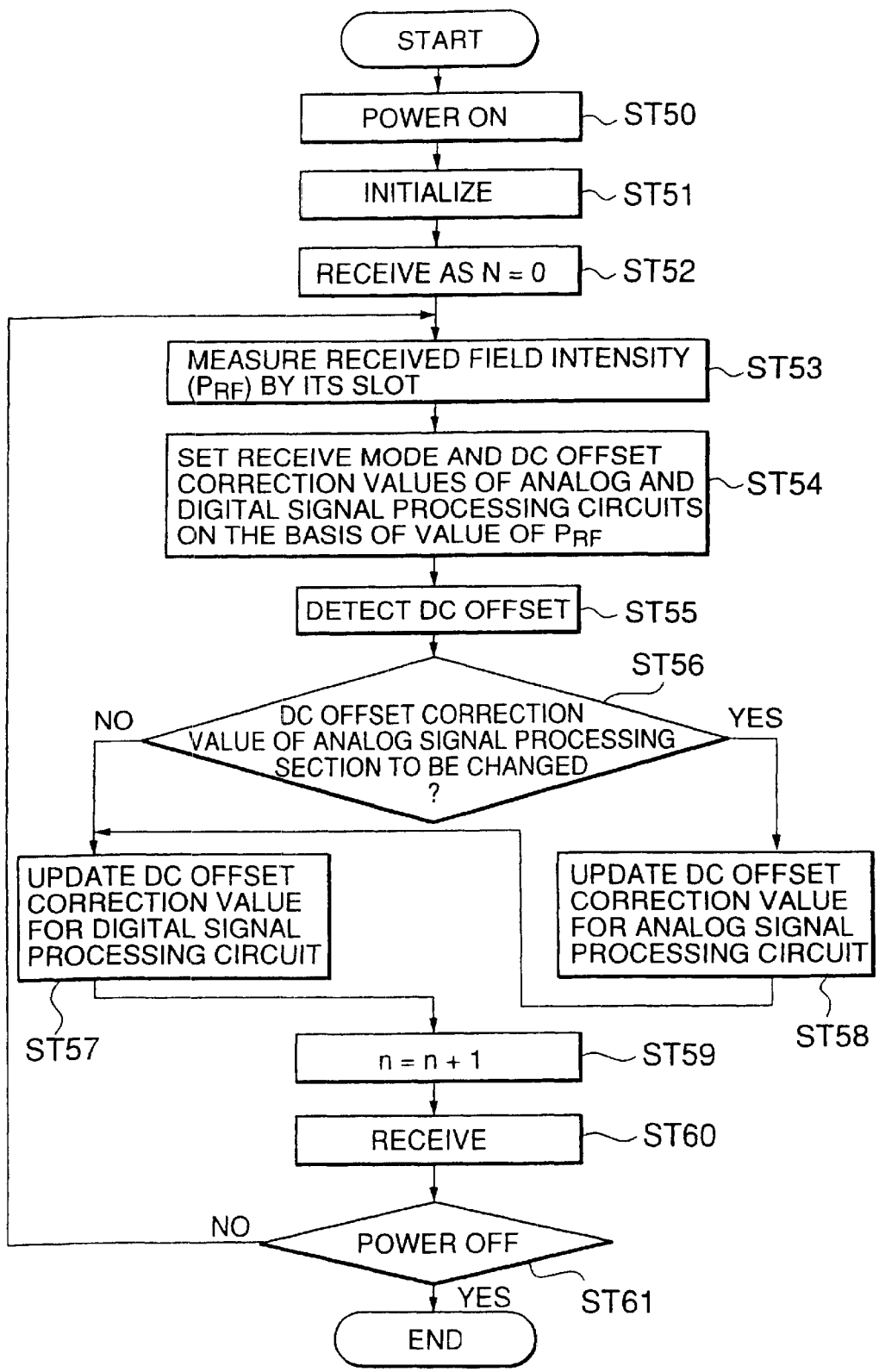
FIG. 38 is a flow chart showing an operation procedure for receiving a signal while distributing a DC offset.

Referring to FIG. 38, the receive operation procedure for receiving while distributing the DC offset correction into a digital system and an analog system will be described. It is now considered that the received slot shown in FIG. 31 is received. After the power supply is turned on (ST50), the initialization (ST51), the measurement of DC offset (FIG. 28), and the setting of the gain of the analog signal processing section 10 (FIG. 29) are carried out, so that the receiver is in a receivable state. In the measurement of DC offset, the measured DC offset is distributed into DC offset components corrected in the analog signal processing section 2 and the digital signal processing section 40. The construction of this portion is the same as that of the third preferred embodiment shown in FIG. 24. Thereafter, the received field intensity PRF is measured (ST53) at the received slot 67 (ST52). The receive mode for receiving the subsequent slot 68 is determined and set on the basis of the received field intensity of the received slot 67. In addition, the DC offset correction values corresponding to the set received mode are read out of the DC offset holding means 43 and 44, and set in the DC offset correcting means of the analog signal processing section 10 and the digital signal processing circuit 40, respectively (ST54). Furthermore, the steps ST55 through ST58 will be described later. Then, the subsequent desired slot 68 (ST59) is received (ST60). In this preferred embodiment, it is assumed that the received field intensity is substantially constant in one slot 68 and the set receive move is fixed during receiving the slot 68.

As described in FIG. 32, the DC offset produced in the respective circuit of the analog signal processing section 10 delicately fluctuate even in the same receive mode with the elapsed time and by the temperature characteristics of the circuits. Therefore, ti is required to sequentially detect the DC offset to update the contents of the DC offset holding means 43. At this time, if the method for distributing whether the DC offset is corrected in the analog signal processing section 10 or in the digital signal processing circuit 40 is sequentially updated, it is possible to more flexibly respond. This can be accomplished at steps ST55 through ST58 in FIG. 28.

First, at step ST55, the receive operation is carried out in the set receive mode and in the DC offset corrections in the analog signal processing section 10 and the digital signal processing circuit 40 to detect the DC offset. It is determined that the DC offset correction amount in the digital signal processing circuit 40 exceeds a predetermined value and the correction should be carried out in the analog signal processing section 10 (ST56), the DC offset correction amount in the analog signal processing section 10 is changed. The DC offset correction amount is changed by, e.g., updating the table of DC offset correction values shown in the rightmost column of FIG. 26 (ST58). In a case where this table is updated, the correction amount of the digital signal processing circuit 40 is calculated and set again in view of the correction amount of the analog signal processing section 10. On the other hand, it is determined at step ST56 that it is not required to change the DC offset correction amount in the analog signal processing section 10, only the DC offset correction value of the analog signal processing section 10 is updated (ST57).

Since the DC offset correction is carried out with respect to the respective receive modes in the analog signal processing section 10, the DC offset amount corrected in the digital signal processing circuit 40 may be smaller than the DC offset amount corrected in the analog signal processing section 10. Therefore, all the DC offset amounts corrected in the digital signal processing circuit 40 are not required to be shown in the table so as to correspond to the respective receive mode of the analog signal processing section 10.

At steps ST55 through ST58, the detection of the DC offset and the distribution of the DC offset into the analog signal processing section 10 and the digital signal processing circuit 40 are not usually required to be carried out every frame, and may be carried out every several frames.

With respect to the aforementioned eighth and ninth preferred embodiments, it can be clearly seen that the present invention may be effectively applied to a direct conversion receiver which does not have the frequency converter 12 of FIGS. 36 and 37.

Referring to the drawings, in the tenth preferred embodiment of a receiver having a function of removing a DC offset according to the present invention, the operation when picking a burst up will be described in detail below. The received signal inputted to the receiver in the tenth preferred embodiment is a burst-like signal shown in FIG. 31. In the case of a TDMA communication, this burst-like signal is received in a predetermined cycle. In a case where this cycle is far shorter than the fading cycle, the gain setting of the receiver, i.e., the selection of the receive mode, can be carried out using the last burst information (a part of the seventh preferred embodiment).

On the other hand, in a case where the fading cycle is shorter than the burst cycle even if the receiver is synchronized with the base station, there is no relationship between the received field intensity of the last burst and the received field intensity of the current burst. Therefore, the receive mode can not be set using the last burst information, so that it is required to pick up and receive an incoming signal. This corresponds to so called "burst receive when synchronized" in a case where a control signal is received during the battery saving (which will be hereinafter referred to as "BS"). In addition, in a case where the receiver is initially communicated with the base station, it is required to turn the power supply of the terminal on to carry out so-called "asynchronously continuous receive" to pick up a control signal transmitted from the base station. In this case, the receiver is not synchronized with the base station, so that it is not found what time a signal incomes from the base station. That is, it is required to receive an incoming signal, which suddenly appears in a silent zone, from the base station.

In the tenth preferred embodiment, this problem is accomplished, and there is provided a receiver having a function of removing a DC offset, which can determine a receive mode in an incoming burst, even with respect to a burst signal incoming from a silent zone, to demodulate received information. The tenth preferred embodiment, wherein the receive operation procedures shown in FIGS. 39 through 42 are applied to the receiver having the construction shown in FIG. 24, will be described below. Furthermore, while the DC offset correction has been carried out by only the analog signal processing section 10 for the simple explanation, this preferred embodiment can be effectively applied even if the DC offset correction is carried out in the digital signal processing circuit 40.

Figure 39:
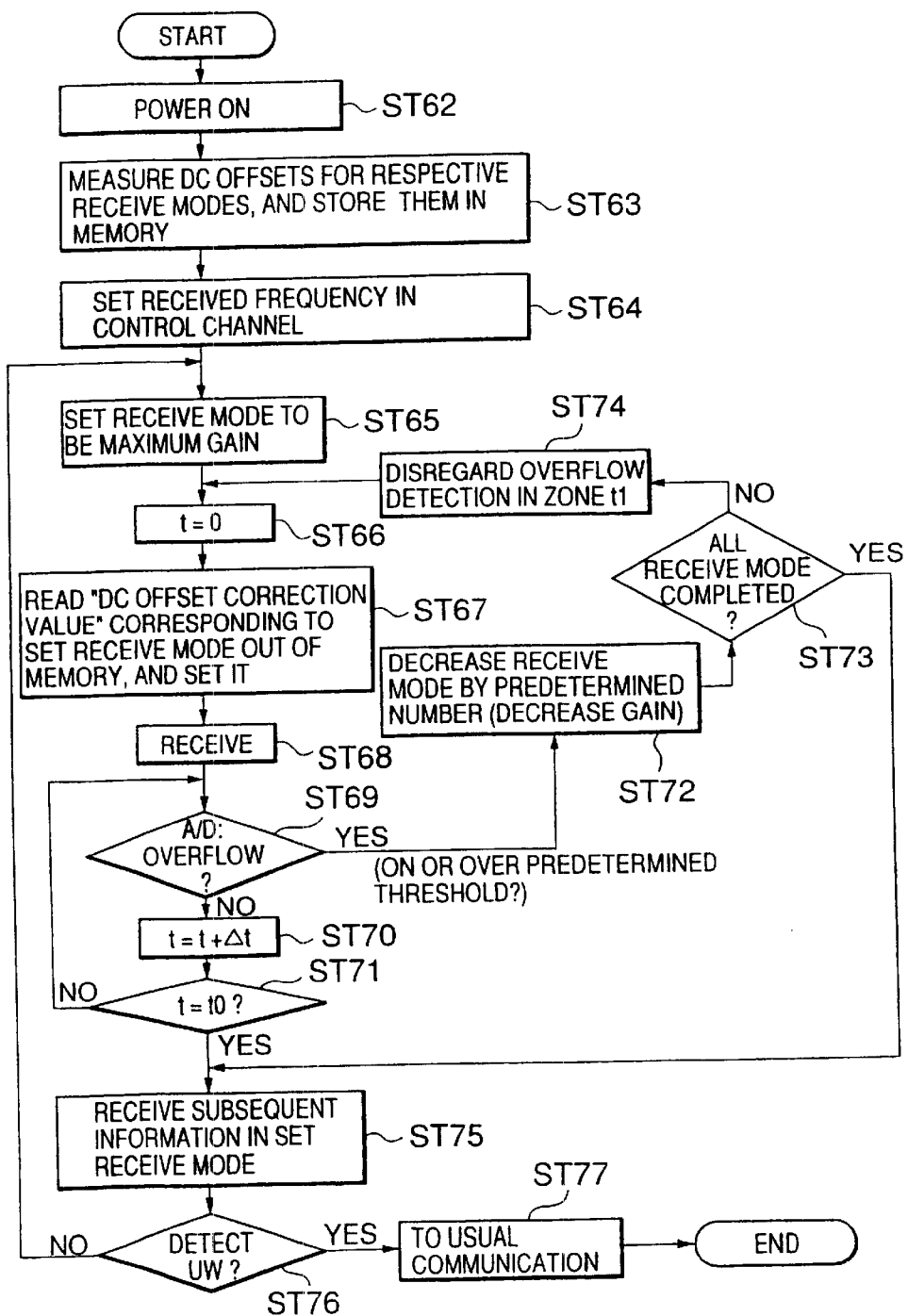
FIG. 39 is a flow chart showing operation steps of a control section for a receive mode and a DC offset.

FIG. 39 shows operation steps of a control section (not shown) for controlling receive modes and DC offsets in the digital signal processing circuit 10 of this preferred embodiment of a receiver according to the present invention. It is now assumed that the receive modes shown in FIG. 26 are set for the receiver of FIG. 24. These steps are completed in the zone of the preamble 83 shown in FIG. 33 in order to receive information after the unique word 84 after the receive mode is set.

In the control section, the receive operation is carried out in accordance with the following steps. After the power supply (ST62) is turned on, the DC offsets are measured with respect to all the receive modes to be stored in the DC offset holding means 43 and 44 (ST63). These steps are the same as those of FIG. 28. Then, the received frequency is set to the control channel, to which the control signal is transmitted from the base station (ST64), and the gain of the analog signal processing section 10 is set to be the maximum value (ST65). This corresponds to mode A in the receive modes of FIG. 26. Then, the counter for measuring time is reset (t=0) (ST66). DC offset correction values (A in FIG. 26) corresponding to the CDW and the current receive mode (mode A) are read out of the DC offset holding means 43 and 44 to be set (ST67). In this state, continuous receive is carried out (ST68), and it is waited for a control signal transmitted from the base station to income.

In a case where the overflow of the A/D converter is detected (ST69), there is the incoming of the signal. The overflow is detected by the appearance of the maximum digital data outputted from the A/D converter. Alternatively, the A/D converter may have a function of detecting the overflow so as to indicate the overflow when the flag is raised. When the overflow is produced, the gain of the analog signal processing section 10 is decreased (ST72).

For example, in a case where the mode is decreased by 1 in FIG. 16, the mode is changed to mode B. When the mode is changed, the delay is caused until the signal reaches the control circuit of the digital signal processing circuit 40 due to control delay and/or response delay of the analog signal processing section 10. In this delay zone, it is not accurately measure the amplitude intensity of the signal wherein the gain is decreased. Therefore, the delay time is previously calculated, and the overflow detection is stopped in the calculated delay time (t1) zone (ST74). Alternatively, the overflow detection may be disregarded in the control circuit. Thereafter, the time counter is reset again (t-0), and the overflow detection is started. Then, this operation is repeated by a resolution of Δt determined at a clock rate supplied to the digital signal processing circuit 40 (ST70). In a case where the overflow is not detected in a predetermined time zone (t-t0), the optimum receive mode is selected, and it is determined that the received signal enters the dynamic range of the D/A converter 5.

The aforementioned receive operation procedure is completed during the period of the preamble 83 of FIG. 33, and then, the subsequent unique work 84 is received in this receive mode (ST75). In a case where the unique word (UW) can be detected (ST76), the subsequent information portion 85 is received since it is a control signal transmitted from the base station to its station, and then, it is in the usual receive state (ST77). Furthermore, in a case where the unique word can not be detected, it is determined that the overflow is produced due to interference waves and so forth, so that it returns to the initial receive state (ST65) again.

Furthermore, a state (ST73), wherein the overflow is produced (ST69) even if the gain is decreased (ST72) and all the receive modes are used, is a state wherein the received field intensity is very high and exceeds the dynamic range of the receiver. The example of FIG. 26 shows that the overflow is produced even if the mode is set to be mode D (minimum gain). In this state, since it is impossible to receive any incoming signals, it may be immediately returned to the initial receive state (ST65), or it may be returned to the initial state after the subsequent information is received at the current gain (ST75).

Figure 40:
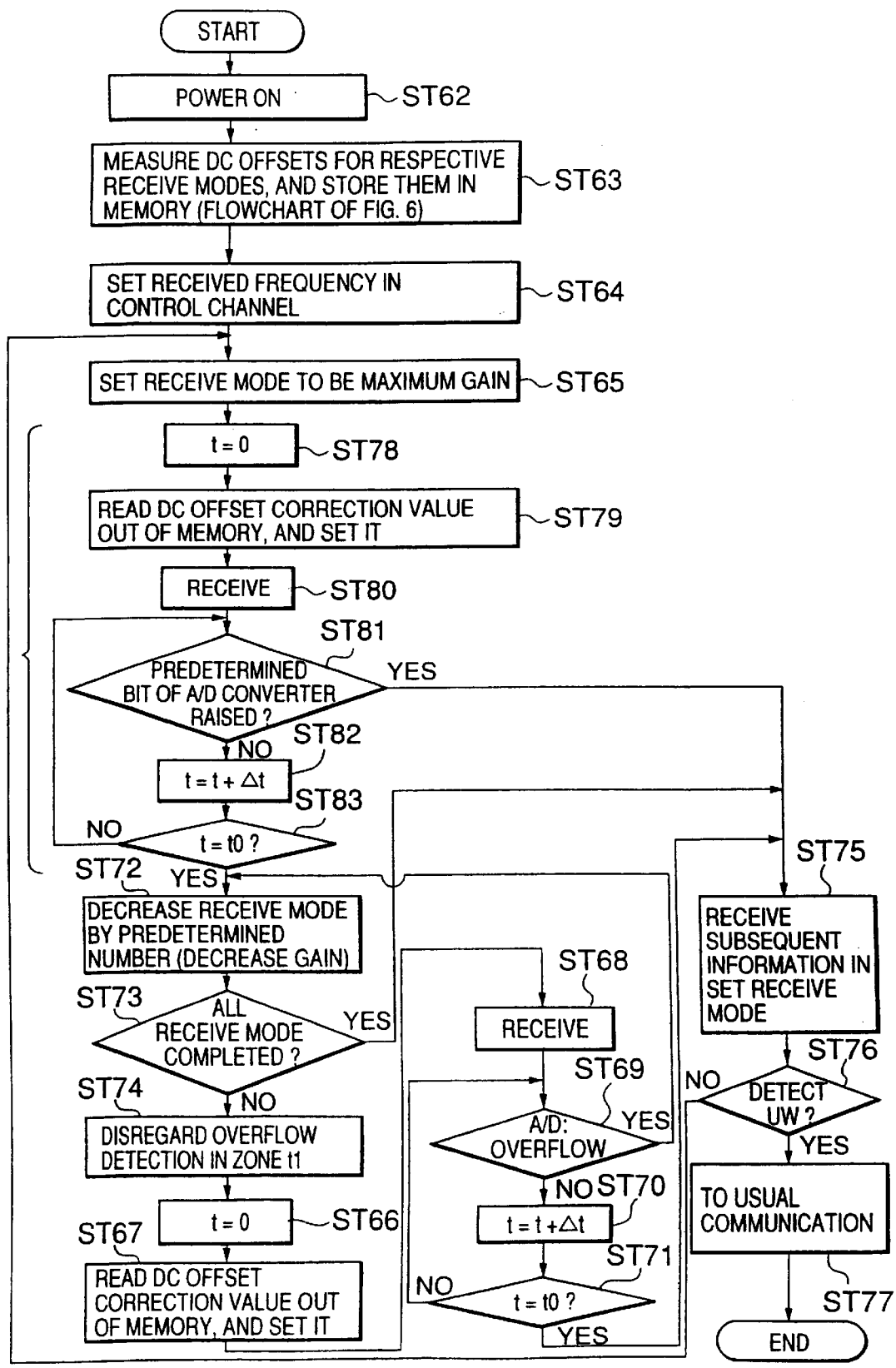
FIG. 40 is a flow chart showing operation steps of a control section in the eleventh preferred embodiment of a receiver according to the present invention.

FIG. 40 shows another operation procedure of a control section (not shown) for controlling a receive mode and a DC offset in the digital signal processing circuit 40 of the eleventh preferred embodiment of a receiver according to the present invention. The eleventh preferred embodiment is basically the same as FIG. 39. In this preferred embodiment, the receive is carried out as the gain is sequentially decreased from the maximum gain. However, this preferred embodiment includes steps ST78 and ST83 executed when the overflow of the A/D converter 3 does not occur even if the analog signal processing section 10 has the maximum gain. At this point, this preferred embodiment is different from FIG. 39.

This procedure is effective when a multi-bit A/D converter is used for the D/A converter 5. That is, it is the case that the overflow does not occur even if the analog signal processing section 10 in a case where the dynamic range of the A/D converter is great and the signal level thereof is small. In FIG. 40, the steps before ST65 are the same as those of FIG. 39, and the receive mode is set to be the maximum gain. The counter for measuring time is reset (t=0) (ST78), and the DC offset correction values corresponding to the current receive mode are read out of the DC offset holding means 43 and 44 to be set (ST79). In this state, continuous communication is performed (ST80), and it is waited for a control signal transmitted from the base station to income.

Figure 41:
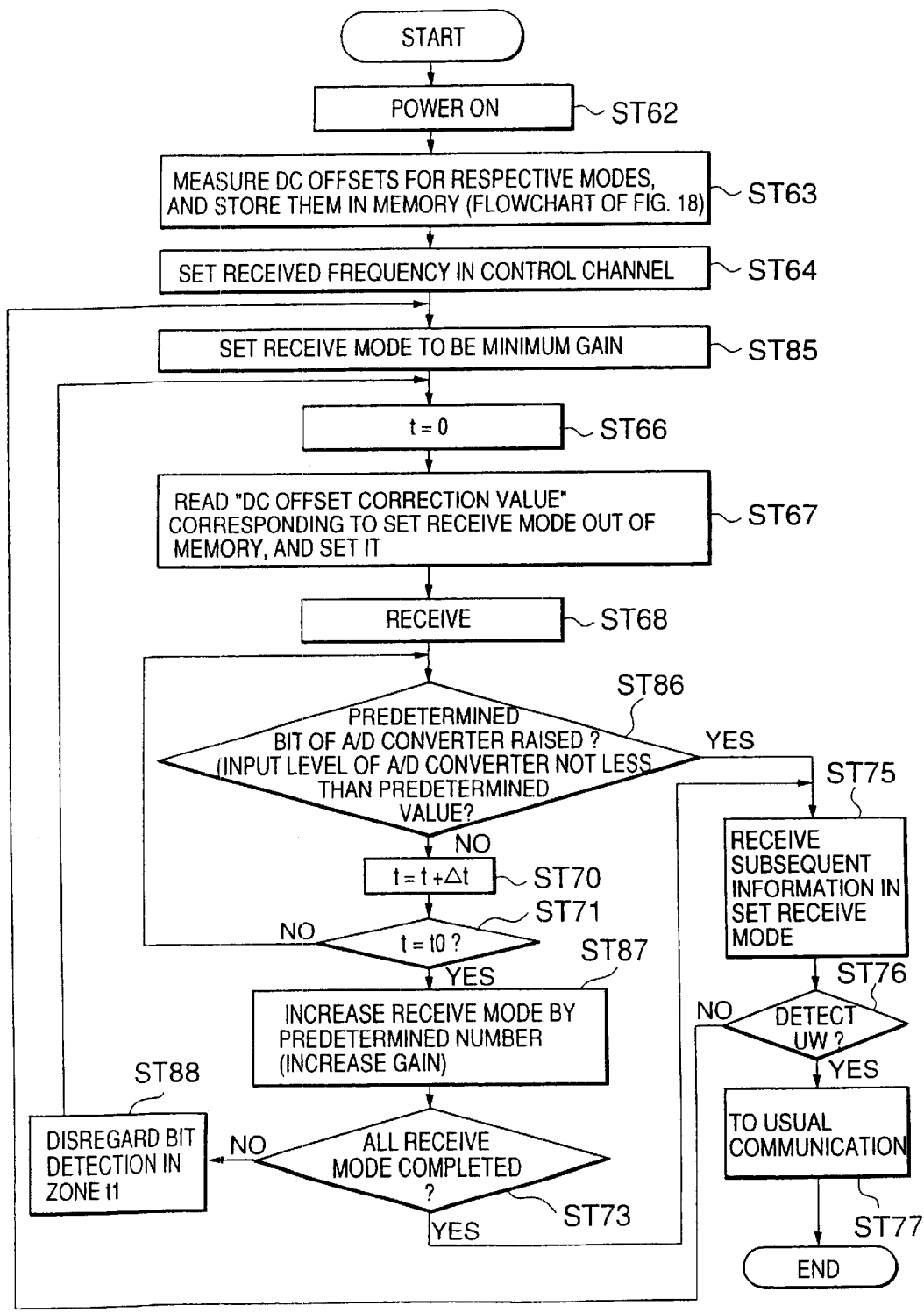
FIG. 41 is a flow chart showing operation steps of a control section in the twelfth preferred embodiment of a receiver according to the present invention.

At step ST81, the detection of a predetermined bit of the A/D converter 3 or the detection overflow is carried out. First, on the basis of the detection of a predetermined bit of the output of the A/D converter 3, it is determined whether the input signal is not less than a predetermined level. If it is not less than the predetermined level, it is determined that the signal arrives, and the routine goes to step ST75 while maintaining the maximum gain. At step ST75, the receive operation is carried out. In addition, even if the overflow of the A/D converter 3 is detected at step ST81, the same receive operation as that of FIG. 29 is carried out. Furthermore, when it is determined at step ST81 that the signal level is less than the predetermined level, it is regarded that no signal incomes. In FIG. 41 as described above, the steps ST78 through ST83 are added to FIG. 39.

FIG. 41 shows the operation procedure of a control section (not shown) for controlling a receive mode and a DC offset in the digital signal processing circuit 40 of the twelfth preferred embodiment of a receiver according to the present invention. In the tenth and eleventh preferred embodiments shown in FIGS. 39 and 40, an optimum receive mode is selected by sequentially decreasing the gain of the analog signal processing section 10 after setting the gain to be the maximum value. In this twelfth preferred embodiment (FIG. 40), an optimum mode is operated by increasing the gain of the analog signal processing section 10 after setting the gain to be the minimum value. In FIG. 41, the steps ST62, ST63 and ST64 are the same as those of FIG. 39. Then, the gain of the analog signal processing section 10 is set to be the minimum value (ST85). This corresponds to mode D of the modes of FIG. 26.

Then, the counter for measuring time is reset (ST66), and the DC offset correction value (D in FIG. 26) corresponding to the current receive mode (mode D) is set (ST67). In this state, the continuous communication is carried out (ST68), and it is waited for a control signal transmitted from the base station to income. Then, it is determined whether a predetermined bit of the output of the A/D converter 3 is raised (ST86). This is the same as the determination whether the signal level inputted to the A/D converter 3 is not less than a predetermined level. This determination is repeated by a resolution of Δt in a predetermined time zone (t-t0) (ST70, ST71). When it is determined that the signal level inputted to the A/D converter 3 lacks, it is required to increase the gain of the analog signal processing section 2 (ST87). In an example of FIG. 26, the receive mode D is shifted to mode C to increase the gain. After increasing the gain, similar to FIG. 39, the level detection is stopped in a zone of delay t1 in view of the control delay and the response of the analog signal processing section 10 (ST88). Thereafter, the time counter is reset again (t-0), and the level detection is started. When it is determined at step ST86 that a sufficient signal level is inputted to the A/D converter 3, it is determined that an optimum gain is set in the analog signal processing section 10.

These steps are completed during a period of the preamble 83 of FIG. 33, and the subsequent unique word 84 is received in the decided receive mode (ST75). When the unique word (UK) can be detected (ST76), it is a control signal transmitted from the base station to its station. Therefore, the subsequent information portion 85 is received, and then, it is in the usual receive state (ST77). Furthermore, when the unique word can not be detected, it is regarded that no signal incomes, and it returns to the initial receive state (ST85) again.

Furthermore, the state (ST73) that the signal level is not sufficient even if the gain of the analog signal processing section 10 is increased and all the receive modes are used, is regard as the state that the received field intensity is very weak and desired waves are covered with the noise level of the receiver. In this state, since it is impossible to receive any incoming signals, the receive state may be immediately return to the initial receive state (ST85). However, it may be returned to the initial state after the subsequent information is received at the current gain (ST75).

Figure 42:
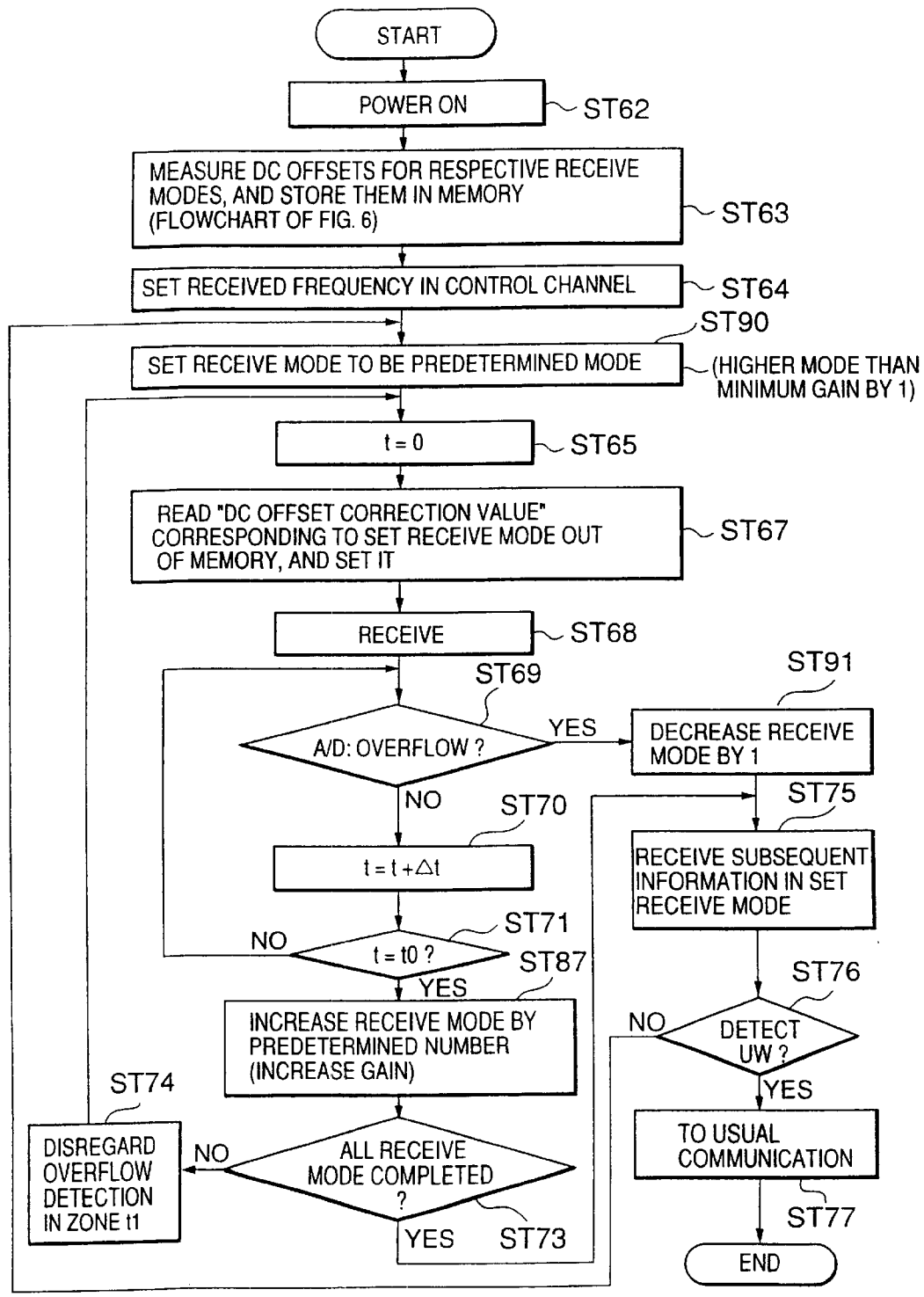
FIG. 42 is a flow chart showing operation steps of a control section in the thirteenth preferred embodiment of a receiver according to the present invention.

FIG. 42 shows the operation procedure of a control section (not shown) for controlling a receive mode and a DC offset in the digital signal processing circuit 40 in the thirteenth preferred embodiment of a receiver according to the present invention. In FIG. 42, the steps before ST63 are the same as those of FIG. 39. At the next step, the receive mode is set to be the initial mode. Specifically, it is set to be a receive mode wherein the gain is greater than the minimum gain by 1 (a higher gain by one stage). In an example of FIG. 26, the receive mode corresponds to mode C. Then, the counter for measuring time is reset (ST65), and the DC offset correction values (C in FIG. 26) corresponding to the current receive mode (mode C) are read out of the DC offset holding means 43 and 44 to be set (ST67). In this state, the continuous receive is carried out (ST68), and it is waited for a control signal transmitted from the base station to income.

In a case where the overflow of the A/D converter is detected (ST69), the receive mode is decreased by 1 (the gain is decreased by one stage). In that receive mode, signals after the preamble are received (ST75). Because there is no method other than a method for receiving at the minimum gain when the overflow occurs, since the receive mode is set to be a higher receive move than the minimum gain by 1 (a higher gain by one stage). On the other hand, in a case where the overflow is not detected in a predetermined time zone (t=t0), it is determined that the gain of the radio section lacks, and the gain of the analog signal processing section 10 is increased (ST87). In an example of FIG. 26, the receive mode is shifted from C to B to increase the gain. After increasing the gain, similar to FIG. 39, the overflow detection is carried out only in a zone of delay t1 in view of the control delay and the response of the analog signal processing section 10 (ST74).

Thereafter, the time counter is reset again (t-0), and the overflow detection is started. Then, until the overflow occurs, this operation is repeated at a resolution of Δt determined by a clock rate supplied to the digital signal processing circuit 40 (ST70). If the overflow occurs, the receive mode is returned to the last receive mode, i.e., a receive mode having a smaller gain by one stage (ST91), and the receive operation after the preamble is carried out (ST75). Since the receive operation procedure in the thirteenth preferred embodiment is a method for sequentially increasing the gain from a receiving mode having a small gain, the last receive mode can be regarded as an optimum receive mode.

Furthermore, at step ST87, the state that the overflow does not occur even if all the receive modes are used is considered as the state that desired waves are covered with the noise level of the receiver. In this state, since it is impossible to receive any incoming signals, the receive state may be immediately returned to the initial receive state (ST85). However, it may be returned to the initial state after receiving the subsequent information at the current gain (ST75).

The receive operation procedures shown in FIGS. 39 through 42 are compared. First, the required periods of time before the setting of the receive mode are compared. In FIGS. 41 and 42, since the receive operation is carried out while switching the gain from a low gain to a high gain, it is difficult to be under the influence the transient response due to the time constant of the LPF 22. That is, even if there is a transient response of the signal before the switch of the gain, since the subsequent signal level is greater than the transient response, it is difficult to incorrectly detect this level.

Figure 43:
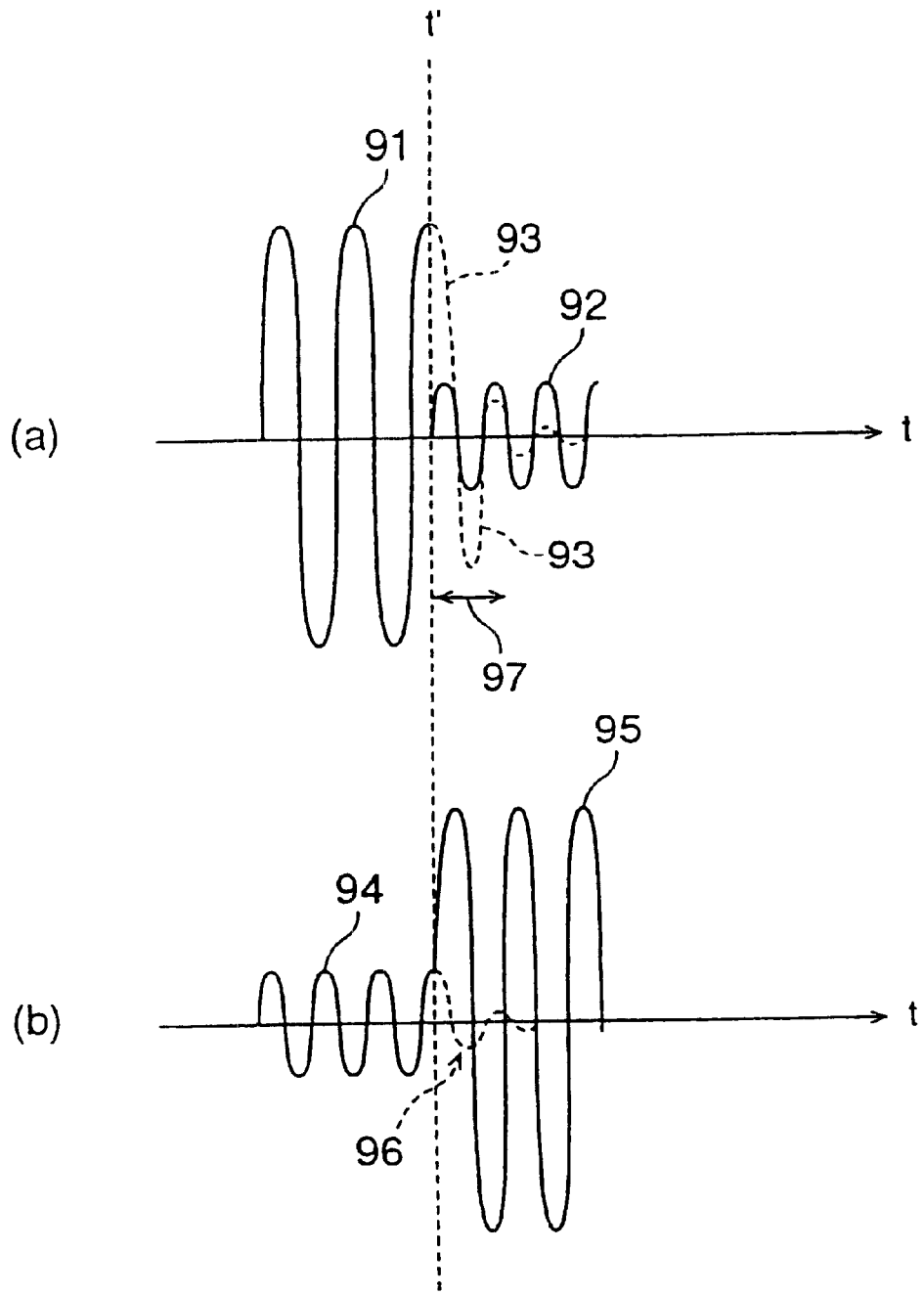
FIGS. 43A and 43B are graphs showing the difference in gain switching in FIGS. 39 through 42.
Figure 44:
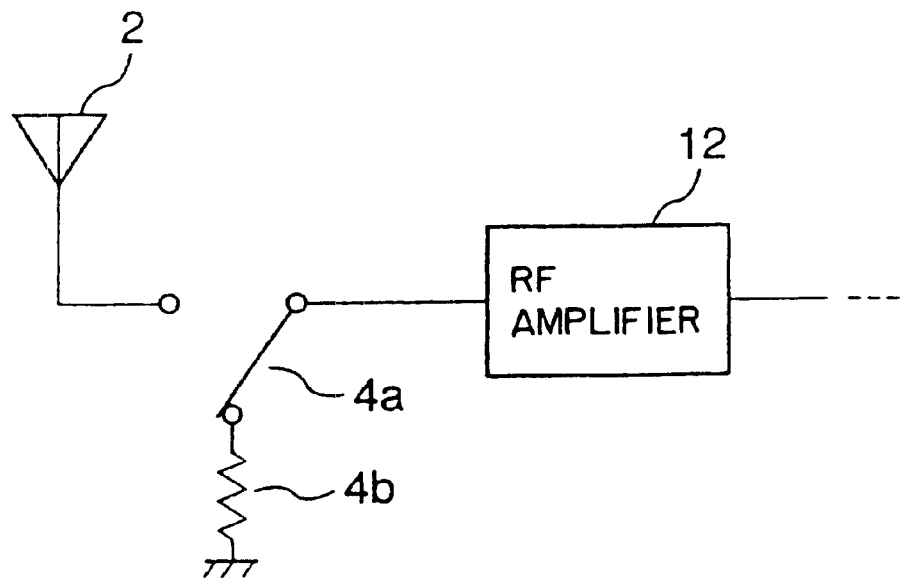
FIGS. 44A and 44B are block diagram illustrating a principal part of the fourteenth preferred embodiment of a receiver according to the present invention.
Figure 44:
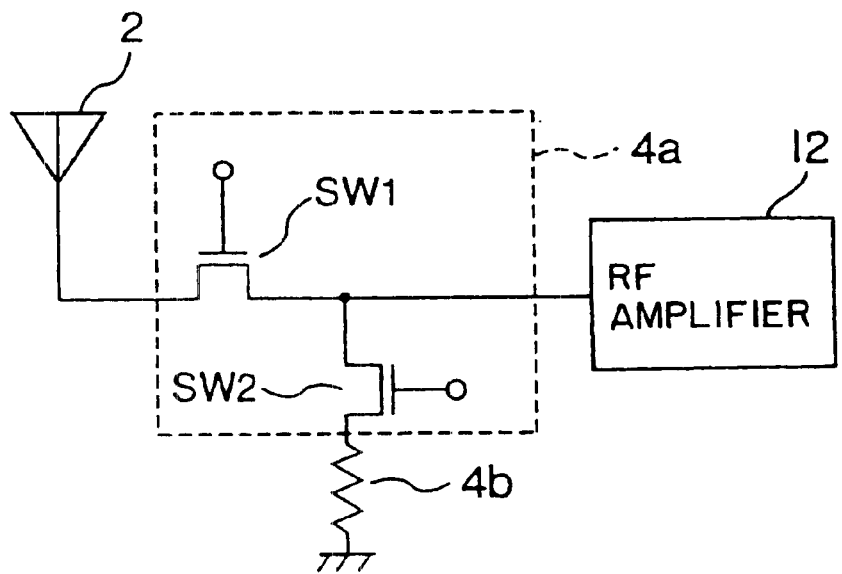

Referring to FIG. 43, this aspect will be described. FIG. 43(*a*) shows the output of the LPF 22 when the gain is switched from a high gain to a low gain, and FIG. 43(*b*) shows the output of the LPF 22 when the gain is switched from a low gain to a high gain. In the case of FIG. 43(*a*), when the gain is switched from a high gain to a low gain at time t', the signal level is changed from 91 to 92. However, under the influence of the time constant of the LPF, the signal 91 remains as a signal 93 even after the gain switching (t'), and it is superposed on a desired signal 92. Although the signal 93 attenuates by the time constant of the LPF, the level of the desired signal 92 can not accurately determined by the influence of the signal 93. Therefore, in order to determine the level of the desired signal 92, it is required to wait for the elapsed time expressed by 97. That is, a zone for disregarding the detection is required, so that the delay 97 occurs in the level determination of the desired signal 92.

On the other hand, FIG. 43(*b*) shows that the gain is switched from a low gain to a high gain. In FIG. 43, when the gain is switched from a low gain to a high gain at time t', the signal level is changed from 94 to 95. Similar to FIG. 43(*a*), under the influence of the time constant of the LPF, the signal 94 remains as a signal 96 even after the gain switching (t'), to be superposed on a desired signal. However, since the desired signal 95 is switched to a high gain, the signal level thereof is greater than that of the superposed signal 96, and there is little influence upon the level determination. Therefore, FIG. 43(*b*) can perform the level determination of the desired signal 96 immediately after the time t'. Thus, if the gain is switched from a low gain to a high gain, the length of the detection disregarding zone can be decreased. Thus, in the methods of FIGS. 41 and 42, the delay of "detection disregarding zone: t1" (ST74, ST88) required for the respective methods may be decreased. Therefore, the setting of the receive mode can be quickly carried out.

Figure 49:
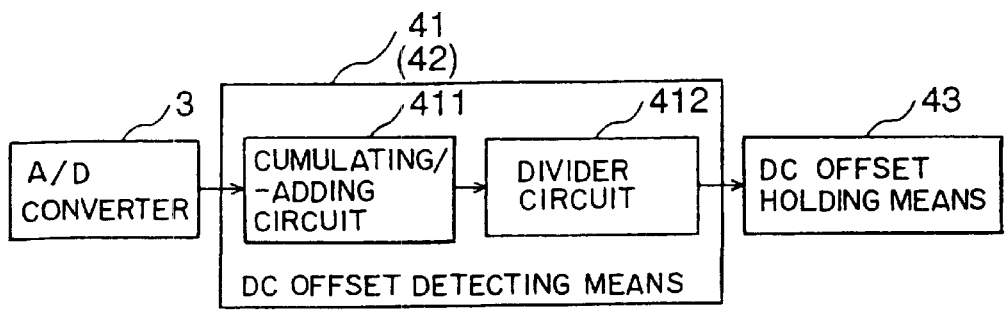
FIG. 49 is a block diagram illustrating a DC offset detecting section of a receiver according to the present invention.

On the other hand, in the "methods for switching the gain from a high gain to a low gain" shown in FIGS. 39 and 49, it is required to increase the length of the detecting disregarding zone in comparison with those of FIGS. 41 and 42.

The competence of the receive form will be compared below.

The receive operation procedure is required for the "asynchronously continuous receive" form when the power supply of the terminal is turned on and the initial communication with the base station is carried out.

The receive operation procedures of FIGS. 39 and 40 are effective in both cases of the "asynchronously continuous receive" when the power supply of the terminal is turned on and the initial communication with the base station is carried out, and the "synchronous burst communication" during BS. In particular, even if it is unclear what time a signal incomes when the "asynchronously continuous receive" is carried out immediately the power supply of the terminal is turned on, the incoming of a signal can be determined by the overflow detection since a signal is waited at the maximum gain.

On the other hand, in the receive operation procedures of FIGS. 41 and 42, it is difficult to detect the burst incoming signal during the silent zone. Because it is difficult to determine the presence of incoming signals in a state that it can not found what time a signal incomes (in an asynchronously continuous state immediately after the power supply is turned on), since a signal is waited at a low gain according to this receiving means. Therefore, the receive operation procedures of FIGS. 41 and 42 are suitable for the "synchronous burst receive" in comparison with the "asynchronously continuous receive".

As mentioned above, the respective operation procedures have characteristics. That is, the procedures of FIGS. 39 and 40 are suitable for the "asynchronously continuous receive", and the procedures of FIGS. 41 and 42 are effective for the "synchronous burst receive" since the time required to determine the receive mode is short. Therefore, it is effective to combine the respective receive operation procedures, if necessary, so that any one of the receive operation procedures of FIGS. 39 and 40 is used during the "asynchronously continuous receive" when the power supply of the terminal is turned on and any one of the receive operation procedures of FIGS. 31 and 32 is used during the "synchronous burst receive". For example, after the turning ON of the power supply (ST61) in FIGS. 41 and 42, the receive operation procedure shown in FIGS. 39 and 40, i.e., the procedures "burst receive during synchronous", are added. In the BS state after the synchronous is established once, the burst pick-up may be carried out using the methods of FIGS. 41 and 42.

Referring to FIGS. 44 through 48, the fourteenth through sixteenth preferred embodiments of a receiver according to the present invention will be described below.

In a case where the detection of a DC offset is performed, if a signal wave having a DC component other than a DC component to be detected is received, the DC offset can not be accurately detected. Therefore, if a radio wave used for another radio communication system is received by an antenna 2, there is a possibility in that the DC offset can not be accurately detected under the influence of the incoming wave.

In order to eliminate this influence, the receiver includes means for prevent a signal to be received by an antenna, i.e., means for cutting off a received signal, when a DC offset component is detected. Referring to the drawings, some preferred embodiments of this method will be described.

FIG. 44A shows received-signal cutoff means, which explains the fourteenth preferred embodiment. This received-signal cutoff means is provided with a switch 4*a* for cutting off a signal received by an antenna 2. The switch 4*a* cuts off a signal path from the antenna 2 in a case where the detection of a DC offset is performed. When the switch 4*a* is connected to a terminating resistance 4*b* which is set to be the same value as the input impedance of the antenna 2, it is possible to prevent an incoming signal received by the antenna 2 from being outputted to an analog signal processing section 10 and a digital signal processing section 40. In addition, the input of a RF amplifier 11 terminates in the terminating resistance 4*b*, the input impedance of the antenna 2. This prevents the DC offset output from being changed by the value of the input impedance of the RF amplifier between when the DC offset is detected and when a desired signal is received.

The switch 4*a* shown in FIG. 44A may comprise MOS switches SW1 and SW2 as shown in FIG. 44B. The operation modes of the switches SW1 and SW2 are shown in FIG. 45. That is, the switches SW1 and SW2 are controlled so that the switch SW1 is turned on and the switch SW2 is turned off when a usual receive is performed and the switch SW1 is turned off and the switch SW2 is turned on when the DC offset is detected. To the gates of the switches SW1 and SW2, a control signal is outputted from the digital signal processing section in accordance with the presence of the detection of the DC offset, so that the on-off control action is performed.

Furthermore, the switch 4*a* should be located upstream of the detection of the DC offset in theory. In general, the switch 4*a* is preferably located upstream of a gaining block and downstream of the RF amplifier 12.

As another construction for cutting off a received signal, the fifth preferred embodiment of a receiver according to the present invention will be described. FIG. 46 shows an example of a construction wherein a RF amplifier 11 and an attenuator 90 are connected in parallel. The input impedance of the attenuator 90 is set to be the same value as the input impedance of the RF amplifier 11, e.g., 50 Ω. The attenuator 90 is substituted for the RF amplifier 11 when a strong field is inputted, and serves to prevent the receiver from saturating. That is, when a signal of a usual level is received, the RF amplifier 11 is used, and when the level of a received signal is higher than a predetermined value, the attenuator 90 is used. The operation modes of the MOS switches SW1 through SW7 shown in FIG. 46 are shown in FIG. 47. When a receive of a usual level is performed, the switches SW3 and SW6 are turned on and the switches SW4 and SW7 are turned off, so that the RF amplifier 11 is active. On the other hand, in a case where the level of a received signal is higher than a predetermined value, the operation mode is an attenuator mode in which the switches SW3 and SW6 are turned off and the switches SW4 and SW7 are turned on, so that the attenuator 90 is active.

Moreover, this preferred embodiment is characterized that the switch SW5 is provided. When the detection of the DC offset is performed, the switch SW5, together with the switch SW 6, is turned on, and the switches SW3, SW4 and SW7 are turned off. In this state, the signal inputted from the antenna 2 is cut off, and the RF amplifier 11 terminates so as to have the same value as the input impedance of the attenuator 90, i.e., the input impedance of the antenna 2. Thus, it is possible to prevent the DC offset output from being changed by the value of the input impedance of the RF amplifier 11 between when the DC offset is detected and when a desired signal is received.

According to the aforementioned method, even if a radio wave is received from the antenna 2 when the DC offset is detected, it is possible to suitably detect the DC offset without being under the influence the incoming wave.

In the aforementioned fourteenth and fifteenth preferred embodiments, there has been described the method for detecting the DC offset in a case where the DC offset component is covered with other signal components. However, in a case where the level of the incoming wave received by the antenna is low so that it can be considered that there is no incoming wave, there may be no influence upon the detection of the DC offset. In order to adapt to such a case, means for detecting the intensity of a received signal (RSSI: a received field intensity detecting unit) may be provided so that the detection of the DC offset is performed when the received signal intensity of the incoming wave is lower than a predetermined value.

Figure 48:
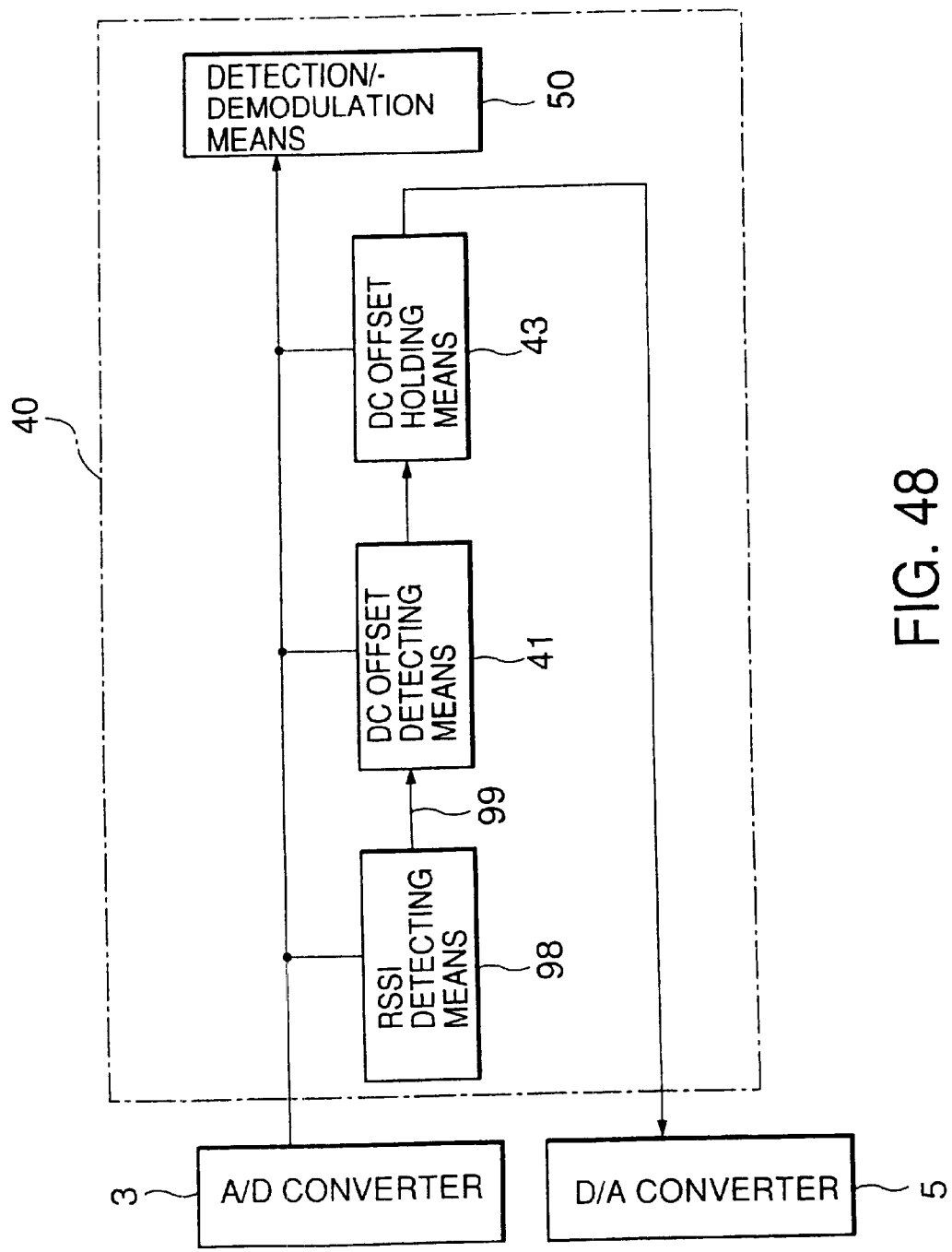
FIG. 48 is a block diagram illustrating a principal part of the sixteenth preferred embodiment of a receiver according to the present invention.

FIG. 48 is a block diagram the sixteenth preferred embodiment of a receiver according to the present invention, which explains the aforementioned method. Furthermore, FIG. 48 illustrates only one line in an IQ channel. In FIG. 48, the output of an A/D converter 3 is inputted to RSSI detecting means 98 to detect an input potential of the incoming wave received by an antenna 2 to a digital signal processing section 40. In this receiver, when the detected value is smaller than a predetermined value, it is considered that there is no influence upon the detection of the DC offset, so that the detection of the DC offset is performed. Specifically, if the detected value is smaller than a DC offset value, which is allowable in a demodulator 50 of the digital signal processing circuit 40, by about 10 dB, there is no influence upon the detection of the DC offset. As a result of the RSSI detection, when it is determined that the received field intensity of the incoming wave received by the antenna 2 is low so that there is no incoming wave, a control signal 99 is outputted to DC offset detecting means 41, so that the detection of the DC offset is performed. Furthermore, the control signal 99 may be outputted from detection/demodulation means 50.

The DC offset detecting means 41 (or 42) shown in FIG. 11 may be constructed as shown in FIG. 49. In FIG. 49, reference number 441 denotes a cumulating/adding circuit, and reference number denotes a divider circuit. The operation of the seventeenth preferred embodiment of a receiver according to the present invention will be described below.

The output signal of an A/D converter 3 is a signal obtained by frequency-converting the input signal inputted from an antenna 2 to a base band to be converted into a digital signal. The signal inputted to the cumulating/adding circuit 411 is a modulating signal, on which a DC offset is superposed.

In the cumulating/adding circuit 411, the digital data being the output of the A/D converter 3 is added every sample. Thus, only the DC offset components contained in the output signals of the A/D converter 3 are added by cumulating/adding the input signals. Because the mean value of the modulating signals other than the DC offset is 0 if the modulating signals are cumulated/added for a long term.

If this signal is divided by the number of cumulated data by means of the divider circuit 412, the absolute value of the DC offset contained in the output of the A/D converter 3 can be derived. If the number of cumulated data is a power of 2, the divider circuit 412 can be very simply constructed by bit shift.

As mentioned above, if the DC offset detecting means 41 comprises the cumulating/adding circuit 411 and the divider circuit 412, the DC offset value can be detected by deriving the time mean of the output signals of the A/D converter 3.

If the number of cumulated/added data (integral period) is set to be long so as to be enough to remove DC components contained in modulating signals, although the DC offset can be accurately detected, there is a time difference until the correction is performed. On the other hand, if the integral period is set to be short in order to perform the correction for a short time, the detection error of the DC offset is increased. Therefore, it is important to set the integral period to be an appropriate value. According to the seventeenth preferred embodiment, the integral period can be very simply set by changing the number of added data in the cumulating/adding circuit, and the setting thereof can be easily changed.

Figure 50:
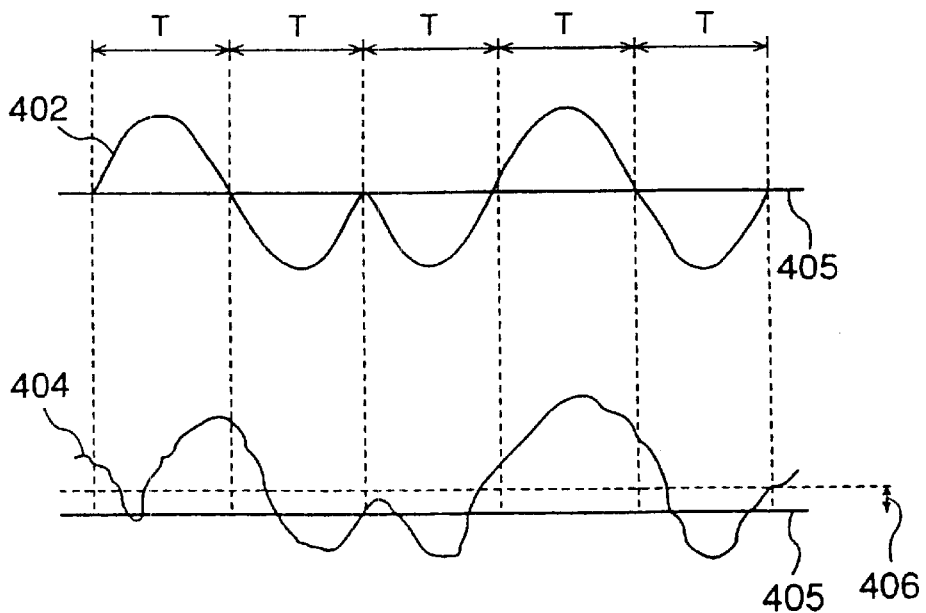
FIG. 50 is a waveform characteristic view for explaining a DC offset.

FIG. 50 shows received signals having offset components. In FIG. 50, a received signal 404 is a received signal having a thermal noise and a DC offset component. An original signal 402 is shown so as to be compared with the received signal 404. The deviation of the DC component from an analog) ground level 405 is a DC offset component 406. The signal processing is performed by converting the received signal into a digital signal. This signal processing is explained by FIGS. 51A and 51B. In FIGS. 51A and 51B, T denotes a period for one symbol, reference number 510 denotes a received signal waveform, and reference number 503 denotes an (analog) ground level. In FIG. 51A, the DC offset is detected using 5 samples (○) in a period T for one symbol. That is, sample points 504 are inputted to the DC offset detecting means 41 shown in FIG. 11, and the DC offset is detected using operations such as cumulation/ addition and division (reference number 506 denotes a DC offset component detected in FIG. 51A). On the other hand, in FIG. 51B, a DC offset 507 is detected using 10 samples (○ and ●) in a period T for one symbol.

Comparing FIGS. 51A and 51B, it can be closely seen that the received signal waveform can be more finely approximated in FIG. 51B wherein more sample points are set. Therefore, the DC offset component 507 in FIG. 51B can be more accurately detected in comparison with the DC offset component 506 in FIG. 51A. However, if the number of samples is increased, the number of the signal processing steps in the digital section is also increased, so that there is disadvantages in that operation time and electric power consumption are increased. In general, when the C/N of the received signal is good, the influence of the number of the sampling points upon the receive error rate characteristic and the detected DC offset amount is decreased. Therefore, if the sampling number is suitably changed in accordance with the state of the C/N of the received signal, it is possible to detect the DC offset with a good receive error rate and with a desired accuracy without unnecessarily increasing the operation amount in the digital section. In order to find the state of the C/N, the receive error rate of a known pattern such as a unique word may be suitably observed. Alternatively, in a receiver of a diversity system, it may be observed how a diversity occurs (if the switching number of diversity is small, the C/N of the received signal is good).

As mentioned above, if the DC offsets of the outputs of the A/D converter 3 are cumulated/added to be divided by the number of the added data, the DC offset can be accurately detected. In addition, if the number of data to be added is set to be a power of 2, the divider circuit 412 can be formed by bit shift.

With the aforementioned construction, there is a problem in the DC offset in a case where the signal component itself has a DC component. Even in such a case, the following DC offset detecting method is effective.

Figure 52:
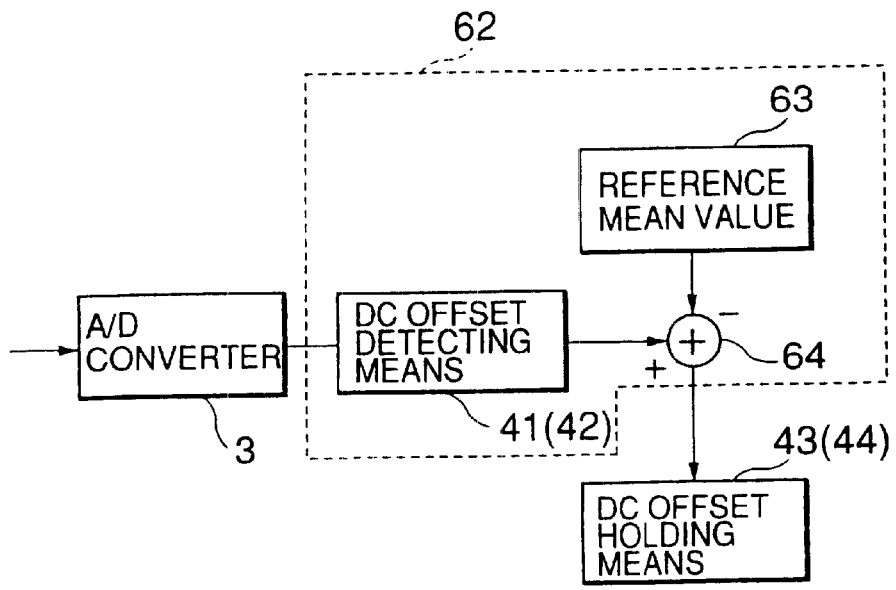
FIG. 52 is a block diagram illustrating a DC offset detecting section of a receiver according to the present invention.
Figure 53:
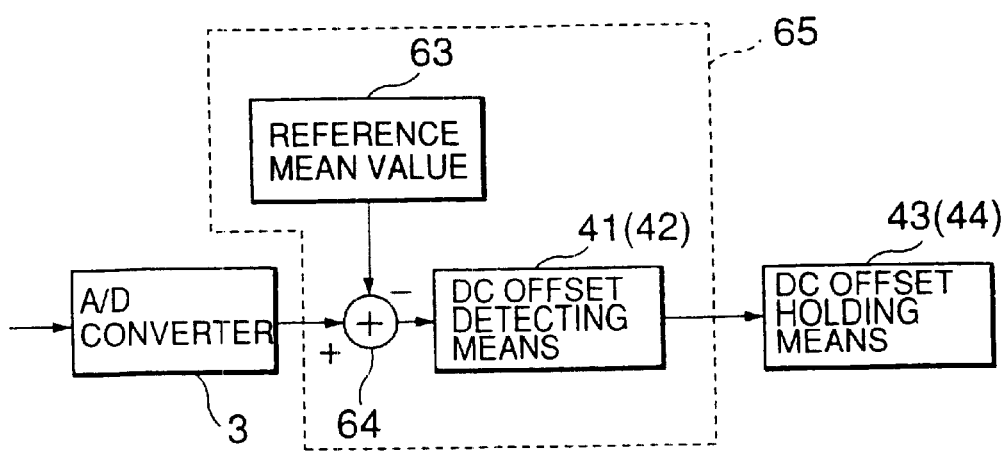
FIG. 53 is a block diagram illustrating a DC offset detecting section of a receiver according to the present invention.

FIG. 52 shows a preferred embodiment wherein a reference mean-value correcting circuit for a DC offset is added to the DC offset detecting means 41 shown in FIG. 12. In FIG. 52, a reference mean value 63 is a DC component contained in a modulating signal component by nature. In a case where a modulating signal component has a DC component, if a DC offset is corrected, the original DC component is also removed. Therefore, in a case where the DC components in a modulation system are known, a reference mean value of the DC components is prepared. If the reference mean value is subtracted, by means of a subtracter circuit 64, from the DC component detected by the DC offset detecting means 41, only the DC offset component can be accurately detected. In FIG. 52, the reference mean value is subtracted from the output of the DC offset detecting means 41. Alternatively, as shown in FIG. 53, the reference mean value may be subtracted from the output of the A/D converter 3. According to the construction shown in FIG. 43, the reference mean value can be subtracted from the DC offset contained in the signal component by nature upstream of the cumulating/adding circuit 411 of the DC offset detecting means 41. Therefore, in the construction of FIG. 53, although the operation amount is increased in comparison with FIG. 52, there is an advantage in that the DC component contained in the signal component by nature can be finely removed in a time base. Therefore, in a case where it is required to accurately detect the DC offset, the construction of FIG. 53 is used, and the time interval for subtracting the reference mean value 63 is set to be short, so that the DC offset can be flexibly corrected.

Referring to the drawings, the eighteenth preferred embodiment of a receiver having a DC offset removing function, according to the present invention, will be described below.

Figure 54:
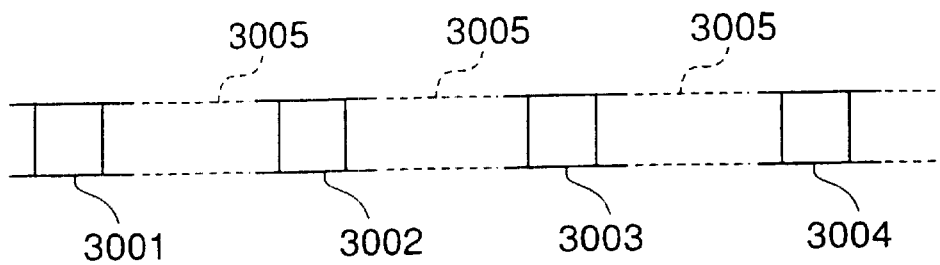
FIG. 54 is a conceptual view for explaining the construction of a TDMA system, to which a receiver of the present invention is applied.

FIG. 54 shows a TDMA frame format of a TDMA system, to which the this preferred embodiment of a receiver according to the present invention is applied. In FIG. 54, 3001, 3002, 3003 and 3004 are assigned to received slots, and 3005 is assigned to a slot other than the received slots (e.g., 3001 and 3002, or 3002 and 3003). In a case where the state of the receiver (temperature change and so forth) and the environment for radio waves (fading) are not changed, it is estimated that the amounts of the DC offsets produced in these slots are approximately equal to each other. In this receiver, the processing is performed by assuming that the amounts of the DC offsets detected by the adjacent received slots are the same as the amount of the DC offset produced in the subsequent received slot. Thus, the DC offset can be quickly and accurately detected in a limited time, so that the DC offset correction can also quickly performed.

Figure 55:
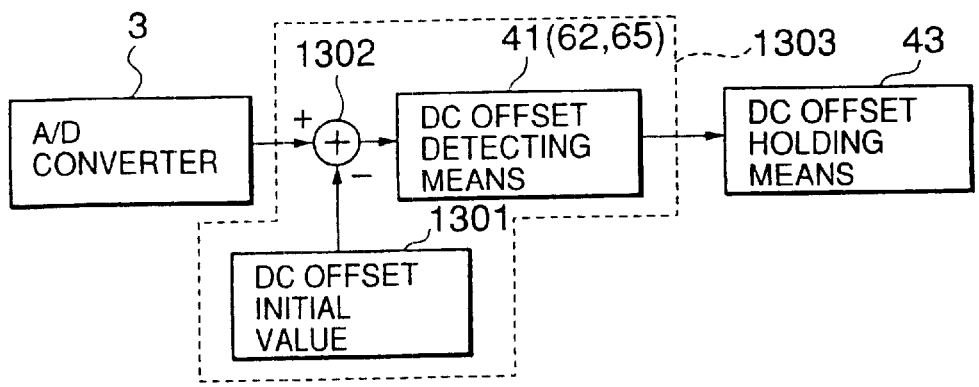
FIG. 55 is a block diagram of a DC offset detecting section of a receiver applied to a TDMA system.

FIG. 55 shows an embodiment of the DC offset detecting means used for the aforementioned preferred embodiment.

In FIG. 55, the DC offset value detected in the last received slot is stored in a DC offset initial value 1301 as an initial value of the DC offset. In a subtracter circuit 1302, the DC offset initial value 1301 is subtracted from a received signal converted into a digital signal in an A/D converter 3, and the resulting signal is outputted to DC offset detecting means 41. The DC offset detecting means 41 is constructed as mentioned above. The DC offset value detected herein is outputted to DC offset holding means 43 to be used for the correction of the DC offset.

In a case where the amounts of DC offsets produced in the adjacent received slots of the TDMA are equal to each other, if the DC offset value (initial value) of the last received slot is subtracted from the received signal, the DC offset can be completely removed. Even if the amounts of the DC offsets are not equal to each other, it can be considered that the amounts of the DC offsets are approximately equal to each other since the state of the receiver and the environment for radio waves are substantially constant between the adjacent received slots. Therefore, in this preferred embodiment, the DC offset can be detected at a higher speed and by a smaller amount of operation, compared with other constructions wherein the DC offset value of the last received slot is not used as an initial value.

Furthermore, the DC offset detecting means 62 (or 65) having the reference mean-value correcting means may be substituted for the DC offset detecting means 41 in FIG. 45. In addition, in the respective received slots, the DC offset initial value 1301 may be set in view of the DC offset values detected by the past received slots, not in view of the DC offset value detected by only the last slot.

Figure 56:
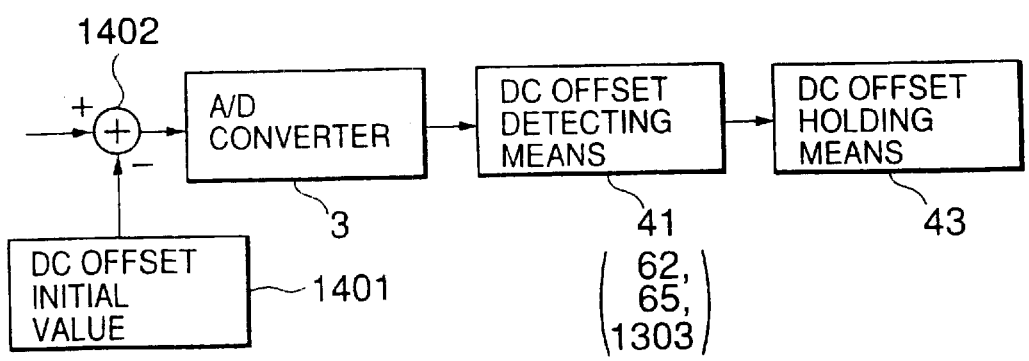
FIG. 56 is a block diagram of a DC offset detecting section of a receiver applied to a TDMA system.

In FIG. 55, while the subtraction of the DC offset initial value 1301 is performed downstream of the A/D converter 3, i.e., in the digital section, it may be performed upstream of the A/D converter 3, i.e., in the analog section. FIG. 56 shows an example of a construction wherein the subtraction of the DC offset initial value 1401 is performed in an analog subtracter circuit 1402 provided upstream of the A/D converter 3. Such a construction, wherein the DC offset initial value 1401 is subtracted in the analog section, is effective particularly in a case where the DC offset initial value is great and the downstream A/D converter 3 may saturate unless the subtraction is previously performed in the analog section. The DC offset detecting means 41 may be DC offset detecting means 62 (or 65) having the aforementioned reference mean-value correcting means. Alternatively, it may be a section 1303 shown in FIG. 55. In this case, the DC offset initial values are distributed to analog and digital to be subtracted.

The nineteenth preferred embodiment of a receiver according to the present invention will be described below.

In the aforementioned preferred embodiment, the detected DC offset is subtracted by the next slot. In order to accurately detect the amount of the DC offset, the detection period (integral period) is preferably long. However, in order to follow the fluctuation of the DC offset caused by fading and so forth, the integral period is preferably short. That is, the followability to the canceling accuracy and fluctuation of the DC offset has a trade-off relationship, so that it is required to select an appropriate integral period. However, in a case where the fluctuated amount of the DC offset increases or decreases, it is difficult to previously set a fixed integral period.

In order to eliminate such a problem, in the nineteenth preferred embodiment, the detection and removal of offset are performed by the following method. That is, the detected DC offset values of a predetermined number of the past slots are held, and the respective DC offset values are weighted to derive a mean value thereof.

Figure 57:
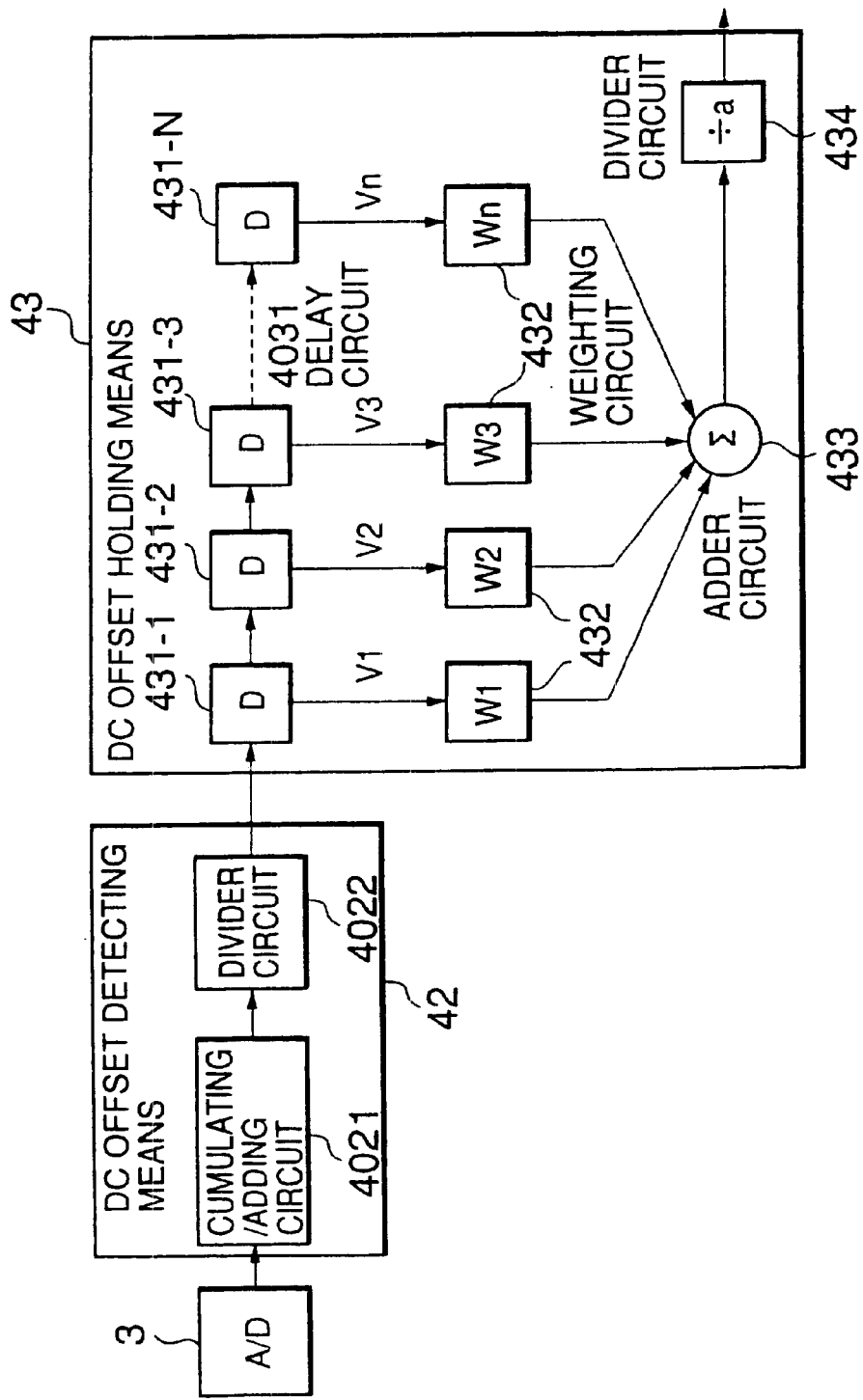
FIG. 57 is a block diagram of a principal part of the nineteenth preferred embodiment of a receiver according to the present invention.

FIG. 57 shows the construction of the nineteenth preferred embodiment of a receive according to the present invention. In FIG. 57, DC offset detecting means 42 comprising an A/D converter 3, a cumulating/adding circuit 421 and a divider circuit 422 is the same as that of FIG. 12, so that the description thereof are omitted. Reference number 43 is DC offset holding means which comprises a delay circuit 431, a weighting coefficient circuit 432, an adder circuit 433 and a divider circuit 434.

The delay circuit 431 holds the value of a slot outputted from the DC offset detecting means, and then, outputs the value. Therefore, in FIG. 57, the output of a delay circuit 431-1 is a detected value V1 of the last slot, the output of a delay circuit 431 2 is a detected value V2 of a slot of two slots before, and the output of a delay circuit 431-N is a detected value Vn of a slot of N slots before. The weighting coefficient circuit 432 multiplies an input value by a preset weighting coefficient value Wn to output the multiplied value.

The adder circuit 433 sums up the outputs of the weighting coefficient circuit, and outputs the summed value. The divider circuit 434 divides an input value by the total of the weighting coefficient values, and outputs the divided value. In the divider circuit 434, a is the total of the weighting coefficient values (W1+W2+ . . . +Wn).

The operation of a DC offset canceling unit of the nineteenth preferred embodiment of a receiver, according to the present invention, will be described below.

It is assumed that a DC offset value detected in a slot of N slots before is Vn, a DC offset value detected in a slot of (N-1) slots before is Vn-1, and a DC offset value detected in the last slot is V1. These values correspond to the outputs of the delay circuit 431.

It is also assumed that a weighting coefficient to information of a slot of N slots before is Wn, a weighting coefficient to information of a slot of (N-1) slots before is Wn-1, and a weighting coefficient to information of the last slot is W1. These values are held in the weighting coefficient circuit 432. The output of the divider circuit 434 corresponding to an estimate Ve of a DC offset is as follows.

$$Ve=(Wn \cdot Vn+Wn\text{-}1 \cdot Vn\text{-}1+ \ldots +W1 \cdot V1)/(Wn+Wn\text{-}1+ \ldots +W1)$$

In this formula, the numerator is an output value of the adder circuit 433, i.e., an input value of the divider circuit 434, and the denominator is the total of the weighting coefficient values (Wn+Wn-1+ . . . +W1). Therefore, the output value of the divider circuit 4034 is the estimate Ve of the offset.

Thus, if Wn to W1 are set to be appropriate values, an accurate estimation can be accomplished using the past detected values. However, Wn=<Wn-1=< . . . <W1.

The following methods for setting weighting coefficients Wn are considered.

Figure 58:
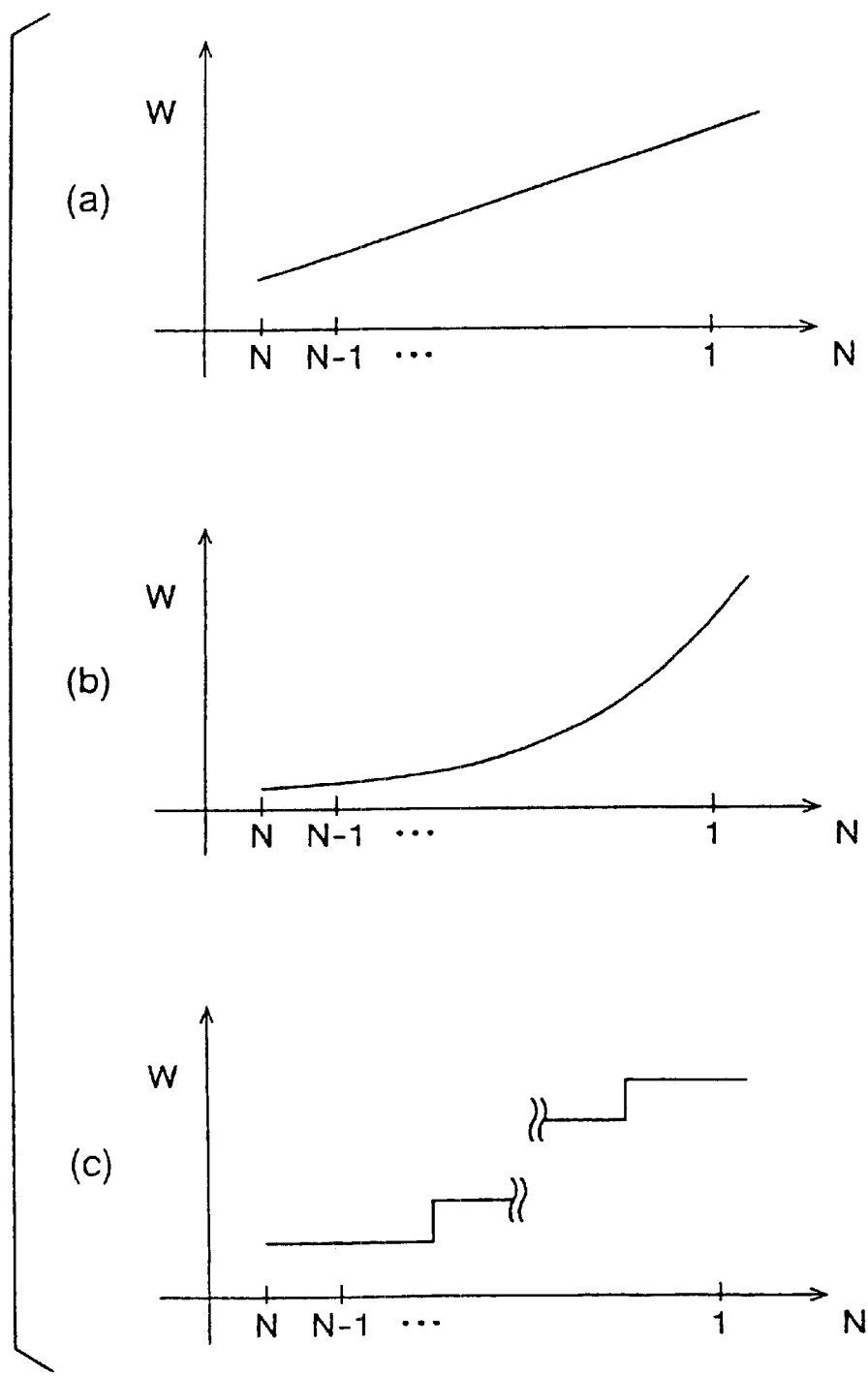
FIGS. 58A through 58C are characteristic views for explaining the operation of the receiver shown in FIG. 57.

(1) Method for changing Wn using an arithmetical series (FIG. 58(a))

(2) Method for changing Wn using an geometrical series (FIG. 58(b))

(3) Method for gradually changing Wn in a step form (FIG. 58(c))

If all the weighting coefficients Wn are 1 (or the same value), it corresponds to a method for deriving a mean value in the past N slots. In the nineteenth preferred embodiment, the detection and removal of DC offsets can be suitably performed using the past detected values if necessary.

Figure 59:
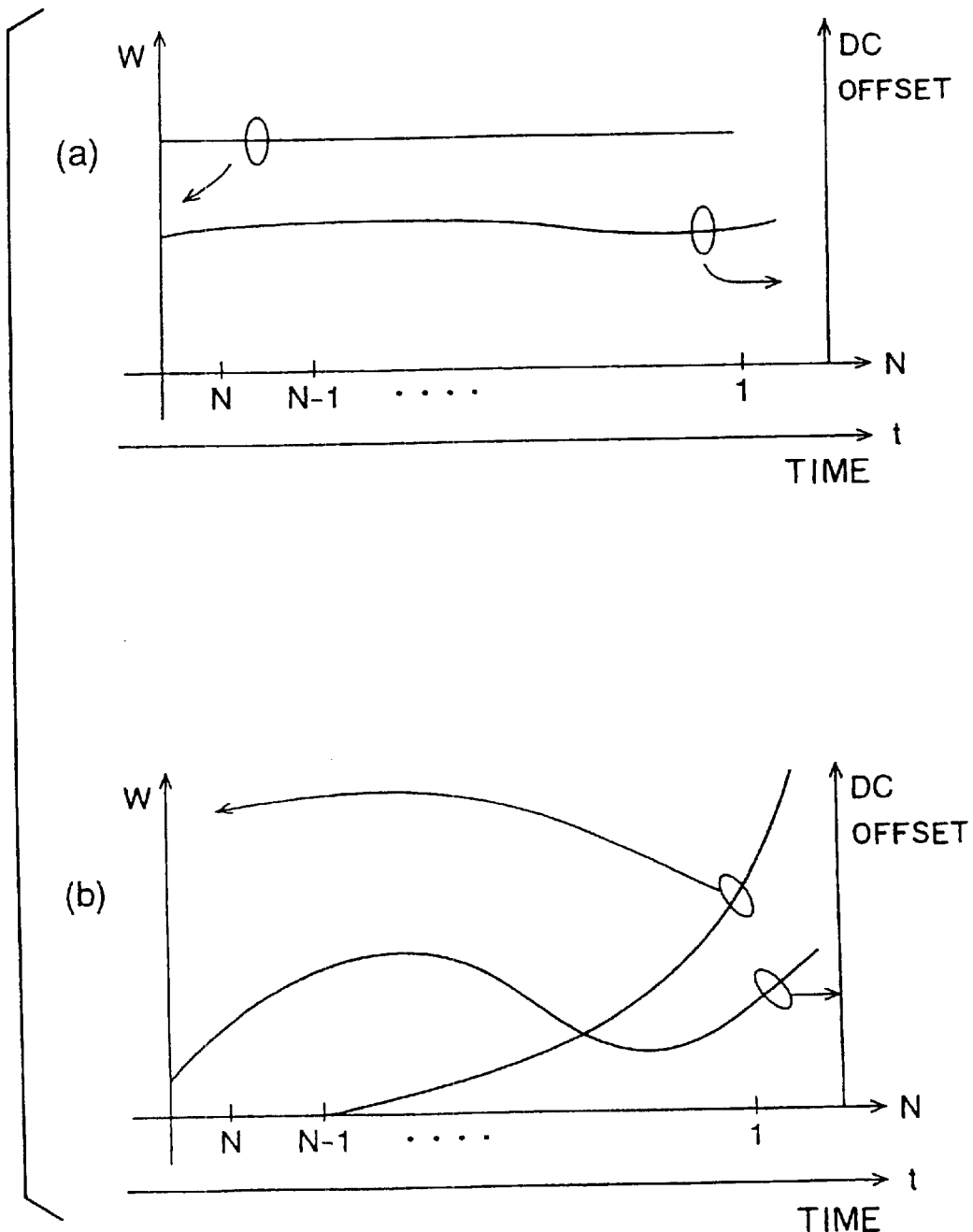
FIGS. 59A and 59B are characteristic views for explaining the operation of the receiver shown in FIG. 57.

For example, as shown in FIG. 59(*a*), in a case where the temporal fluctuation of the DC offset is small, it can be considered that the past detected values are substantially the same as the DC offset values. Therefore, if the same value is used for all the weighting coefficients to set a long integral period, it is possible to obtain a more accurate estimate and it is possible to accurately remove offsets.

In addition, as shown in FIG. 59(*b*), in a case where the temporal fluctuation of the DC offset is great, there is a great possibility in that the past detected values are different from the offset values. Therefore, if the coefficients of the past data are set to be small, it is possible to perform the offset removal while improving the time followability.

In the nineteenth preferred embodiment, if the aforementioned methods are used, it is possible to accurately remove offsets while maintaining the followability by the fluctuation.

Figure 60:
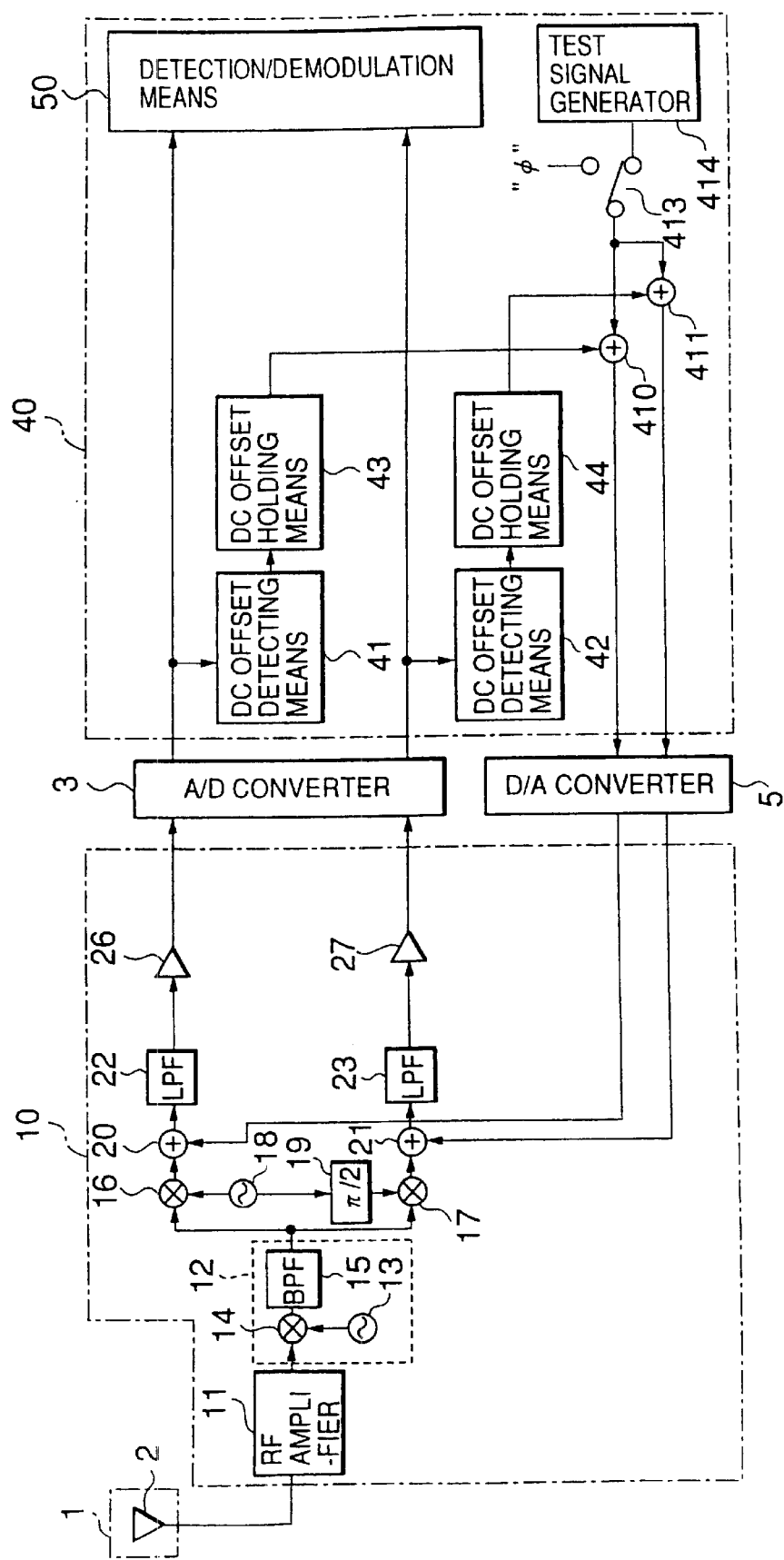
FIG. 60 is a block diagram illustrating a basic construction of the twentieth preferred embodiment of a receiver according to the present invention.

In addition, as the twentieth preferred embodiment shown in FIG. 60, e.g., a limiting wave of a predetermined frequency is produced in a test mode by means of a test signal generator 414 via selecting means 413, to be added to the inputs of LPFs 22 and 23 via a D/A converter 5 and first DC offset correcting means 20 and 21. The outputs of the LPFs 22 and 23 are monitored by a digital signal processing circuit 40, so that a band limitation characteristic of an analog signal processing circuit can be derived to be used for the adjustment. Thus, the D/A converter for converting the digital test signal into an analog signal can be also used as the D/A converter for converting a detected digital DC offset into an analog signal, so that the size of a LSI can be decreased.

Figure 61:
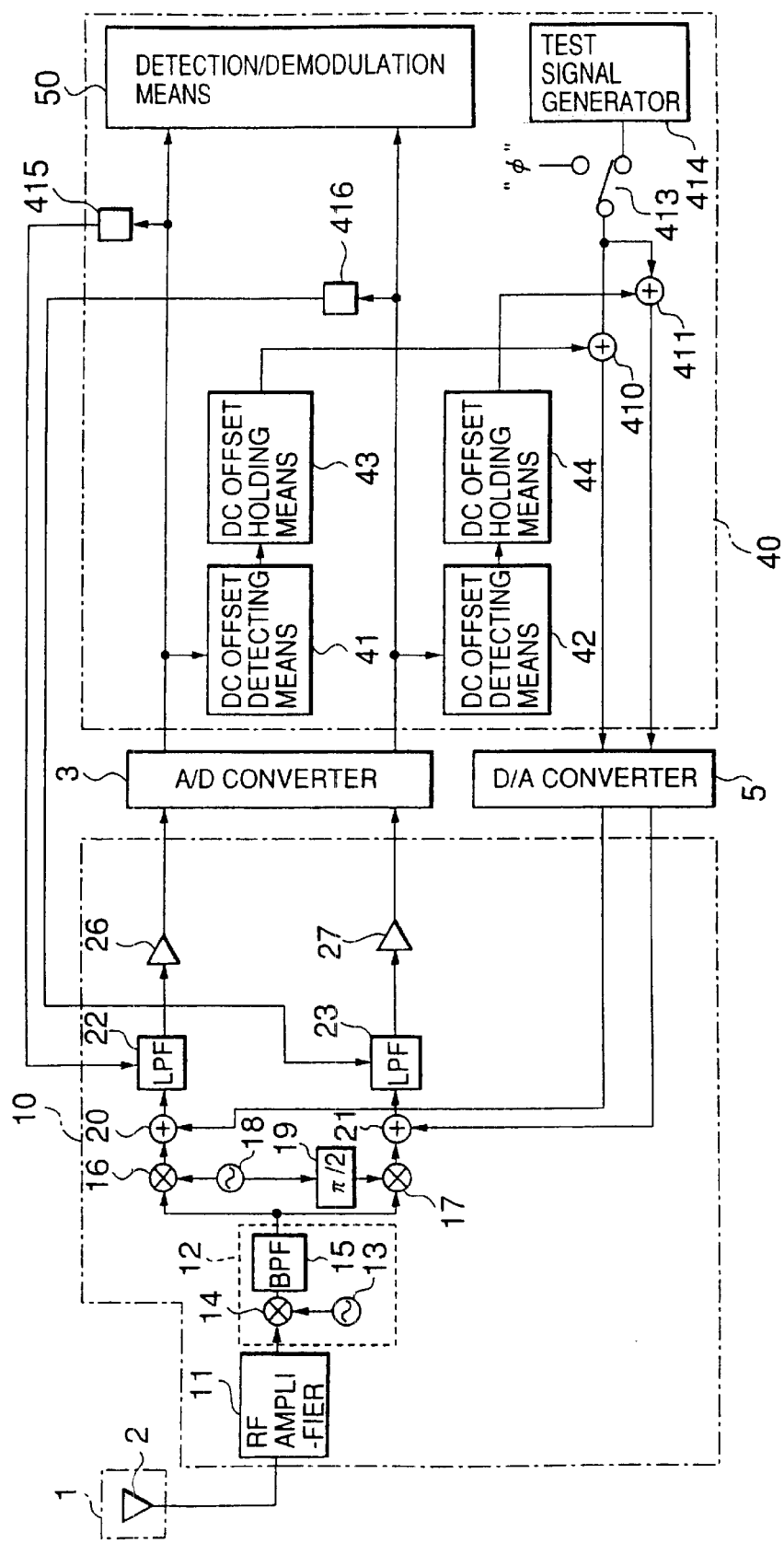
FIG. 61 is a block diagram illustrating a concrete construction of FIG. 60.

Specifically, as shown in FIG. 61, the adjustment is performed using frequency characteristics control means 415 and 416 provided in a digital signal processing circuit 40 and using LPFs 22 and 23 having a cut-off frequency adjusting function. For example, it is detected by the frequency characteristics control means whether the gains of limiting waves having a desired cut-off frequency, which are test signals passing through the LPFs 22 and 23, are greater or smaller than a desired gain (e.g., −3 dB), and their compared signals are outputted as control signals to the LPFs 22 and 23 to control the gains so as to be a desired gain at desired cut off frequencies of the LPFs 22 and 23. Thus, it is possible to prevent the receive characteristic from deteriorating due to the dispersion in cut-off frequency of the LPF when it is formed as a LSI. Furthermore, the adjustment of the cut-off frequency of the LPF may be performed by switching the resistance or capacity for determining the time constant of the filter or electrical current.

FIG. 62 shows an example of frequency characteristics control means. The gain of a signal passing through the LPF is derived at a desired cut off frequency by, e.g., gain deriving means 417 for detecting the peak value of a signal. The derived gain is compared with a gain Ref2 by comparing means 418, and the compared result is returned to the LPF as a feedback control signal.

In addition, the adjustment of the cut-off frequencies of the LPFs 22 and 23 may be performed after the detection and correction of the DC offset so that the test signal does not distort due to the DC offset in the LPFs and the A/D converter to prevent errors from occurring in the gain detection.

Furthermore, if the aforementioned first through twentieth preferred embodiments of a receiver according to the present invention are applied to a communication system, it is possible to decrease the deterioration of the error rate of a received signal, and it is possible to accomplish a good communication particularly using the twentieth preferred embodiment of a receiver according to the present invention, which can adjust the zone limiting characteristic. In the twenty-first preferred embodiment, a communication system (not shown) having such a receiver comprises: a transmitter for transmitting a radio frequency signal of an information signal containing voice and image; a communication network for transmitting and receiving the radio frequency signal; and a receiver having a function of a direct current offset, the receiver comprising: a receiving section for receiving the radio frequency signal; an analog signal processing section for amplifying, band-converting and frequency-converting an analog signal inputted from the receiving section; an AD converting section for converting an output of the analog signal processing section from an analog signal to a digital signal; and a digital signal processing section for processing the digital signal converted by the DC converting section; offset detecting means, provided in the digital signal processing section, for detecting a direct current offset signal produced in the receiving section or a frequency converting section; offset holding means, provided in the digital signal processing section, for holding the direct current offset signal detected by the offset detecting means; a DA converting section for converting the direct current offset signal detected by the digital signal processing section into an analog signal; and first offset correcting means, provided in the analog signal processing section, for correcting the analog signal on the basis of the direct current offset signal converted by the DA converting section into the analog signal.

As mentioned above, according to the present invention, it is possible to more quickly and accurately correct DC offsets by detecting the DC offsets using, as initial values, DC offsets detected by the past received slots.

In addition, according to the present invention, it is possible to decrease the receive error rate due to DC offsets produced when received signals are processed in an analog signal processing circuit. In addition, using a receiver of the present invention, it is possible to achieve a voice or date communication of a good quality without deteriorating the receive error rate due to DC offsets produced when received signals are processed in an analog signal processing circuit.

Moreover, a receiver having a DC offset removing function according to the present invention is provided with means for storing DC offsets, which vary in accordance with the gains set in an analog signal processing section, with respect to the respective gains. Therefore, it is possible to more quickly and accurately correct DC offsets using the stored DC offset values. In addition, if the receiver has a function of switching the gains of a radio section and uses a system for reading the stored DC offset values, it is possible to perform the gain control of the receiver at a high speed without damaging the dynamic range even if the incoming received signal is unclear and even if the amplitude of the received level is rapidly changed.

In addition, it is possible to decrease DC offsets, which are produced in an analog signal processing circuit, at the input of an A/D converter, and to decrease the receive error rate. It is also possible to prevent a signal from being distorted by a DC offset in excess of the input range of the A/D converter, and to prevent the receive error rate due to this distortion.

Moreover, since no AC couple is used, there is no influence of the transient response of the temporal variation of the DC offset, so that the receive error rate is not deteriorated. In particular, since it is possible to remove only DC offset components serving as errors to a signal of a modulation system containing low-frequency components containing DC, it is possible to decrease the deterioration of the error rate of the received signal.

Moreover, since a D/A converter required when the frequency characteristics of a zone control section in an analog signal processing circuit is detected by a test signal can be also used as a D/A converter for converting a DC offset into an analog signal, it is possible to decrease the chip area.

What is claimed is:

1. A receiver having a function of removing a direct current offset, comprising:

a receiving section for receiving a radio frequency signal;

an analog signal processing section for amplifying, band-converting and frequency-converting an analog signal inputted from the receiving section;

an AD converting section for converting an output of the analog signal processing section from an analog signal to a digital signal;

a digital signal processing section for processing the digital signal converted by the AD converting section;

offset detecting means, provided in the digital signal processing section, for detecting a direct current offset signal produced in the receiving section or a frequency converting section;

offset holding means, provided in the digital signal processing section, for holding the direct current offset signal detecting by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal;

second offset correcting means for digitally decreasing a part of said direct current offset signal held by said offset holding means to decrease said direct current offset; and offset distributing means for correcting at least an offset part exceeding a predetermined threshold by said first offset correcting means when an absolute value of an offset detected by said offset detecting means exceeds the predetermined threshold.

2. A receiver having a function of removing a direct current offset as set forth in claim 1, wherein said direct current offset held by said offset holding means is updated every time said offset detecting means detects an offset.

3. A receiver having a function of removing a direct current offset as set forth in claim 1, wherein said predetermined threshold is a power of 2.

4. A receiver having a function of removing a direct current, comprising:

a receiving section for receiving a radio frequency signal;

an analog signal processing section for amplifying, band converting and frequency-converting an analog signal inputted from the receiving section;

an AD converting section for converting an output of the analog signal processing section from an analog signal to a digital signal;

a digital signal processing section for processing the digital signal converted by the AD converting section;

offset detecting means, provided in the digital signal processing section, for detecting a direct current offset signal produced in the receiving section or a frequency converting section;

offset holding means, provided in the digital signal processing section, for holding the direct current offset signal detected by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal; and second offset correcting means for digitally decreasing a part of said direct current offset signal held by said offset holding means to decrease said direct current offset, wherein more significant bits of the offset held by said offset holding means are converted into analog value by means of said DA converting section to correct the offset by said first offset correcting means, and less significant bits of the offset held by said offset holding means are used to correct the offset by said second offset correcting means.

5. A receiver having a function of removing a direct current offset, comprising:

a receiving section for receiving a radio frequency signal;

an analog signal processing section for amplifying, band-converting and frequency-converting an analog signal inputted from the receiving section;

an AD converting section for converting an output of the analog signal processing section from an analog signal to a digital signal;

a digital signal processing section for processing the digital signal converted by the AD converting section;

offset detecting means, provided in the digital signal processing section, for detecting a direct current offset signal produced in the receiving section or a frequency converting section;

offset holding means, provided in the digital signal processing section, for holding the direct current offset signal detected by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal; and second offset correcting means for digitally decreasing a part of said direct current offset signal held by said offset holding means to decrease said direct current offset, wherein said offset holding means comprises first storing means for holding at least an initial value of the offset detected by said offset detecting means, and second storing means for holding a fluctuated part of an offset varying with time, said fluctuated part being detected by said offset detecting means after the offset is corrected on the basis of the initial value of the offset by said first and second offset correcting means.

6. A receiver having a function of removing a direct current offset as set forth in claim 5, wherein said initial value of the offset stored in said first storing means is detected by said offset detecting means only once, and thereafter, the detected initial value is unchanged.

7. A receiver having a function of removing a direct current offset as set forth in claim 5, wherein said initial value of the offset stored in said first storing means is detected to be set when a power supply is turned on.

8. A receiver having a function of removing a direct current offset as set forth in claim 5, wherein said initial value of the offset stored in said first storing means is detected every time a predetermined period of time elapses.

9. A receiver having a function of removing a direct current offset as set forth in claim 5, wherein said initial value of the offset stored in said first storing means is updated when said fluctuated part of the offset varying with time exceeds a predetermined value.

10. A receiver having a function of removing a direct current offset as set forth in claim 5, wherein said fluctuated part of the offset stored in said second storing means is corrected by said second offset correcting means provided in said digital signal processing section.

11. A receiver having a function of removing a direct current offset as set forth in claim 5, wherein said initial value of the offset stored in said first storing means is corrected by said first offset correcting means provided in said analog processing section, and said fluctuated part of the offset stored in said second storing means is corrected by said second offset correcting means provided in said digital signal processing section.

12. A receiver having a function of removing a direct current offset, comprising:

a receiving section for receiving a radio frequency signal;

an analog signal processing section for amplifying, band-converting and frequency-converting an analog signal inputted from the receiving section;

an AD converting section for converting an output of the analog signal processing section from an analog signal to digital signal;

a digital signal processing section for processing the digital signal converted by the AD converting section;

offset detecting means, provided in the digital signal processing section, for detecting a direct current offset signal produced in the receiving section or a frequency converting section;

offset holding means, provided in the digital signal processing section, for holding the direct current offset signal detected by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal;

means for measuring a received field intensity inputted via said signal input section;

means for setting a plurality of gains in said analog signal processing section on the basis of said received field intensity;

said offset detecting means detecting a plurality of direct current offset values produced in accordance with said plurality of gains set in said analog signal processing section;

said offset holding means holding said plurality of direct current offset values; and said first offset correcting means reading a direct current offset value, which corresponds to a gain set in said analog signal processing section, out of said offset holding means to correct the direct current offset.

13. A receiver having a function of removing a direct current offset as set forth in claim 12, wherein said analog signal processing section comprises:

a pair of mixers for frequency-converting signals perpendicular to each other containing at least an in-phase component and an orthogonal component of said radio frequency signal inputted to said signal input section; and base band filters provided in an in-phase component channel and an orthogonal channel which are outputs of the pair of mixers, said first offset correcting means being provided at least upstream of said base band filters for correcting said direct current offset produced in said analog signal processing section.

14. A receiver having a function of removing a direct current offset as set forth in claim 13, wherein said analog signal processing section is set to be a first gain value, and said AD converting section converts an output of the analog signal processing section into a digital value, said receiver further comprising: a overflow detecting circuit for detecting an overflow state of the AD converting section; and control means for controlling the gain of said analog signal processing section so that the gain is set to be a second gain value smaller than said first gain value when the overflow state is detected by said overflow detecting circuit.

15. A receiver having a function of removing a direct current offset as set forth in claim 14, wherein said analog signal processing section includes storing means for detecting and storing a direct current offset produced by the inputted radio frequency signal, and said first offset correcting means corrects the direct current offset on the basis of said first gain value read out of said storing means even if only one receive is carried out.

16. A receiver having a function of removing a direct current offset, comprising:

a receiving section for receiving a radio frequency signal;

an analog signal processing section for amplifying, band-converting and frequency-converting an analog signal inputted from the receiving section;

an AD converting section for converting an output of the analog signal processing section from an analog signal to a digital signal;

a digital signal processing section for processing digital signal converted by the AD converting section;

offset detecting means, provided in the digital signal processing section, for detecting a direct current offset signal produced in the receiving section of a frequency converting section;

offset holding means, provided in the digital signal processing section, for holding the direct current offset signal detected by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal; and analog signal prevention means for preventing said analog signal from being input to said analog signal processing section, wherein said offset detecting means said direct current offset when said analog signal prevented from being inputted, and said first offset correcting means corrects the direct current offset on the basis of the detected direct current offset value.

17. A receiver having a function of removing a direct current offset as set forth in claim 16, wherein said analog signal prevention means comprises a switch provided between a radio frequency signal amplifier provided in said analog signal processing section and said signal input section.

18. A receiver having a function of removing a direct current offset as set forth in claim 17, wherein said analog signal prevention means comprise: attenuator connected in parallel to said radio frequency signal amplifier provided in said analog signal processing section; four switches provided upstream and downstream of each of said amplifier and said attenuator; and a fifth switch provided in a connecting line upstream of said amplifier and said attenuator, and wherein a signal supply path extending from said signal input section and said analog signal processing section is capable of causing said analog signal processing section to be in a no-input state even if said signal supply path is always connected.

19. A receiver having a function of removing a direct current offset as set forth in claim 17, wherein said offset detecting means detects said direct current offset on the basis of the received slot in a time division multiple connection system, and said first offset correcting means corrects said direct current offset on the basis of the detected value of said direct current offset detected by said received slot.

20. A receiver having a function of removing a direct current offset as set forth in claim 19, wherein said offset detecting means detects a direct current offset of the current received slot using, as an initial value, a time mean value of direct current offsets detected by the past received slots, and said first offset correcting means corrects the detected direct current offset of the current received slot.

21. A receiver having a function of removing a direct current offset as set forth in claim 20,
wherein said offset detecting means comprises: a cumulating/adding circuit for cumulating/adding digital signals inputted from said AD converting section; and a divider circuit for dividing the cumulated/added signals, and
wherein said offset holding means comprises: a plurality of delay circuits for delaying outputs of said offset detecting means by a predetermined period of time; a plurality of weighting circuits for multiplying the values, which are delayed by means of said delay circuits, by weighting coefficients, which are preset so as to increase as approaching said direct current offset, to output the multiplied values; and an adder circuit for integrating outputs of the weighting circuit to outputs the integrated value as a direct current offset value.

22. A receiver having a function of removing a direct current offset as set forth in claim 21, wherein each of said weighting coefficients of said plurality of weighting circuits is set so that the older weighting coefficient is light and the newer weighting coefficient is heavy.

23. A receiver having a function of removing a direct current offset as set forth in claim 21, wherein each of said weighting coefficients set in said plurality of weighting circuits varies in accordance with the fluctuating amount of the direct current offset which is detected by said offset detecting means and which fluctuates with time.

24. A receiver having a function of removing a direct current offset, comprising:
a receiving section for receiving a radio frequency signal;
an analog signal processing section for amplifying, band-converting and frequency-converting an analog signal inputted from the receiving section;
an AD converting section for converting an output of the analog signal processing section from an analog signal to a digital signal;
a digital signal processing section for processing the digital signal converted by the AD converting section;
offset detecting means, provided in the digital signal processing section, for detecting a direct current offset signal produced in the receiving section or frequency converting section;
offset holding means, provided in the digital signal processing section, for holding the direct current offset signal detected by the offset detecting means;
a DA converting section for converting the direct current offset signal detected by the digital signal processing section into an analog signal; and
first offset correcting means, provided in the analog signal processing section, for correcting the analog signal on the basis of the direct current offset signal converted by the DA converting section into the analog signal,
wherein a test mode in which a band limitation characteristic of said analog signal processing section is tested,
wherein said digital signal processing section comprises: a generator for generating a test signal for testing said band limitation characteristic of said analog signal processing section; and an adder for said test signal, which is outputted from said test signal generator in said test mode, to said direct current offset signal, and
wherein said first correcting means supplies an output of said adder after being converted into an analog signal by means of said DA converting section, to an input of a band limitation circuit of said analog signal processing section.

25. A receiver having a function of removing a direct current offset as set forth in claim 24, wherein said analog signal processing section tests said band limitation characteristic in the analog signal processing section after said direct current offset is detected by said offset detecting means and said direct current offset is held by said offset holding means.

26. A receiver having a function of removing a direct current offset as set forth in claim 24, wherein said analog signal processing section has a band limitation circuit having a function of adjusting said band limitation characteristic of the analog signal, and said digital signal processing section has a frequency characteristic control means for producing said frequency characteristic control signal in accordance with a difference between a frequency characteristic detected by said test signal supplied to said band limitation circuit in said test mode and a desired frequency characteristic.

27. A communicating system comprising:
a transmitter for transmitting a radio frequency signal of an information signal containing voice and image;
a communication network for transmitting and receiving said radio frequency signal; and
a receiver having a function of a direct current offset, said receiver comprising:
a receiving section for receiving said radio frequency signal;
an analog signal processing section for amplifying, band-converting and frequency-converting an analog signal inputted from the receiving section;
an AD converting section for converting an output of the analog signal processing section from an analog signal to a digital signal;

a digital signal processing section for processing the digital signal converted by the AD converting section;

offset detecting means, provided in the digital signal processing section, for detecting a direct current offset signal produced in the receiving section or a frequency converting section;

offset holding means, provided in the digital signal processing section, for holding the direct current offset signal detected by the offset detecting means;

a DA converting section for converting the direct current offset signal detected by the digital signal processing section into an analog signal;

first offset correcting means, provided in the analog signal processing section, for correcting the analog signal on the basis of the direct current offset signal converted by the DA converting section into the analog signal;

second offset correcting means for digitally decreasing a part of said direct current offset signal held by said offset holding means to decrease said direct current offset; and offset distributing means for correcting at least an offset part exceeding a predetermined threshold by said first offset correcting means when an absolute value of an offset detected by said offset means exceeds the predetermined threshold.

28. A receiver having a function of removing a direct current offset, comprising:

a receiving section configured to receive a radio frequency signal;

an analog signal processing section configured to amplify, band-convert and frequency-convert an analog signal input from the receiving section;

an AD converting section configured to convert an output of the analog signal processing section from an analog signal to a digital signal;

a digital signal processing section configured to process the digital signal converted by the AD converting section;

an offset detecting mechanism, provided in the digital signal processing section, configured to detect a direct current offset signal produced in the receiving section or a frequency converting section;

an offset holding mechanism, provided in the digital signal processing section, configured to hold the direct current offset signal detected by the offset detecting mechanism;

a DA converting section configured to convert the direct current offset signal detected by the digital signal processing section into an analog signal;

a first offset correcting mechanism, provided in the analog signal processing section configured to correct the analog signal on the basis of the direct current offset signal converted by the DA converting signal into the analog signal;

a second offset correcting mechanism configure to digitally decrease a part of said direct current offset signal held by said offset holding mechanism to decrease said direct current offset; and an offset distributing mechanism configured to correct at least an offset part exceeding a predetermined threshold by said first offset correcting mechanism when an absolute value of an offset detected by said offset detecting mechanism exceeds the predetermined threshold.

29. A receiver having a function of removing a direct current offset as set forth in claim 28, wherein said direct current offset held by said offset holding mechanism is updated every time said offset detecting mechanism detects an offset.

30. A receiver having a function of removing a direct current offset as set forth in claim 28, wherein said predetermined threshold is a power of 2.

31. A receiver having a function of removing a direct current offset, comprising:

a receiving section configured to receive a radio frequency signal;

an analog signal processing section configured to amplify, band-convert and frequency-convert an analog signal input from the receiving section;

an AD converting section configured to convert an output of the analog signal processing section from an analog signal to a digital signal;

a digital signal processing section configured to process digital signal converted by the AD converting section;

an offset detecting mechanism, provided in the digital signal processing section, configured to detect a direct current offset signal produced in the receiving section of a frequency converting section;

an offset holding mechanism, provided in the digital signal processing section, configured to hold the direct current offset signal detected by the offset detecting means;

a DA converting section configured to convert the direct current offset signal detected by the digital signal processing section into an analog signal;

a first offset correcting mechanism, provided in the analog signal processing section, configured to correct the analog signal on the basis of the direct current offset signal converted by the DA converting section into the analog signal; and a second offset correcting mechanism configure to digitally decrease a part of said direct current offset signal held by said offset holding mechanism to decrease said direct current offset, wherein more significant bits of the offset held by said offset holding mechanism are converted into analog values by said DA converting section to correct the offset by said first offset correcting mechanism, and less significant bits of the offset held by said offset holding mechanism are used to correct the offset by said second offset correcting mechanism.

32. A receiver having a function of removing a direct current offset, comprising:

a receiving section configured to receive a radio frequency signal;

an analog signal processing section configured to amplify, band-convert and frequency-convert an analog signal input from the receiving section;

an AD converting section configured to convert an output of the analog signal processing section from an analog signal to a digital signal;

a digital signal processing section configured to process the digital signal converted by the AD converting section;

an offset detecting mechanism, provided in the digital signal processing section, configured to detect a direct current offset signal produced in the receiving section or a frequency converting section;

an offset holding mechanism, provided in the digital signal processing section, configured to hold the direct current offset signal detected by the offset detecting mechanism;

a DA converting section configured to convert the direct current offset signal detected by the digital signal processing section into an analog signal;

a first offset correcting mechanism, provided in the analog signal processing section, configured to correct the analog signal on the basis of the direct current offset signal converted by the DA converting section into the analog signal; and a second offset correcting mechanism configure to digitally decrease a part of said direct current offset signal held by said offset holding mechanism to decrease said direct current offset, wherein said offset holding mechanism comprises a first storing mechanism configured to hold at least an initial value of the offset detected by said offset detecting mechanism, and a second storing mechanism configured to hold a fluctuated part of an offset varying with time, said fluctuated part being detected by said offset detecting mechanism after the offset is corrected on the basis of the initial value of the offset by said first and second offset correcting mechanism.

33. A receiver having a function of removing a direct current offset as set forth in claim 29, wherein said initial value of the offset stored in said first storing mechanism is detected by said offset detecting mechanism only once, and thereafter, the detected initial value is unchanged.

34. A receiver having a function of removing a direct current offset as set forth in claim 32, wherein said initial value of the offset stored in said first storing mechanism is detected to be set when a power supply is turned on.

35. A receiver having a function of removing a direct current offset as set forth in claim 32, wherein said initial value of the offset in said first storing mechanism is detected every time a predetermined period of time elapses.

36. A receiver having a function of removing a direct current offset as set forth in claim 32, wherein said initial value of the offset stored in said first storing mechanism is updated when said fluctuated part of the offset varying with time exceeds a predetermined value.

37. A receiver having a function of removing a direct current offset as set forth in claim 32, wherein said fluctuated part of the offset stored in said second storing mechanism is corrected by said second offset correcting mechanism provided in said digital signal processing section.

38. A receiver having a function of removing a direct current offset as set forth in claim 32, wherein said initial value of the offset stored in said first storing mechanism is corrected by said first offset correcting mechanism provided in said analog processing section, and said fluctuation part of the offset stored in said second storing mechanism is corrected by said second offset correcting mechanism provided in said digital signal processing section.

39. A receiver having a function of removing a direct current offset, comprising:

a receiving section configured to receive a radio frequency signal;

an analog signal processing section configured to amplify, band-convert and frequency-convert an analog signal input from the receiving section;

an AD converting section configured to convert an output of the analog signal processing section from an analog signal to a digital signal;

a digital signal processing section configured to process the digital signal converted by the AD converting section;

an offset detecting mechanism, provided in the digital signal processing section, configured to detect a direct current offset signal produced in the receiving section or a frequency converting section;

an offset holding mechanism, provided in the digital signal processing section, configured to hold the direct current offset signal detected by the offset detecting mechanism;

a DA converting section configured to convert the direct current offset signal detected by the digital signal processing section into an analog signal;

a first offset correcting mechanism, provided in the analog signal processing section, configured to correct the analog signal on the basis of the direct current offset signal converted by the DA converting section into the analog signal;

a first mechanism configured to measure a received field intensity inputted via said signal input section; and a second mechanism configured to set a plurality of gains in said analog signal processing section on the basis of said received field intensity, wherein said offset detecting mechanism detects a plurality of direct current offset values produced in accordance with said plurality of gains set in said analog signal processing section, said offset holding mechanism holds said plurality of direct current offset values, and said first offset correcting mechanism reads a direct current offset value, which corresponds to a gain set in said analog signal processing section, out of said offset holding mechanism to correct the direct current offset.

40. A receiver having a function of removing a direct current offset as set forth in claim 39, wherein said analog signal processing section comprises:

a pair of mixers configured to frequency-convert signal perpendicular to each other containing at least an in-phase component and an orthogonal component of said radio frequency signal inputted to said signal input section; and base band filters provided in an in-phase component channel and an orthogonal component channel which are outputs of the pair or mixers, said first offset correcting mechanism being provided at least upstream of said base band filters and configured to correct said direct current offset produced in said analog signal processing section.

41. A receiver having a function of removing a direct current offset as set forth in a claim 40, wherein said analog signal processing section is set to be a first gain value, and said AD converting section converts an output of the analog signal processing section into a digital value, said receiver further comprising:
an overflow detecting circuit configured to detect an overflow state of the AD converting section; and
a control mechanism configured to control the gain of said analog said processing section so that the gain is set to be a second gain value smaller than said first gain value when the overflow state is detected by said overflow detecting circuit.

42. A receiver having a function of removing a direct current offset as set forth in claim 41, wherein said analog signal processing section includes a storing mechanism configured to detect and store a direct current offset produced by the inputted radio frequency signal, an said first offset correcting mechanism corrects the direct current offset on the basis of said first gain value read out of said storing mechanism if only one receive is carried out.

43. A receiver having a function of removing a direct current offset, comprising:
- a receiving section configured to receive a radio frequency signal;
- an analog signal processing section configured to amplify, band-convert and frequency-convert an analog signal input from the receiving section;
- an AD converting section configured to convert an output of the analog signal processing section from an analog signal to a digital signal;
- a digital signal processing section configured to process the digital signal converted by the AD converting section;
- an offset detecting mechanism, provided in the digital signal processing section, configured to detect a direct current offset signal produced in the receiving section or a frequency converting section;
- an offset holding mechanism, provided in the digital signal processing section, configured to hold the direct current offset signal detected by the offset detecting mechanism;
- a DA converting section configured to convert the direct current offset signal detected by the digital signal processing section into an analog signal;
- a first offset correcting mechanism, provided in the analog signal processing section, configured to correct the analog signal on the basis of the direct current offset signal converted by the DA converting section into the analog signal; and
- an analog signal prevention mechanism configured to prevent said analog signal from being input to said analog signal processing section,
- wherein said offset detecting mechanism detects said direct current offset when said analog signal is prevented from being input, and
- said first offset correcting mechanism corrects the direct current offset on the basis of the detected direct current offset value.

44. A receiver having a function of removing a direct current offset as set forth in claim 43, wherein said analog signal prevention mechanism comprises a switch provided between a radio frequency signal amplifier provided in said analog signal processing section and said signal input section.

45. A receiver having a function of removing a direct current offset as set forth in claim 44, wherein said analog signal prevention mechanism comprises:
- an attenuator connected in parallel to said radio frequency signal amplifier provided in said analog signal processing section;
- four switches provided upstream and downstream of each of said amplifier and said attenuator; and
- a fifth switch provided in a connecting line upstream of said amplifier and said attenuator,
- wherein a signal supply path extending from said signal input section and said analog signal processing section is configured to cause said analog signal processing section to be in a no-input state even if said signal supply path is always connected.

46. A receiver having a function of removing a direct current offset, comprising:
- a receiving section configured to receive a radio frequency signal;
- an analog signal processing section configured to amplify, band-converted and frequency-convert an analog signal input from the receiving section;
- an AD converting section configured to convert an output of the analog signal processing section from an analog signal to a digital signal;
- a digital signal processing section configured to process the digital signal converted by the AD converting section;
- an offset detecting mechanism, provided in the digital signal processing section, configured to detect a direct current offset signal produced in the receiving section or a frequency converting section;
- an offset holding mechanism, provided in the digital signal processing section, configured to hold the direct current offset signal detected by the offset detecting mechanism;
- a DA converting section configured to convert the direct current offset signal detected by the digital signal processing section into an analog signal; and
- a first offset correcting mechanism, provided in the analog signal processing section, configured to correct the analog signal on the basis of the direct current offset signal converted by the DA converting section into the analog signal,
- wherein said offset detecting mechanism detects said direct current offset by a time mean of outputs of said AD converting section, and said first offset correcting mechanism corrects the direct current offset by subtracting the direct current offset, which is converted into an analog signal by said DA converting section, from the analog signal processed by said analog signal processing section.

47. A receiver having a function of removing a direct current offset as set forth in claim 46, wherein said offset detecting mechanism detects said direct current offset on the basis of the received slot in a time division multiple connection system, and said first offset correcting mechanism corrects said direct current offset on the basis of the detected value of said direct current offset detected by said received slot.

48. A receiver having a function of removing a direct current offset as set forth in claim 47, wherein said offset detecting mechanism detects a direct current offset of the current received slot using, as an initial value, a time mean value of direct current offsets detected by the past received slots, and said first offset correcting mechanism corrects the detected direct current offset of the current received slot.

49. A receiver having a function of removing a direct current offset as set forth in claim 48,
- wherein said offset detecting mechanism comprises:
  - a cumulating/adding circuit configured to cumulate/add digital signals inputted from said AD converting section; and
  - a divider circuit configured to divide the cumulated/added signals, and
- wherein said offset holding mechanism comprises:
  - a plurality of delay circuits configured to delay outputs of said offset detecting mechanism by a predetermined period of time;
  - a plurality of weighting circuits configured to multiply the values, which are delayed by said delay circuits, by weighting coefficients, which are preset so as to increase as approaching said direct current offset, to output the multiplied values; and an adder circuit configured to integrate outputs of the weighting circuit to output the integrated value as a direct current offset value.

50. A receiver having a function of removing a direct current offset as set forth in claim 49, wherein each of said weighting coefficients of said plurality of weighting circuits is set so that the older weighting coefficient is light and the newer weighting coefficient is heavy.

51. A receiver having a function of removing a direct current offset as set forth in claim 49, wherein each of said weighting coefficients set in said plurality of weighting circuits varies in accordance with the fluctuating amount of the direct current offset which is detected by said offset detecting the mechanism and which fluctuates with time.

52. A receiver having a function of removing a direct current offset, comprising:

a receiving section configured to receive a radio frequency signal;

an analog signal processing section configured to amplify, band-convert and frequency-convert an analog signal input from the receiving section;

an AD converting section configured to convert an output of the analog signal processing section from an analog signal to a digital signal;

a digital signal processing section configured to process the digital signal converted by the AD converting section;

an offset detecting mechanism, provided in the digital signal processing section, configured to detect a direct current offset signal produced in the receiving section or a frequency converting section;

an offset holding mechanism, provided in the digital signal processing section, configured to hold the direct current offset signal detected by the offset detecting mechanism;

a DA converting section configured to convert the direct current offset signal detected by the digital signal processing section into an analog signal; and a first offset correcting mechanism, provided in the analog signal processing section, configured to correct the analog signal on the basis of the direct current offset signal converted by the DA converting section into the analog signal, wherein a test mode in which a band limitation characteristic of said analog signal processing section is tested, and wherein said digital signal processing section comprises:
a generator configured to generate a test signal for testing said band limitation characteristic of said analog signal processing section; and
an adder configured to add said test signal, which is outputted from said test signal generator in said test mode, to said direct current offset signal, and wherein said first correcting mechanism supplies an output of said adder after being converted into an analog signal by said DA converting section, to an input of a band limitation circuit of said analog signal processing section.

53. A receiver having a function of removing a direct current offset as set forth in claim 52, wherein said analog signal processing section tests said band limitation characteristic in the analog signal processing section after said direct current offset is detected by said offset detecting the mechanism and said direct current offset is held by said offset holding mechanism.

54. A receiver having a function of removing a direct current offset as set forth in claim 52, wherein said analog signal processing section has a band limitation circuit having a function of adjusting said band limitation characteristic of the analog signal, and said digital signal processing section has a frequency characteristic control mechanism configured to produce said frequency characteristic control signal in accordance with a difference between a frequency characteristic detected by said test signal supplied to said band limitation circuit in said test mode and a desired frequency characteristic.

55. A communication system comprising:

a transmitter configured to transmit a radio frequency signal of an information signal containing voice and image;

a communication network configured to a transmit and receive said radio frequency signal; and a receiver having a function of a direct current offset, said receiver comprising:
a receiving section configured to receive said radio frequency signal;
an analog signal processing section configured to amplify, band-convert and frequency-convert an analog signal inputted from the receiving section; an AD converting section configured to convert an output of the analog signal processing section from an analog signal to a digital signal;
a digital signal processing section configured to process the digital signal converted by the AD converting section;
an offset detecting mechanism, provided in the digital signal processing section, configured to detect a direct current offset signal produced in the receiving section or a frequency converting section;
an offset holding mechanism, provided in the digital signal processing section, configured to hold the direct current offset signal detected by the offset detecting mechanism;
a DA converting section configured to convert the direct current offset signal detected by the digital signal processing section into an analog signal; and
a first offset correcting mechanism, provided in the analog signal processing section, configured to correct the analog signal on the basis of the direct current offset signal converted by the DA converting section into the analog signal; and
a second offset correcting mechanism configure to digitally decrease a part of said direct current offset signal held by said offset holding mechanism to decrease said direct current offset; and
an offset distributing mechanism configured to correct at least an offset part exceeding a predetermined threshold by said first offset correcting mechanism when an absolute value of an offset detected by said offset detecting mechanism exceeds the predetermined threshold.

\* \* \* \* \*

UNITED STATES PATENT AND TRADEMARK OFFICE
CERTIFICATE OF CORRECTION

PATENT NO. : 6,498,929 B1
DATED : December 24, 2002
INVENTOR(S) : Tsurumi et al.

It is certified that error appears in the above-identified patent and that said Letters Patent is hereby corrected as shown below:

<u>Title page,</u>
Item [45], and the Notice information should read as follows:

-- [45] **Date of Patent: \*Dec. 24, 2002**

[\*] Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Twenty-seventh Day of May, 2003

JAMES E. ROGAN
*Director of the United States Patent and Trademark Office*